(12) United States Patent
Kadota et al.

(10) Patent No.: US 6,671,946 B1
(45) Date of Patent: Jan. 6, 2004

(54) COMPONENT MOUNTING MACHINE

(75) Inventors: Shozo Kadota, Osaka (JP); Motohiro Higuchi, Nara (JP); Manabu Morioka, Nara (JP); Masami Fujiyama, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/462,306

(22) PCT Filed: May 7, 1999

(86) PCT No.: PCT/JP99/02391

§ 371 (c)(1),
(2), (4) Date: Apr. 3, 2000

(87) PCT Pub. No.: WO99/59390

PCT Pub. Date: Nov. 18, 1999

(30) Foreign Application Priority Data

| May 11, 1998 | (JP) | 10-127150 |
| Jun. 12, 1998 | (JP) | 10-164893 |
| Jul. 10, 1998 | (JP) | 10-195392 |
| Oct. 5, 1998 | (JP) | 10-282447 |
| Oct. 5, 1998 | (JP) | 10-282448 |
| Oct. 5, 1998 | (JP) | 10-282449 |

(51) Int. Cl.[7] .............................. B23P 19/00
(52) U.S. Cl. ..................... 29/741; 29/742; 29/743; 29/783; 29/786; 198/341
(58) Field of Search ............... 29/740, 741, 742, 29/743, 783, 784, 786; 198/341

(56) References Cited

U.S. PATENT DOCUMENTS

| 3,516,141 A | * | 6/1970 | Rech |
| 3,608,175 A | * | 9/1971 | Lambrecht |
| 3,720,475 A | * | 3/1973 | Leacock |
| 4,218,817 A | * | 8/1980 | Takano ................. 29/741 |
| 4,293,999 A | * | 10/1981 | Woodman, Jr. ........ 29/741 X |
| 4,329,776 A | * | 5/1982 | Mori et al. ............. 29/741 |
| 4,356,949 A | * | 11/1982 | Snyder et al. |
| 4,403,723 A | * | 9/1983 | Dean et al. |
| 4,464,833 A | * | 8/1984 | Duncan |
| 4,569,550 A | * | 2/1986 | Harigane et al. ....... 29/741 X |
| 4,670,979 A | * | 6/1987 | Yoshino et al. ........ 29/741 X |
| 4,944,086 A | * | 7/1990 | Nishihara et al. ...... 29/741 X |
| 5,145,047 A | * | 9/1992 | Terracol et al. ........ 198/341 |
| 5,177,864 A | * | 1/1993 | Oyama .................. 29/741 X |
| 5,210,933 A | * | 5/1993 | Miyanishi et al. ...... 29/741 |
| 5,515,600 A | * | 5/1996 | Iwasaki et al. ......... 29/740 |
| 5,695,667 A | * | 12/1997 | Eguchi et al. .......... 29/743 X |
| 5,809,639 A | * | 9/1998 | Alvite .................... 29/740 |
| 5,832,597 A | * | 11/1998 | Yokoyama et al. ..... 29/741 X |
| 5,850,683 A | * | 12/1998 | Okazaki et al. ......... 29/743 X |
| 5,855,059 A | * | 1/1999 | Togami et al. ......... 29/740 |
| 6,058,597 A | * | 5/2000 | Shichi et al. .......... 29/741 X |
| 6,154,954 A | * | 12/2000 | Seto et al. ............. 29/740 |
| 6,244,140 B1 | * | 6/2001 | Habermehl |
| 6,336,266 B1 | * | 1/2002 | Kobayashi et al. ..... 29/741 |
| 6,453,780 B2 | * | 9/2002 | Habermehl |

FOREIGN PATENT DOCUMENTS

| JP | 60-202998 | | 10/1985 |
| JP | 5-261606 A | * | 10/1993 |
| JP | 10-29186 | | 2/1998 |
| JP | 10-163693 | | 6/1998 |

* cited by examiner

*Primary Examiner*—Ljiljana Ciric
(74) *Attorney, Agent, or Firm*—Wenderoth, Lind & Ponack L.L.P.

(57) ABSTRACT

The component mounting apparatus includes a component delivery unit, a chuck (13) provided on the component delivery unit, a component transfer unit (19) for receiving a component held by the chuck (13), and a head (20) for receiving the component held by the component transfer unit (19). The head (20) includes a main head body (80), a vertically moving mechanism (81) for the main head body (80), insertion nails (68) provided at a bottom portion of the main head body (80), an opening/closing mechanism (82) for the insertion nails (68), and a turning mechanism (83) for moving the insertion nails (68) in forward and backward directions. A cam plate (84) constituting the turning mechanism (83) is mounted detachably on the main head body (80).

72 Claims, 74 Drawing Sheets

COMPONENT MOUNTING MACHINE

FIELD OF THE INVENTION

The present invention relates to a component mounting apparatus for mounting components on a substrate.

BACKGROUND OF THE INVENTION

A component mounting apparatus of the prior art is constructed as described hereinafter. That is, the structure comprises a component carrying unit, a chuck provided on the component carrying unit, a component transfer unit for receiving a component held by the chuck, and a head for receiving the component held by the component transfer unit. The head comprises a main head body, a vertically-moving means for the main head body, an insertion nail provided at a lower portion of the main head body, an opening/closing means for the insertion nail, and a turning means for moving the insertion nail in forward and backward directions.

In the afore-said apparatus of the prior art, the turning means for forward and backward movement of the insertion nail is necessary in order to retract the insertion nail after it mounts a component on a substrate. Normally, the turning means retracts the insertion nail by a large margin so that the insertion nail does not hit upon the component when it moves upward after making a retractive movement to the back, even if the component being mounted is considerably large. However, in the case of an apparatus having a structure in which the insertion nail retracts backward by a large margin, the insertion nail collides with other components during a retractive movement of the insertion nail, if the other components have been mounted already on the substrate, and if there are only limited spaces among them.

The foregoing instance is dealt with by replacing the head with one that makes only a small retractive movement. However, this again requires a positioning alignment of the insertion nail especially with respect to the substrate after replacement of the head, thereby impairing workability. Therefore, the present invention aims at improving the workability.

SUMMARY OF THE INVENTION in order to achieve the foregoing object, an apparatus of the present invention has a cam plate, which comprises the afore-said turning means, mounted detachably on the main head body. In other words, a turning locus of an insertion nail toward the back, or a retracting path of the insertion nail after mounting a component, can be altered easily by mounting another cam plate of a different shape, and thereby a density of components mounted on a substrate can be increased. In addition, the invention improves workability, since it requires only a replacement of the cam plate, but no positioning alignment, etc. of the insertion nail with respect to the substrate after the replacement.

DETAILED DESCRIPTION OF THE INVENTION

An exemplary embodiment of the present invention will be described hereinafter by referring to the accompanying figures.

Figure 1:
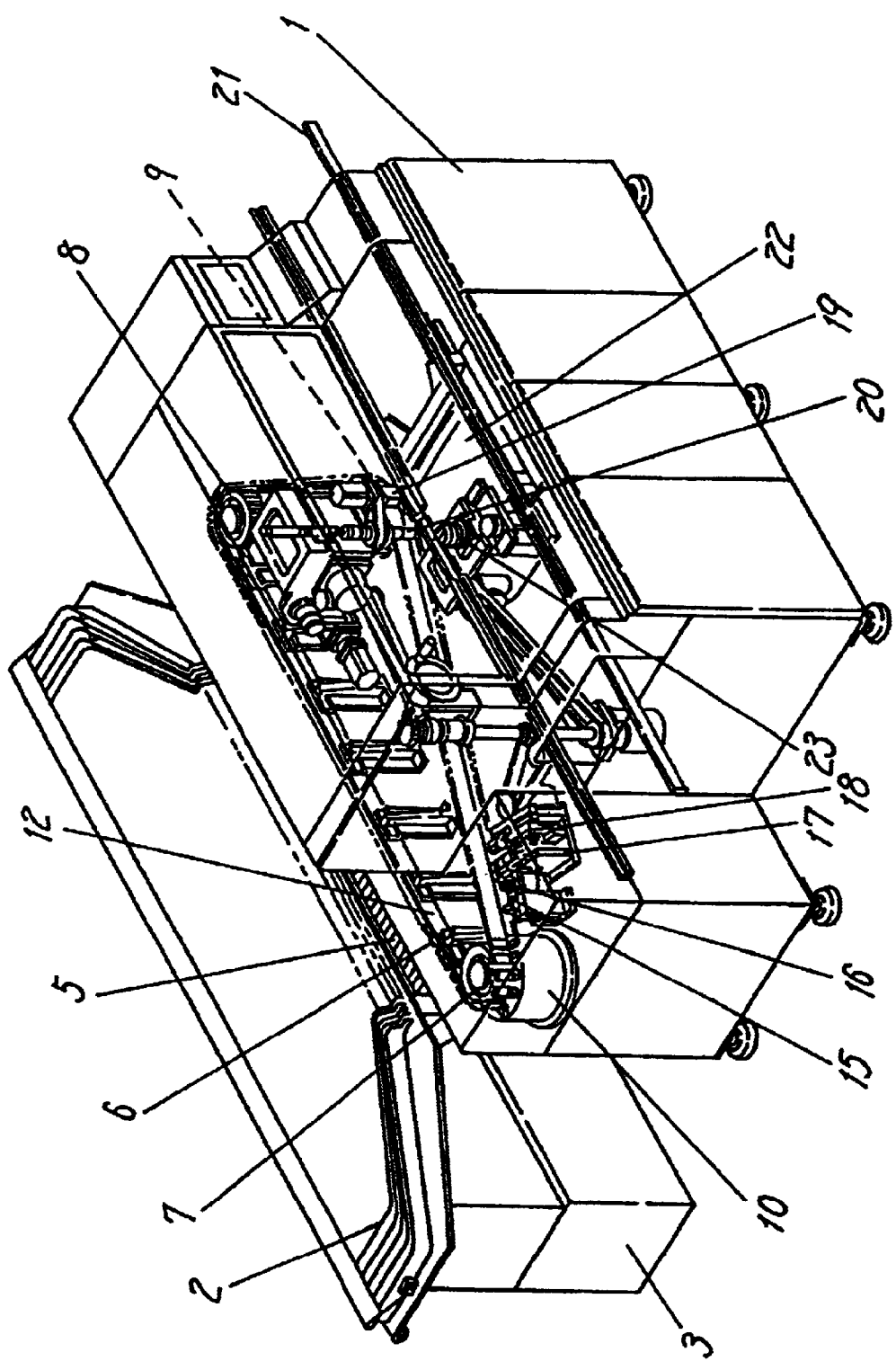
FIG. 1 is a perspective view depicting a component mounting apparatus of an exemplary embodiment of the present invention.

In FIG. 1, a reference numeral 1 represents a main body, and a backside of which has a plurality of component delivery guides 2. Each of the component delivery guides 2 is supplied with a chain of taped components 4, shown in FIG. 2, from a storage unit 3 located under the component delivery guides 2. Each of the distal ends of the component delivery guides 2 is linked with a component supply unit 5.

As an exemplified structure of a component delivery unit, an annular belt 6 made of rubber or synthetic resin is run through three pulleys 7, 8 and 9 in a triangular shape in the main body 1. The belt 6 is embedded internally with dozens of annular metal wires, so as to prevent it from stretching to the utmost. Also, the belt 6 is provided with ditches and ridges on both the front and back surfaces, so that the ditches and ridges on the back surface engage with ditches and ridges on a peripheral surface of the pulleys 7 through 9.

A motor 10, which normally runs intermittently, drives the pulley 7 so that the belt 6 also moves intermittently.

Figure 3:
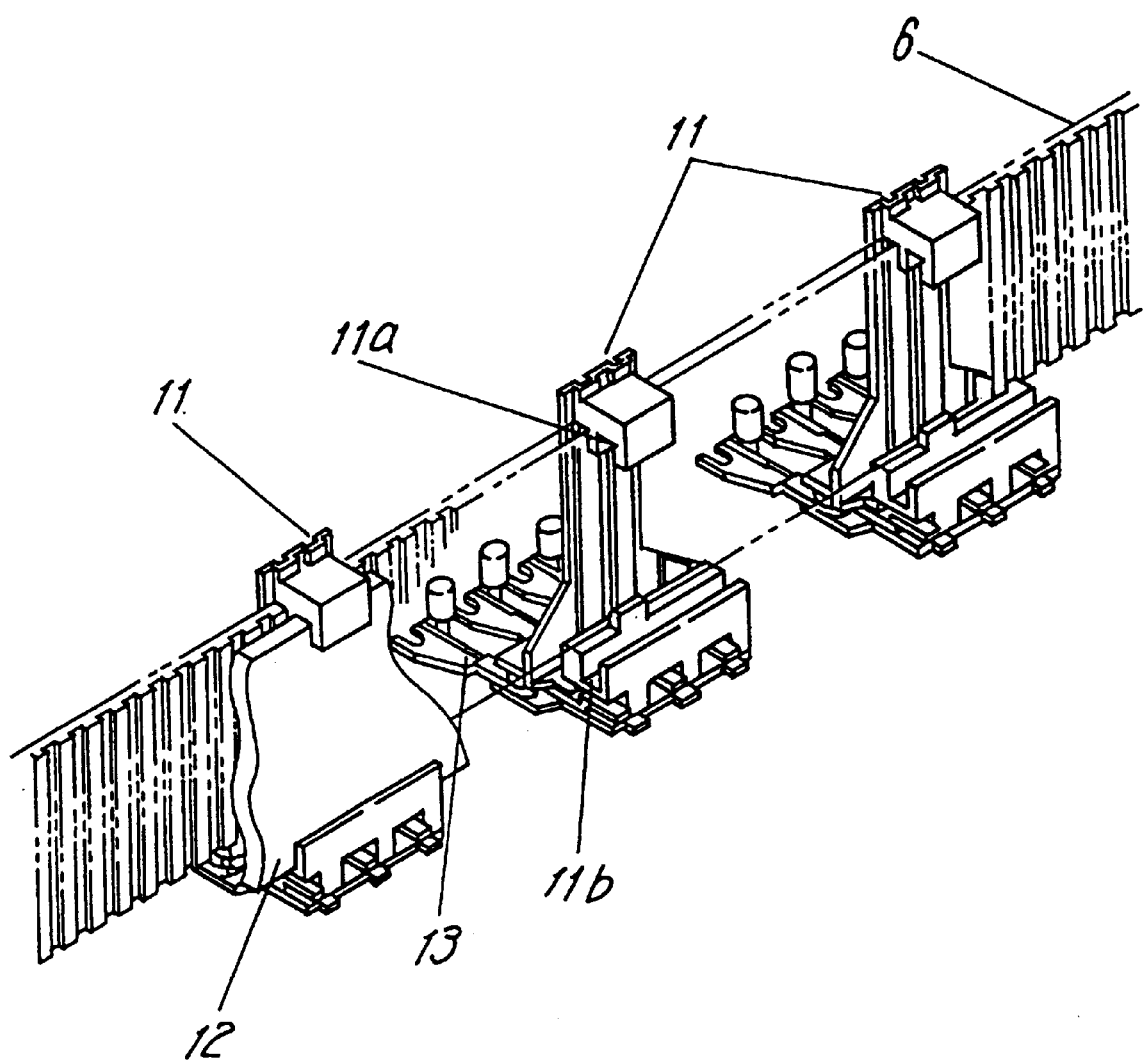
FIG. 3 is a perspective view depicting a belt portion of the same component mounting apparatus.

A plurality of chuck retainers 11 are attached to the belt 6 at regular intervals, as shown in FIG. 3. In this instance, the chuck retainers 11 are attached securely in their respective positions on the belt 6 because the ditches and ridges on the surface of the chuck retainers 11 engage the ditches and ridges on the front surface of the belt 6. In addition, an upper end and a lower end of each of the chuck retainers 11 extends toward the backside surface of the belt 6, so that portions of these extended ends also engage with an upper part and a lower part of the ditches and ridges on the backside surface of the belt 6.

Further, guide portions 11a and 11b are integrally formed with the upper and the lower extended ends of the chuck retainers 11. An upper end and a lower end of a board-shaped guide rail 12, which is positioned at the backside surface of the belt 6 between the pulleys 7 and 8, between the pulleys 8 and 9, and between the pulleys 9 and 7, engage the guide portions 11a and 11b. This structure allows the belt 6 to move along without trembling.

Figure 2:
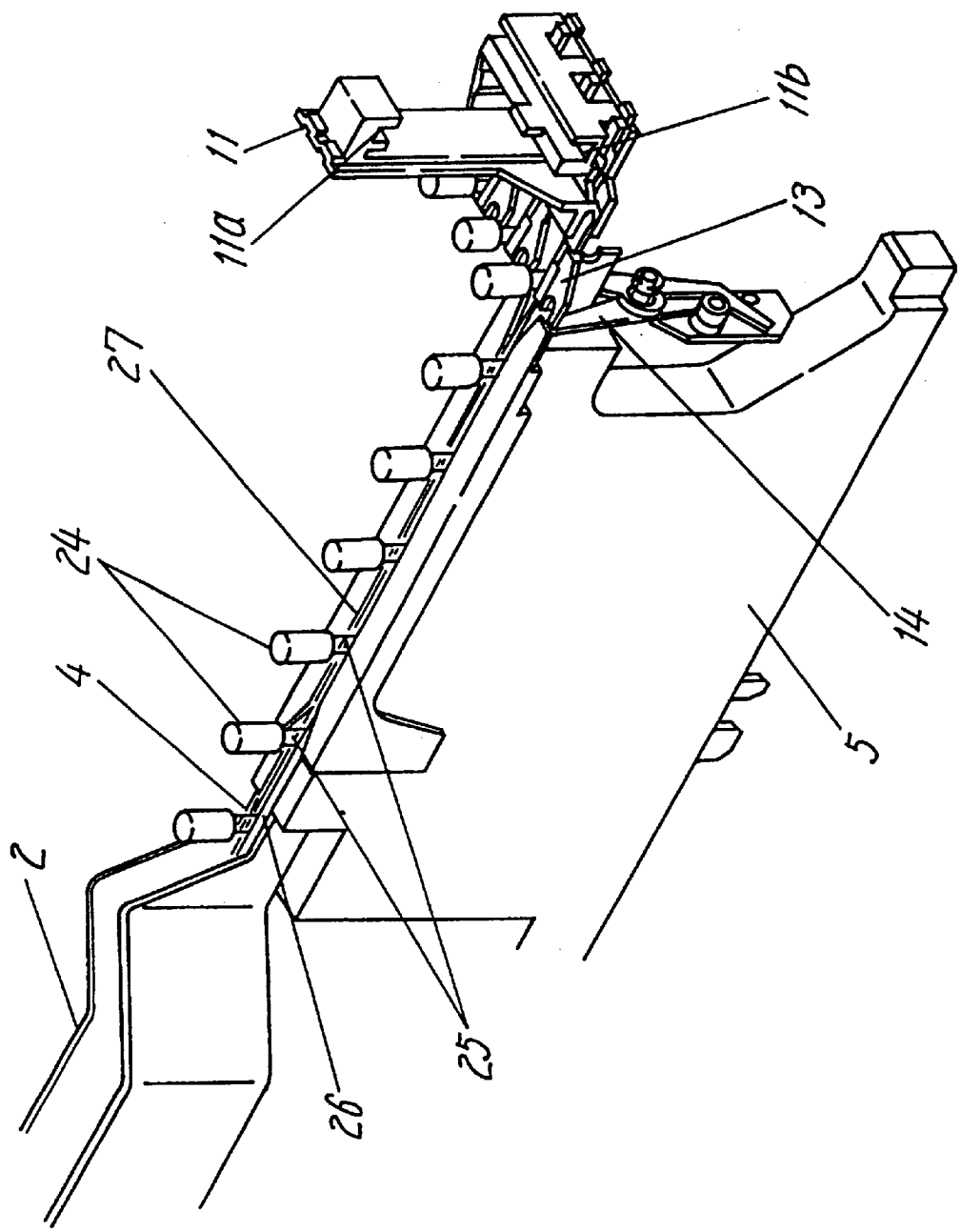
FIG. 2 is a perspective view depicting a component supply unit portion of the same component mounting apparatus.

A lower end of the individual chuck retainer 11 has three sets of chucks 13, as shown in FIG. 2 and FIG. 3. These chucks 13 catch individual component pieces cut off by a first cutting blade 14 from the chain of taped components 4, and transfer the components 4 sequentially toward a second cutting blade 15, a polarity flipper unit 16 for the components, a hold-position correction unit 17 for lead terminals, a third cutting blade 18 for cutting the lead terminals, and a component transfer unit 19, as the belt 6 moves.

Each individual component piece held by the component transfer unit 19 is handed over to a head 20. The head 20 transfers the component piece along a rail 21, and mounts it on a substrate, which is aligned in position on an X-Y table 22. The substrate will be described later. An anvil mechanism 23 then cuts off extra lengths of the lead terminals, and bends the lead terminals inwards.

The chain of taped components 4 consists of components, each of which comprises an element 24 and at least two lead terminals 25 connected to the element 24, and a taping member 26 on which the components are taped at regular intervals as shown in FIG. 2. The component supply unit 5 supplies the chain of taped components 4 to the chucks 13 in such a manner that the components are positioned with the element 24 extending upwards and the lead terminals 25 extending downwards, and they are also aligned so that a phantom line extended through two lead terminals 25 of a component held by one of the chucks 13 is approximately in line with another phantom line extended through two lead terminals 25 of another component to be held subsequently by another chuck, as shown in FIG. 2. In other words, the exemplary embodiment of the present invention reduces a space occupied by the component supply unit 5, as shown in FIG. 1, since the component supply unit 5 supplies the chain of taped components 4 linearly toward the chucks 13 on the belt 6 used as the component delivery unit.

Although an apparatus of the present exemplary embodiment is provided with a plurality of component supply units 5 of this kind side by side, as shown in FIG. 1, the apparatus can be overall small in size, when the plurality of component supply units 5 are disposed side by side, since each of the component supply units 5 has a slim shape because the chain of taped components 4 are supplied linearly to the chucks 13. In other words, the apparatus can improve an efficiency of supplying components by arranging a larger number of the component supply units 5 in a limited space, as shown in FIG. 1.

Figure 4:
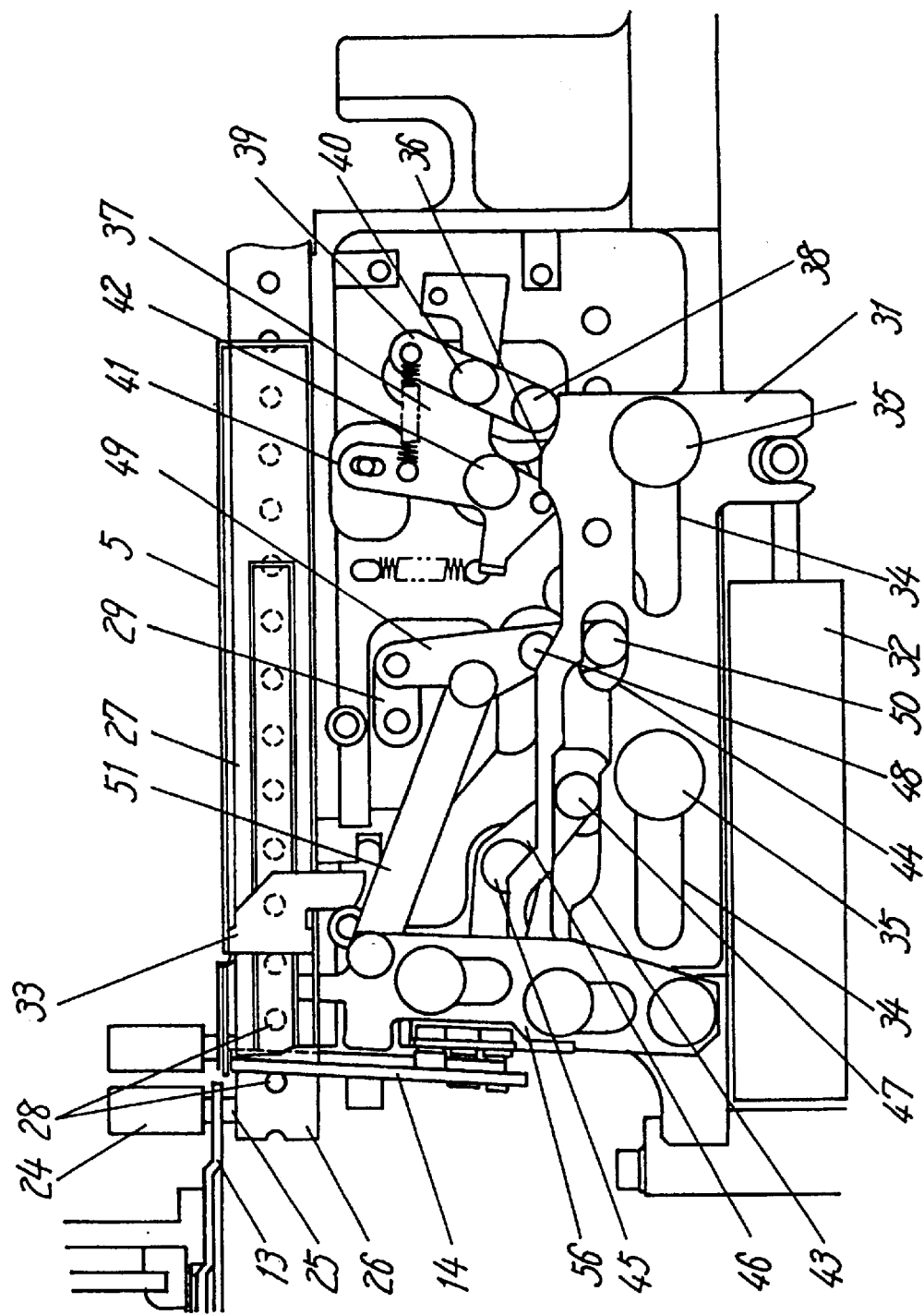
FIG. 4 is a front view of the same component supply unit portion.
Figure 5:
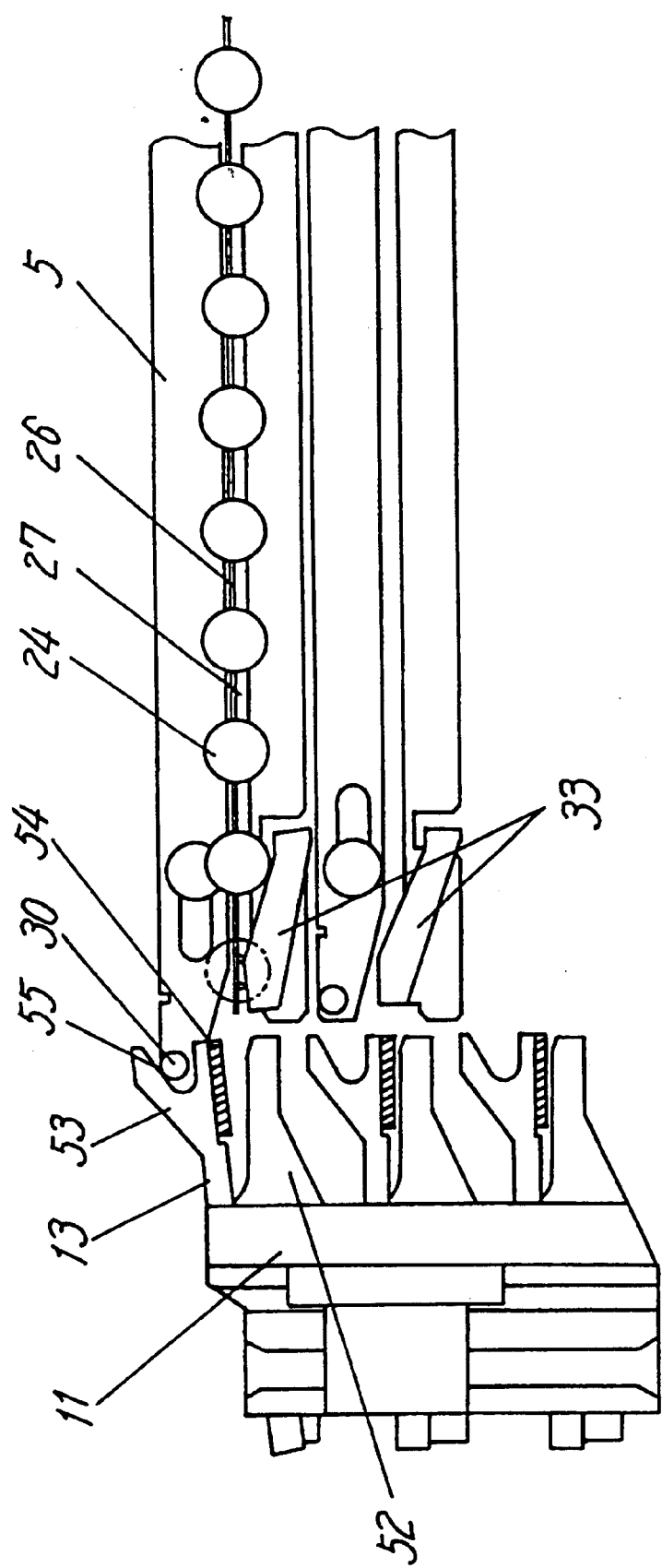
FIG. 5 is a plan view of the same component supply unit portion.

FIG. 4 and FIG. 5, respectively, depict portions of the component supply unit 5. The component supply unit 5 comprises: a guide channel 27 for guiding the chain of taped components 4; a feeder 29 linked to perforations 28 in the taping member 26 located in the guide channel 27 for moving the taping member 26 intermittently in a ratchet motion; a first chuck release 30 interlocked with the feeder 29 for freeing the chuck 13, a first cutting blade (i.e., taping member cutting blade) 14 for cutting the taping member 26 while holding the lead terminals 25 of the chain of taped components 4 with the chuck 13; a cam 31 for driving the feeder 29, the first chuck release 30, and the first cutting blade 14; and a cylinder 32 used as a driving unit for driving the cam 31, and so on.

An element detector 33 fronts the guide channel 27, as shown in FIG. 5, and it detects whether or not an element 24 is present at a predetermined position on the chain of taped components 4. An output of the element detector 33 controls a magnitude of movement of the cam 31 by the cylinder 32, as will be described later. The cam 31 has two slide openings (slots) 34, which connect to their respective pins 35, and it is moved reciprocally by the cylinder 32.

The first chuck release 30 is connected to a chuck opening cam surface 36 of the cam 31 via a transmission mechanism 37. The transmission mechanism 37 comprises: a first lever 39 having a pin 38 in contact with the chuck opening cam surface 36; a lever 41 supporting the lever 39 with an axle 40; an axle 42 supporting axially the lever 41, and so on.

Referring back to the cam 31 for more details, it is provided with a cutting blade open/close cam surface 43 and a cutting blade shift cam surface 44. The cutting blade open/close cam surface 43 is linked with a pin 47 on a second lever 46, which is supported axially by an axle 45, thereby enabling the cam 31 to open and close the first cutting blade 14 via the second lever 46.

Also, the cutting blade shift cam surface 44 is linked with a pin 50 on a third lever 49, which is supported axially by an axle 48, and a free end of the third lever 49 is connected to the afore-cited feeder 29. Further, the free end is also connected to the first cutting blade 14 via a fourth lever 51.

Referring now to FIG. 6 through FIG. 11, described hereinafter is a series of operations relating to transfer of the chain of taped components 4, cutting it into individual component pieces, and feeding the components 4 to the chuck 13.

Figure 6:
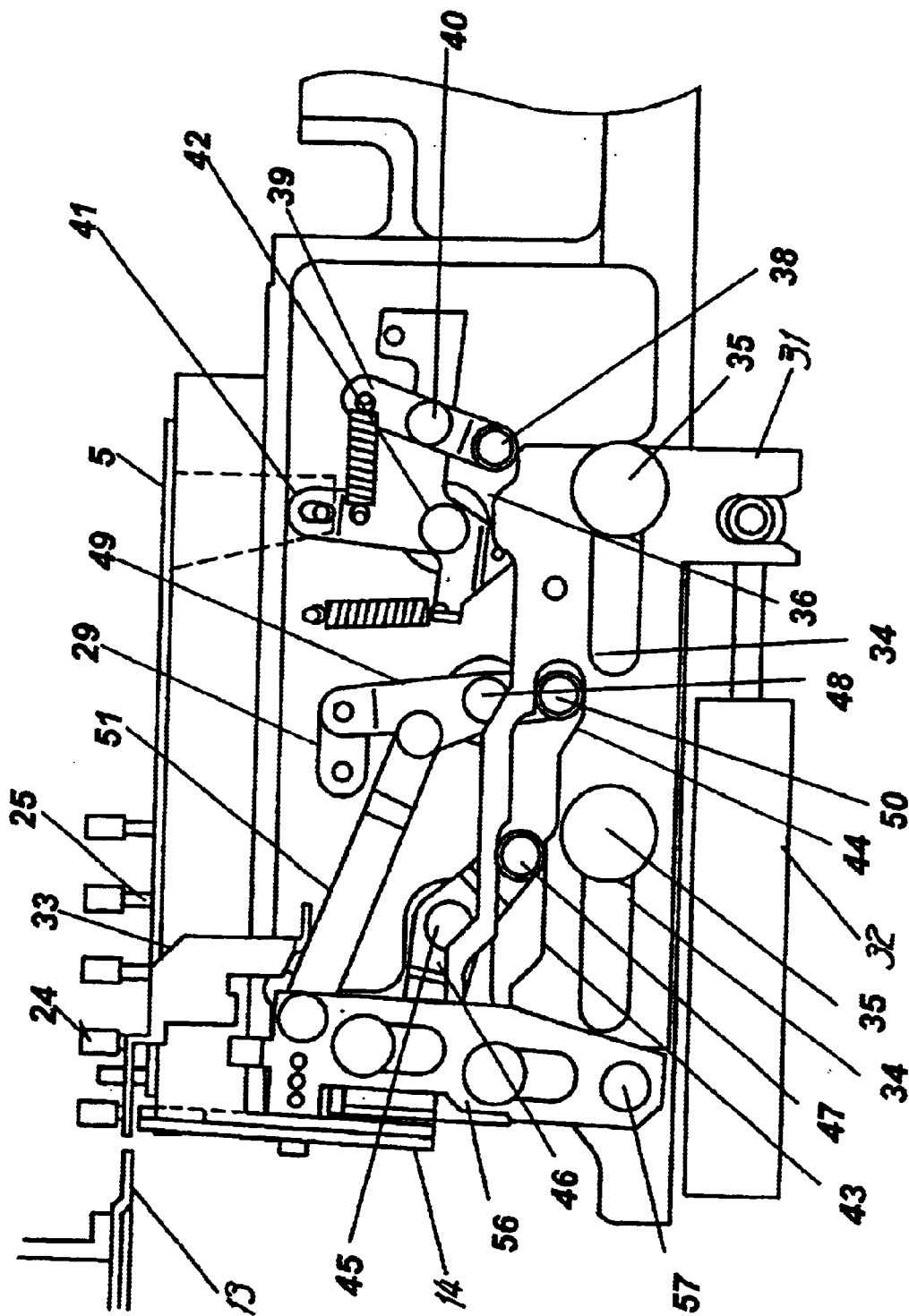
FIG. 6 is a front view of an essential portion of the same component supply unit.

FIG. 6 shows the cam 31 in its initial position, where it is shifted to a leftmost position by the cylinder 32. The distinctiveness of this position is that the first cutting blade 14 is set at a side of the component supply unit 5, as shown in FIG. 6. That is, the chuck 13 and the first cutting blade 14 are close to each other, yet the first cutting blade 14 is shifted toward the component supply unit 5. Therefore, the transfer of a component to a second cutting blade 15 by the chuck 13 will not be hindered as the transfer takes place, as shown by FIG. 6.

Figure 7:
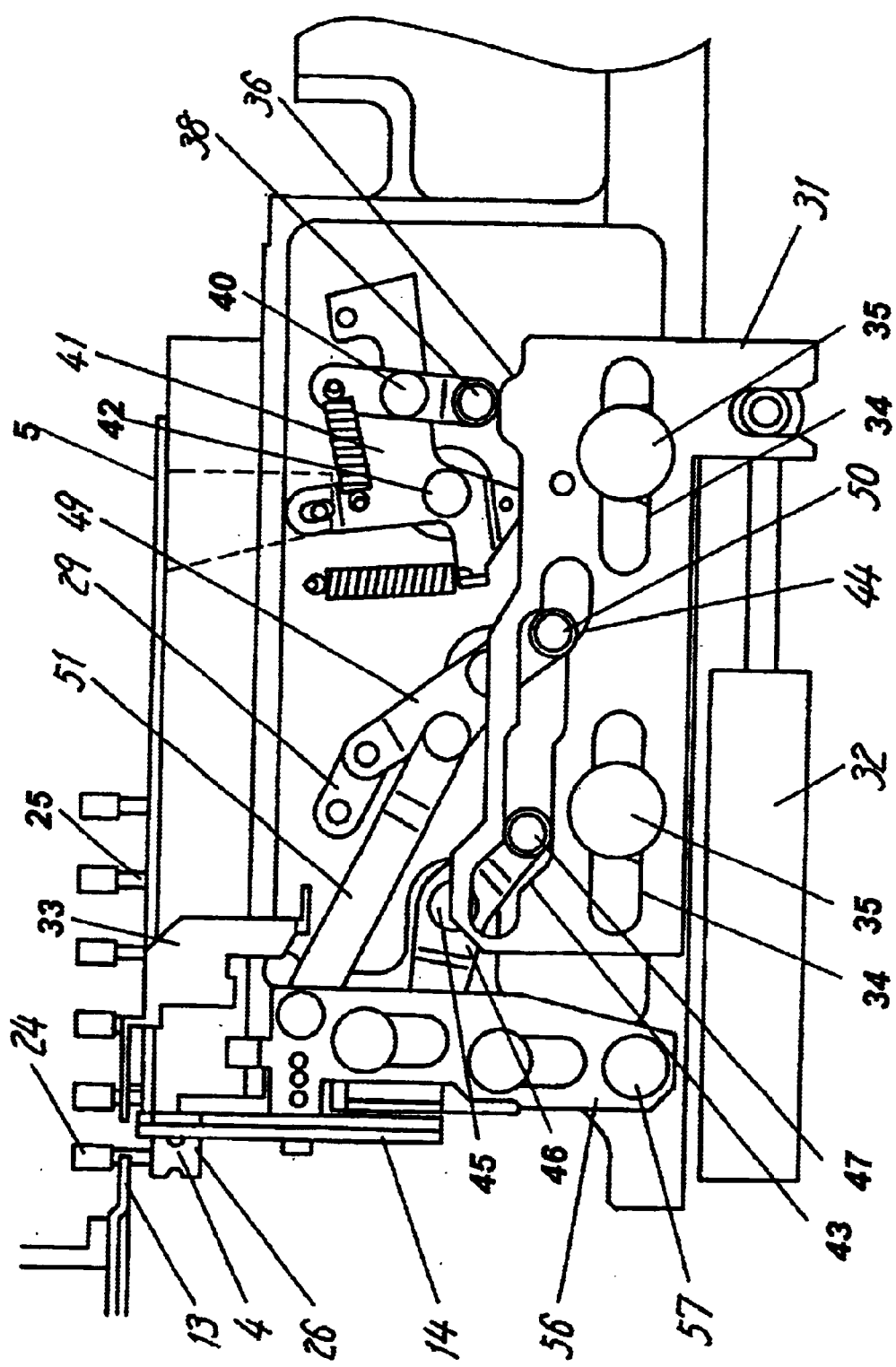
FIG. 7 is another front view of the same portion of the component supply unit.

In the state shown by FIG. 6, the first cutting blade 14 is in its open position, and the chain of taped components 4 advances to the opened first cutting blade 14 in the next step of FIG. 7. When the cam 31 shifts toward the right, as shown in FIG. 7, the fifth lever 41 turns counterclockwise around the axle 42 as an axis, because the pin 38 slides up on the chuck opening cam surface 36 of the cam 31 at the beginning of the rightward movement of the cam 31. This causes the first chuck release 30 to shift toward the chuck 13, as shown in FIG. 5.

The chuck 13 comprises a fixed nail 52, a movable nail 53 which opens and closes with respect to the fixed nail 52, and an elastic body 54 attached to an inside face of the movable nail 53. The movable nail 53 is provided with a hook 55 at a side closest to the component supply unit 5 for making a linkage to the first chuck release 30.

Therefore, when the first chuck release 30 makes a small stroke of movement, it can open the chuck 13 first, as shown in FIG. 5, because the first chuck release 30 contacts the hook 55 provided on the movable nail 53 of the chuck 13 at a side closest to the component supply unit 5 so as to link the first chuck release 30 and the chuck 13.

The elastic body 54 is attached to the movable nail 53 with a pin penetrating through the elastic body 54. Use of the pin for attaching the elastic body 54 to the movable nail 53 by penetrating therethrough can prevent the elastic body 54 from coming off of the movable nail 53, even if a stress of deformation is applied repeatedly to the elastic body 54 due to opening and closing of the chuck 13.

The chuck 13 fixes a position of an individual component piece separated from the chain of taped components 4 with the fixed nail 52, and holds the component piece securely with a moderate elasticity of the elastic body 54 on the inside face of the movable nail 53.

When the chuck 13 is in its open position, the pin 50 slides up on the cutting blade shift cam surface 44 to drive the feeder 29 via the third lever 49, and thereby feed the chain of taped components 4 into the open chuck 13, as shown in FIG. 7.

The chuck 13 is in a standby state for receiving the chain of taped components 4 at this moment, so as not to interfere with the feeding, even if the first cutting blade 14 is shifted toward the chuck 13 via the fourth lever 51 and a holder 56 of the first cutting blade 14. The holder 56 is axially supported by an axle 57, and it shifts the first cutting blade 14 toward the chuck 13, when a free end of it is moved left by the lever 51.

Figure 8:
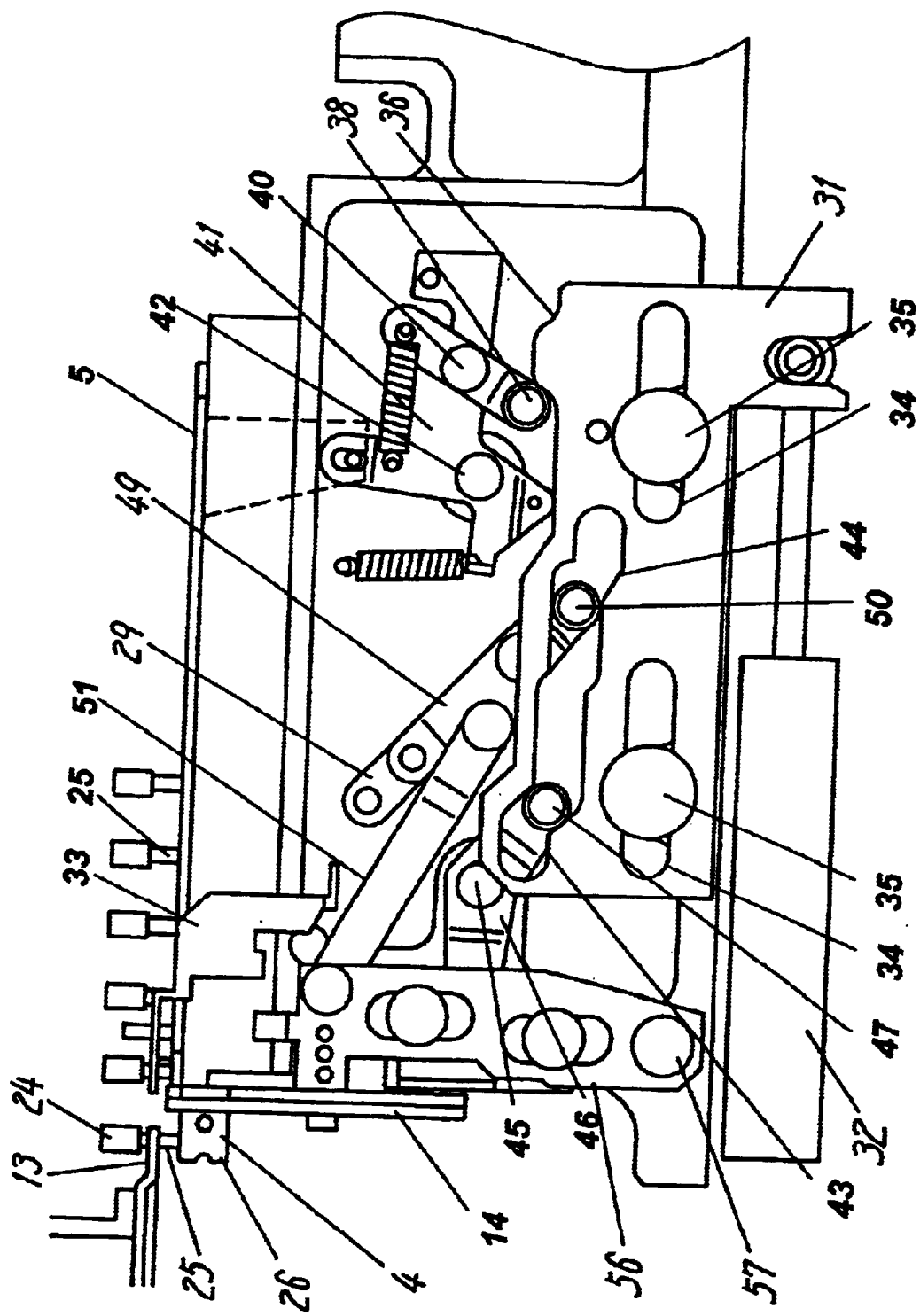
FIG. 8 is another front view of the same portion of the component supply unit.

FIG. 8 shows a state wherein the cam 31 has been shifted further to the right side by the cylinder 32, and the third lever 49 has made the feeder 29 complete the feeding movement at this moment. The pin 38 has nearly slid down on the chuck opening cam surface 36 at this moment. As the fifth lever 41 turns clockwise in this state, the first chuck release 30 shifts toward the right side, and the chuck 13 moves near to its closed position. This means that the lead terminals 25 of the element 24 are being held by the chuck 13 at a leading end of the chain of taped components 4, as shown in FIG. 4.

Figure 9:
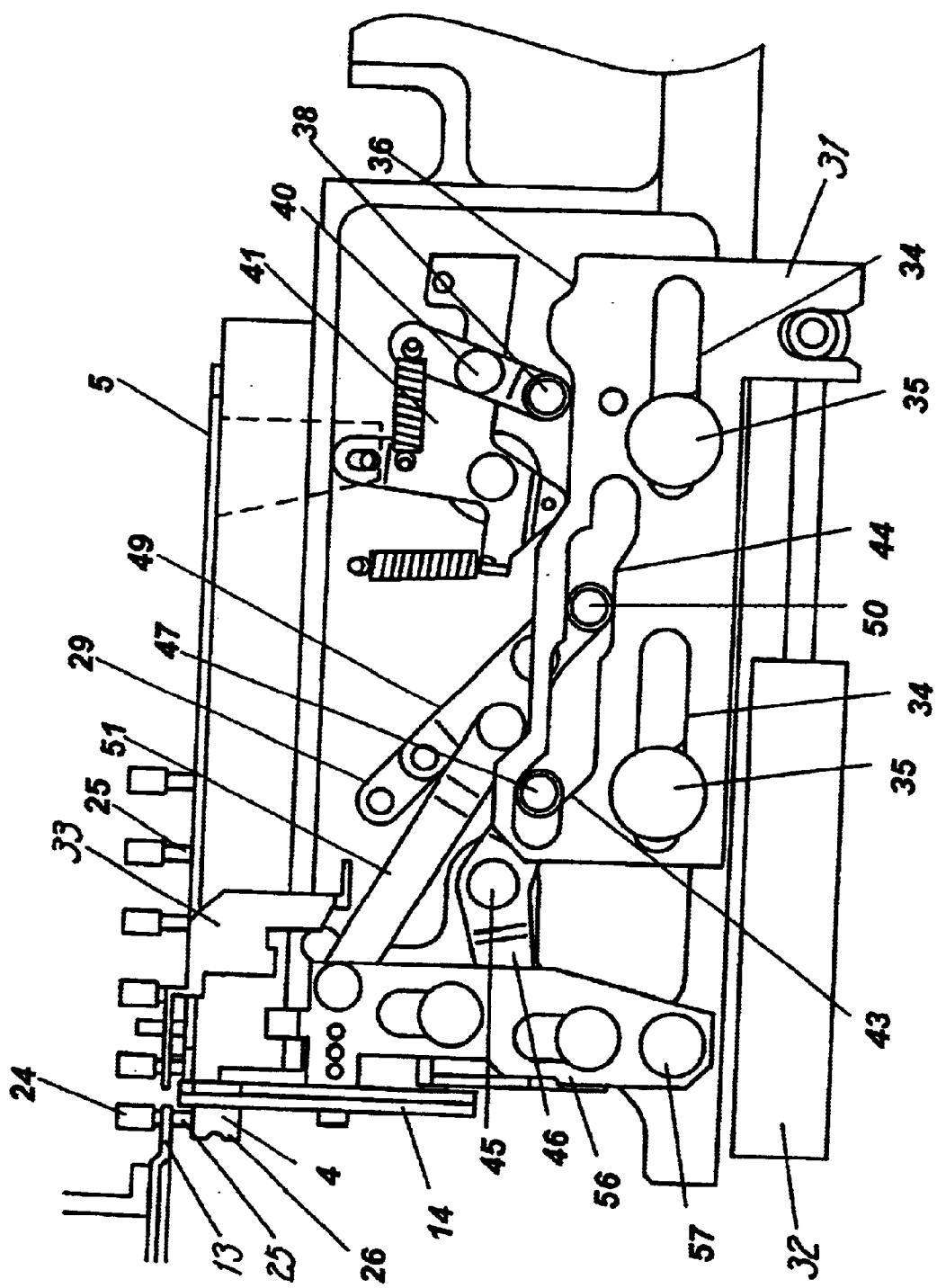
FIG. 9 is still another front view of the same portion of the component supply unit.

FIG. 9 shows a state wherein the cam 31 has been shifted even further toward the right side by the cylinder 32, and the lead terminals 25 are completely held by the chuck 13.

Figure 10:
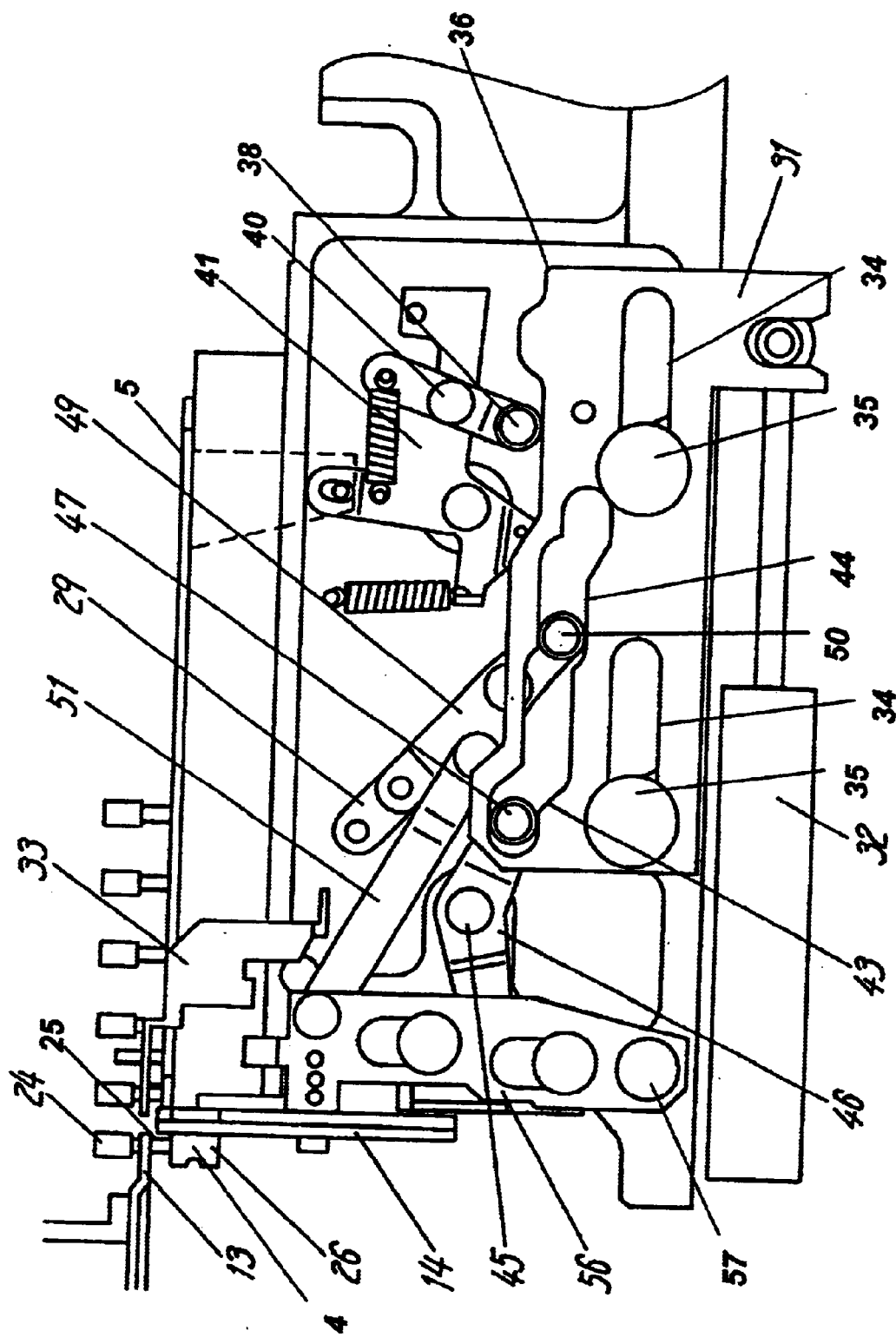
FIG. 10 is still another front view of the same portion of the component supply unit.

FIG. 10 shows a state wherein the cam 31 has been shifted to the rightmost end by the cylinder 32. In this state, a left end of the second lever 46 supported axially by the axle 45 is moved downward, because the pin 47 is in a position so as to completely slide up on the cutting blade open/close cam surface 43. Thus, the taping member 26 is cut off to separate a component piece, which is then held by the chuck 13.

Figure 11:
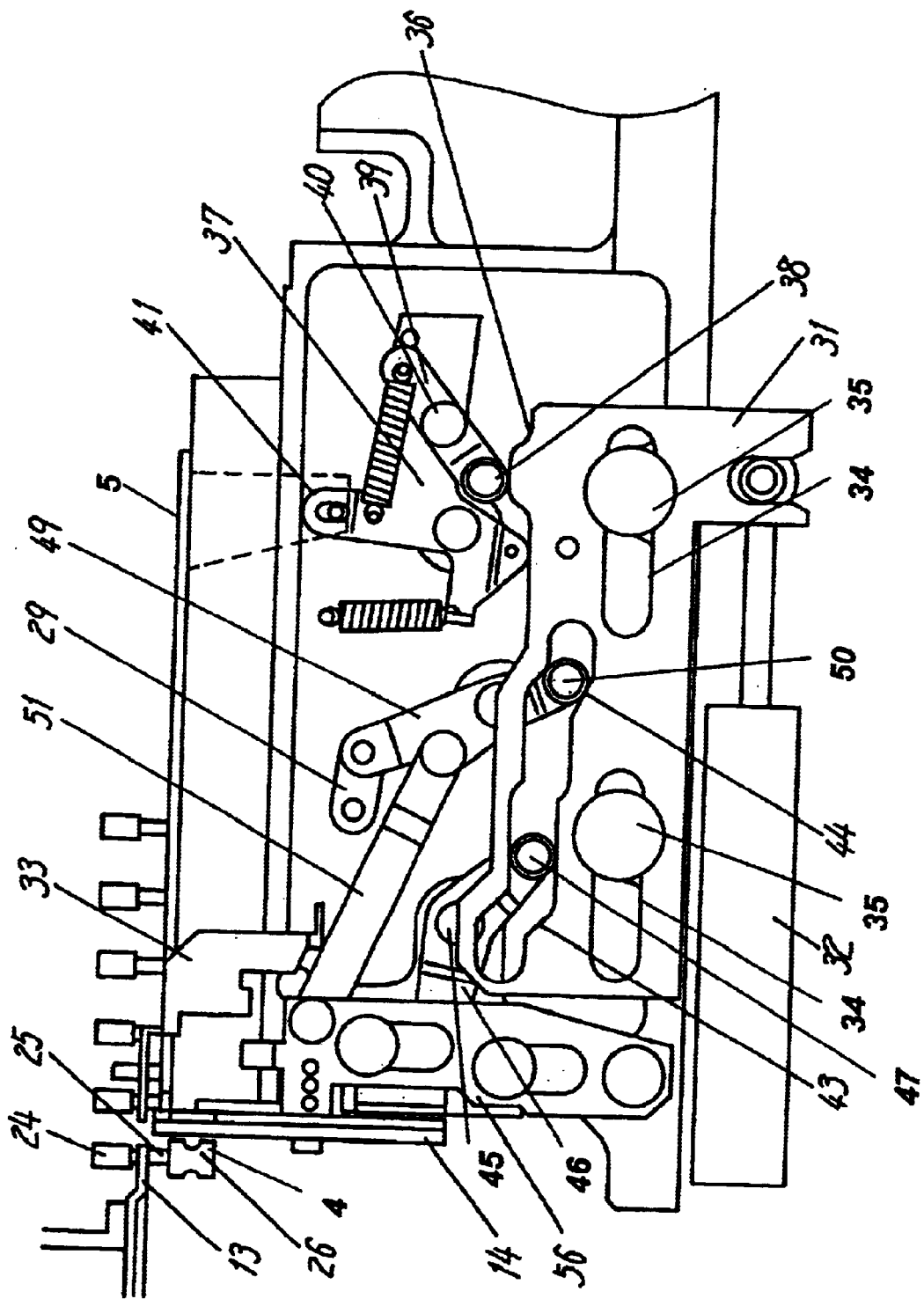
FIG. 11 is yet another front view of the same portion of the component supply unit.

Finally, the cylinder 32 causes the cam 31 to return to its original position of FIG. 4 by passing through a position shown in FIG. 11.

When the cam 31 returns toward the left side in the position shown in FIG. 11, the pin 38 slides up on the chuck opening cam surface 36. However, if the chuck 13 is opened during this return movement, the component piece held by the chuck 13 slips off. It is therefore important to provide a countermeasure against it.

In this exemplary embodiment, the transmission mechanism 37 is constituted so that the first lever 39 turns only clockwise without depressing the fifth lever 41 to the left side, when the pin 38 on the lever 39 slides up on the chuck opening cam surface 36 during the return movement. As a result, the first chuck release 30 does not open the chuck 13, so as not to cause the component piece to fall off. Also, the first cutting blade 14 does not interfere with a transfer movement of the chuck 13 holding the component piece, because it returns toward the component supply unit 5 after it opens. The feeder 29 also returns to its original position, as needless to mention, in order to become ready for a subsequent transfer movement.

As has been described, the component supply unit 5 of the present exemplary embodiment is able to supply the component to the chuck 13 smoothly, since it is provided with the first chuck release 30 for opening the chuck 13. This enables the component supply unit 5 to provide a combined operation of supplying the component and opening the chuck 13.

Specifically, the foregoing structure is such that the first chuck release 30 is actuated by the chuck open cam surface 36 of the cam 31, which also actuates the feeder 29 for the chain of taped components 4 provided on the component supply unit 5. Because only this single cam 31 actuates both the feeder 29 for the chain of taped components 4 on the component supply unit 5 and the first chuck release 30, the structure realizes a combined operation of advancing the chain of taped components 4 and holding it by the chuck 13, and thereby making a smooth supply of the components to the chuck 13.

The component supply unit 5 is also provided with the first cutting blade 14 between the feeder 29 and the chuck 13. The first cutting blade 14 has such a structure that it is actuated by the cutting blade open/close cam surface 43 and the cutting blade shift cam surface 44 of the cam 31. Since the cam 31 also actuates the first cutting blade 14, in addition to the feeder 29 and the first chuck release 30, this structure realizes a combined operation of using the feeder 29 to advance the chain of taped components 4, using the first cutting blade 14 to cut the chain into separate component pieces, and using the chuck 13 to hold the component piece. Consequently, there is a smooth supply of the components to the chuck 13.

The component supply unit 5 is provided with the element detector 33 for detecting the presence or absence of an element 24 on the chain of taped components 4, as shown in FIG. 4 and FIG. 5. The element detector 33 detects an element 24, or (more correctly) an absence of element 24 if it does not detect lead terminals 25 under the ordinary operating condition. If the element detector 33 detects absence of element 24, it actuates the cylinder 32 to return the cam 31 to the position shown in FIG. 4, after shifting it for only a first amount of movement (to the position of FIG. 8).

In other words, the element detector 33 is used to expedite delivery to the chuck 13, of a portion carrying an element 24 in the chain of taped components 4, by shifting the cam 31 for a second amount of movement (to a position of FIG. 10), without activating the first cutting blade 14 to make a cutting operation of the chain of taped components 4, if no element 24 is detected. In this case, however, there is a long piece of the taping member 26 left uncut under the chuck 13 and inside of the belt 6 with the component piece held by the chuck 13, and this piece of the taping member 26 is therefore cut into a predetermined length afterwards by the second cutting blade 15.

Figure 12:
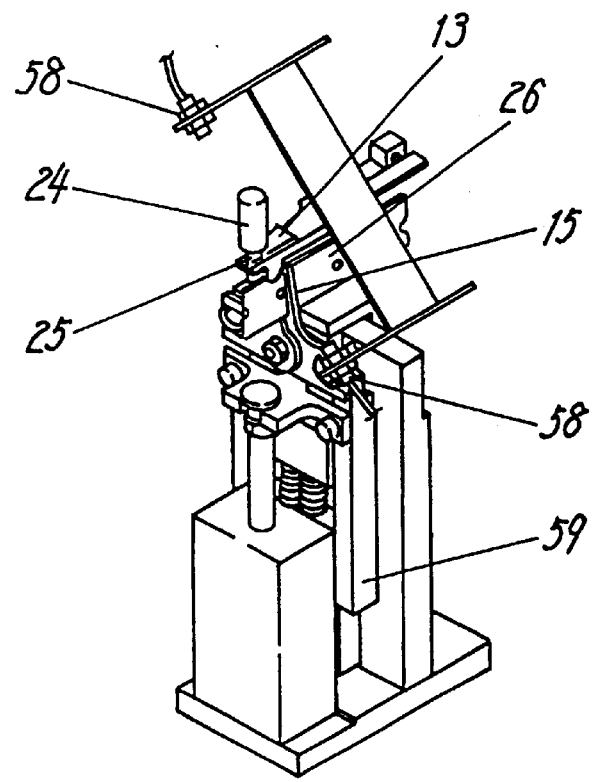
FIG. 12 is a perspective view depicting a portion around a second cutting blade of the same component mounting apparatus.

After the component piece is transferred to the chuck 13 in the above manner, the motor 10 is started and the component piece is carried by the belt 6. There is an extra-length detector 58 positioned at a downstream side of a component supply to the chuck 13 location on the belt 6 from the component supply unit 5 for detecting the presence or absence of a long piece of the taping member 26, as shown in FIG. 12. This extra-length detector 58 activates the second cutting blade 15 to cut the long piece of taping member 26 into the predetermined length. That is, if the chuck 13 on the belt 6 carries the taping member 26 in a length longer than a predetermined length, the extra-length detector 58 detects it and activates the second cutting blade 15 to cut it into the proper length.

The extra-length detector 58 comprises an optical system having a light-emitting element and a light-receiving element. It determines that a long piece of the taping member 26 is present, if light is cut off by an extra long portion of the taping member 26. When the extra-length detector 58 detects a long piece of the taping member 26, an elevator 59 lifts the second cutting blade 15 upward from a lower position, and the second cutting blade 15 cuts an extra length of the taping member 26 at the lifted position. The second cutting blade 15 is moved down to its lower position by the elevator 59 after it completes the cutting operation. Because of this structure, wherein the second cutting blade 15 moves up only to cut a long piece of the taping member 26, and moves down after the cutting, the second cutting blade 15 does not interfere with the belt 6 which carries the components.

Figure 13:
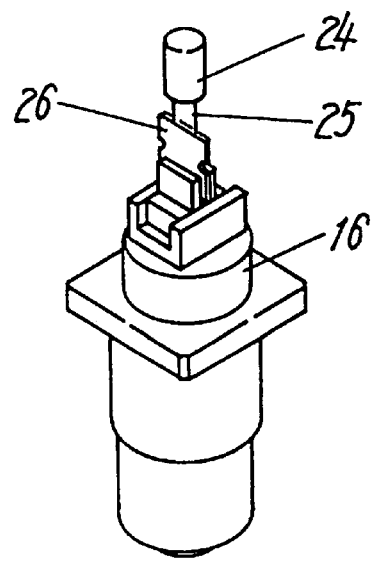
FIG. 13 is a perspective view depicting a polarity flipper unit portion of the same component mounting apparatus.

FIG. 13 shows a polarity flipper unit 16 provided at a downstream side of the second cutting blade 15. The polarity flipper unit 16 is freely movable toward and away from the belt 6. That is, the polarity flipper unit 16 is moved toward the belt 6 at a side of the chuck 13 if a need arises for the polarity of the component to be reversed prior to mounting it on a substrate using the head 20. The polarity flipper unit 16 reverses the polarity of a component by receiving the component from the chuck 13, rotating it, and returning it again to the chuck 13 for the successive carrying movement. Since the polarity flipper unit 16 stays away from the chuck 13 when it is not required to reverse polarity, it does not interfere with carriage of the components. The chuck 13 needs to be opened for a moment in order to give and take the component piece to and from the polarity flipper unit 16, shown in FIG. 13. A structure to carry out this function will be described by referring to FIG. 14.

Figure 14:
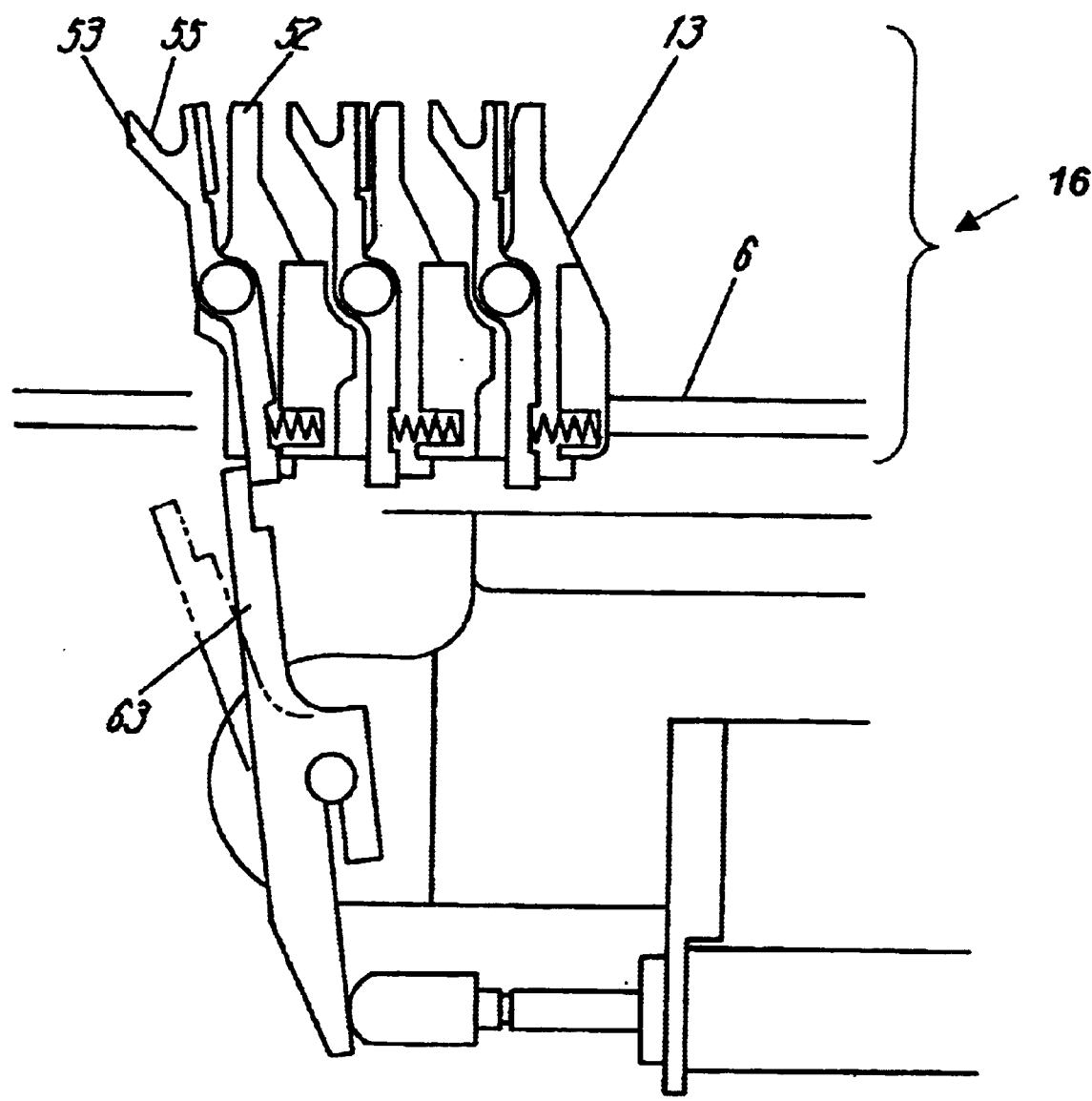
FIG. 14 is a plan view depicting a second chuck release portion of the same component mounting apparatus.

As shown in FIG. 14, one end of the chuck 13 opposite to the hook 55 of the movable nail 53 is extended to the backside of the belt 6, and this extended end is linked to a second chuck release 63, so that the chuck 13 is opened by the second chuck release 63.

Figure 15:
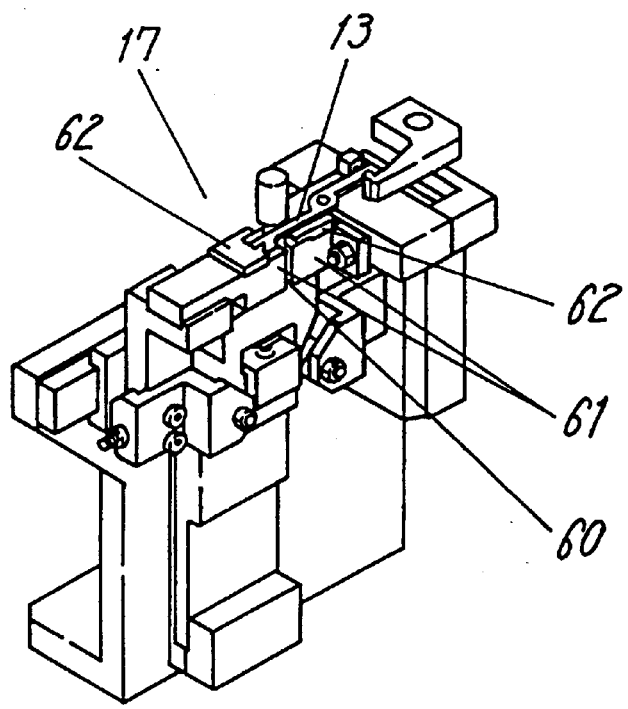
FIG. 15 is a perspective view depicting a hold-position correction unit portion of the same component mounting apparatus.

FIG. 15 shows a hold position correction unit 17 provided at a downstream side of the polarity flipper unit 16. The hold position correction unit 17 carries out correction of a position of the lead terminals 25 held by the chuck 13, after the polarity flipper unit 16 of FIG. 13 has reversed polarity of the component needing the reversion.

The hold position correction unit 17 comprises: a positioning base 60 for setting thereon a bottom edge of the taping member 26; a holder 61 for holding the taping member 26 by two sides orthogonal to a longitudinal direction thereof, and push bodies 62 for shifting the component by pushing the lead terminals 25 of the component along the longitudinal direction of the taping member 26.

When making a correction, the taping member 26 is set first on the positioning base 60. Then the taping member 26 is centralized by the push bodies 62 at both sides for the correction of a hold position of the lead terminals 25, after opening the chuck 13 with another second chuck release 63 having the same structure as the one shown in FIG. 14 and provided in a position relative to the chuck 13. The chuck 13 is then closed to hold the lead terminals 25 properly.

Figure 16:
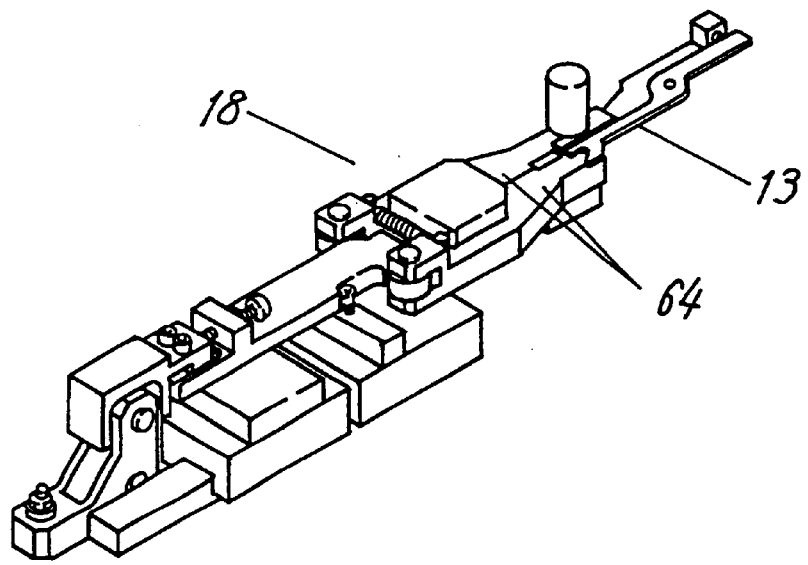
FIG. 16 is a perspective view depicting a portion around a third cutting blade portion of the same component mounting apparatus.

FIG. 16 shows a portion around a third cutting blade (i.e., a lead terminal cutting blade) 18 provided at a downstream side of the hold position correction unit 17 for cutting the lead terminals 25. The third cutting blade 18 is freely movable toward and away from the chuck 13 on the belt 6. That is, the third cutting blade 18 can cut the lead terminals 25 properly, since it cuts the lead terminals 25 only after completion of the correction of the hold position using the chuck 13.

The third cutting blade 18 comprises a pair of openable blades 64, of which lower surfaces at their distal portion are tapered. Lengths of the lead terminals 25 are made uniform after the cutting, since they are cut while an upper edge of the taping member 26 of the component piece held by the chuck 13 is kept in contact with the tapered surfaces.

Figure 17:
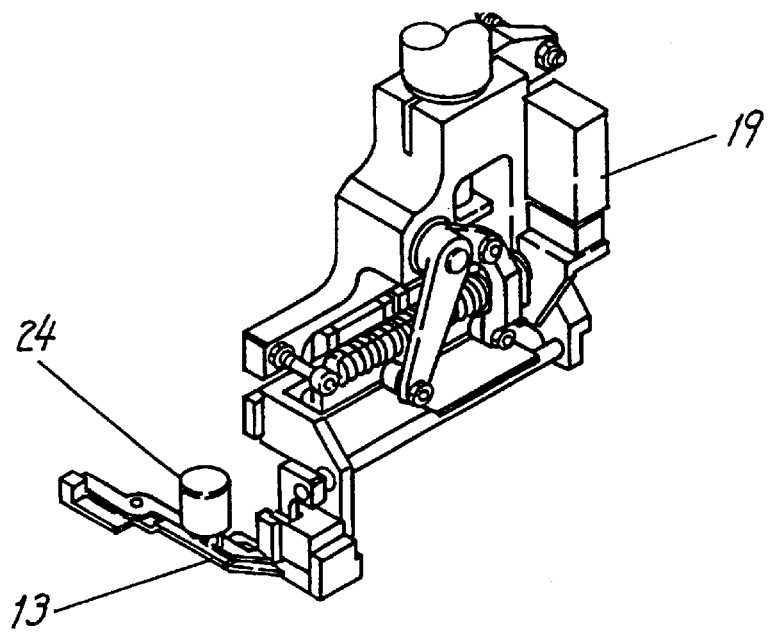
FIG. 17 is a perspective view depicting a component transfer unit portion of the same component mounting apparatus.
Figure 18:
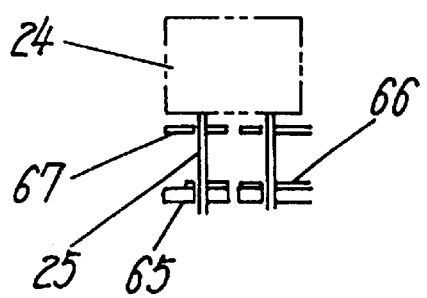
FIG. 18 is a side view depicting an essential portion of the same component transfer unit.

FIG. 17 shows a component transfer unit 19 for transferring a component held by the chuck 13 to the head 20. The component transfer unit 19 has a structure that includes two grip nails 65 and 66 for holding lower portions of the lead terminals 25, as shown in FIG. 18, and a support nail 67 for supporting upper portions of the lead terminals 25.

Figure 19:
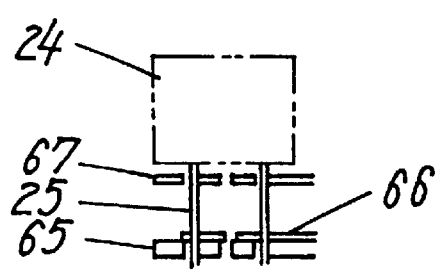
FIG. 19 is another side view of the same essential portion of the component transfer unit.

The first grip nail 65 of the two grip nails is integrated with the support nail 67, and the second grip nail 66 is arranged to be movable with respect to the grip nail 65. Because of the integration of the grip nail 65 with the support nail 67, the structure is simplified, and it provides reliable support for the lead terminals 25 by moving the grip nail 66 as depicted in FIG. 19.

Figure 20:
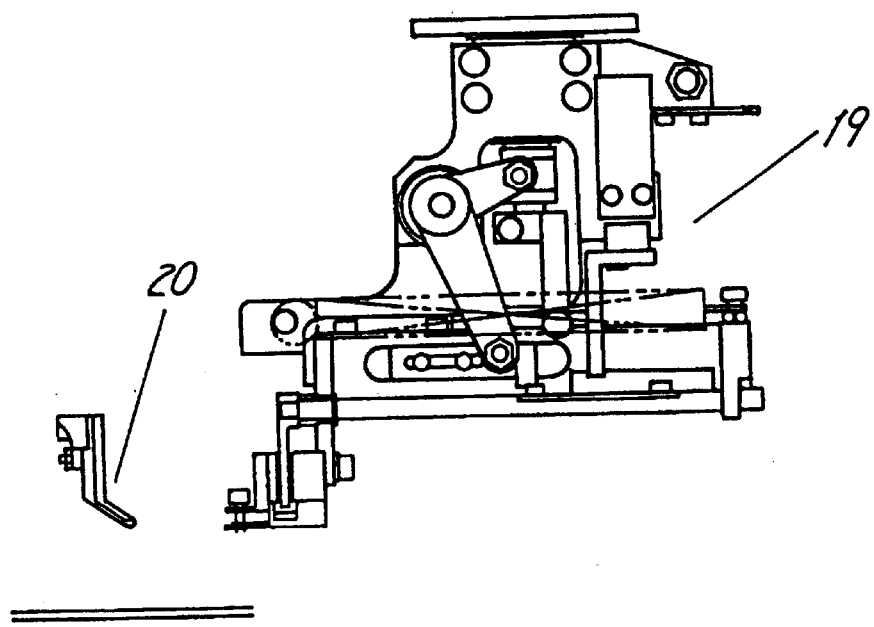
FIG. 20 is a front view depicting an essential portion around the component transfer unit and a head portion of the same component mounting apparatus.
Figure 21:
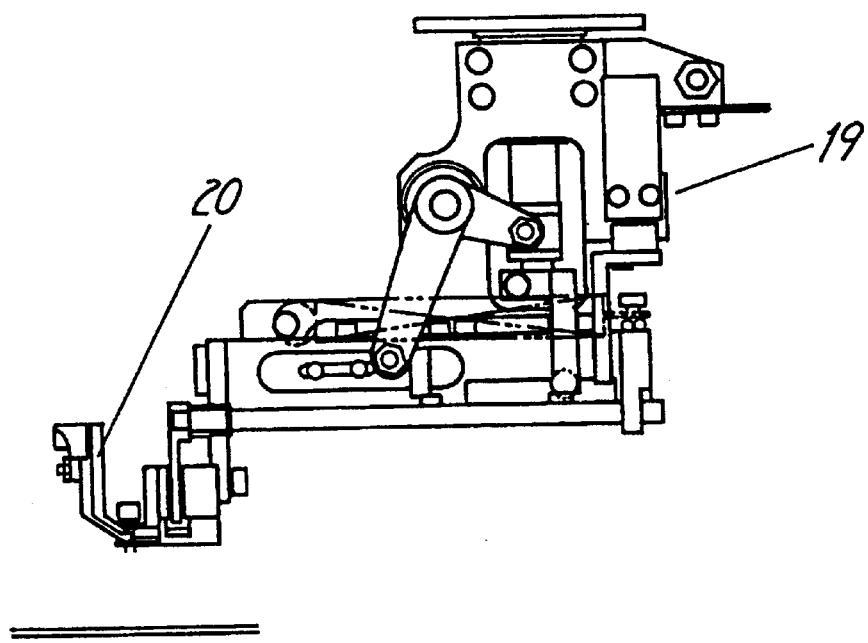
FIG. 21 is another front view depicting the same portion around the component transfer unit and the head portion.

FIG. 20 and FIG. 21 show a transfer movement of a component from the component transfer unit 19 to the head 20, wherein portions of the lead terminals 25 located between the grip nails 65 and 66 and the support nail 67 of the component transfer unit 19 are gripped by an insertion nail 68 of the head 20. Because of this structure, in which the insertion nail 68 of the head 20 holds the leaditerminals 25 so as to support them at both upper and lower portions by gripping their center portions, the insertion nails 68 can maintain a stable holding, and, as a result, the head 20 can carry out reliable mounting of the component on a substrate.

Figure 22:
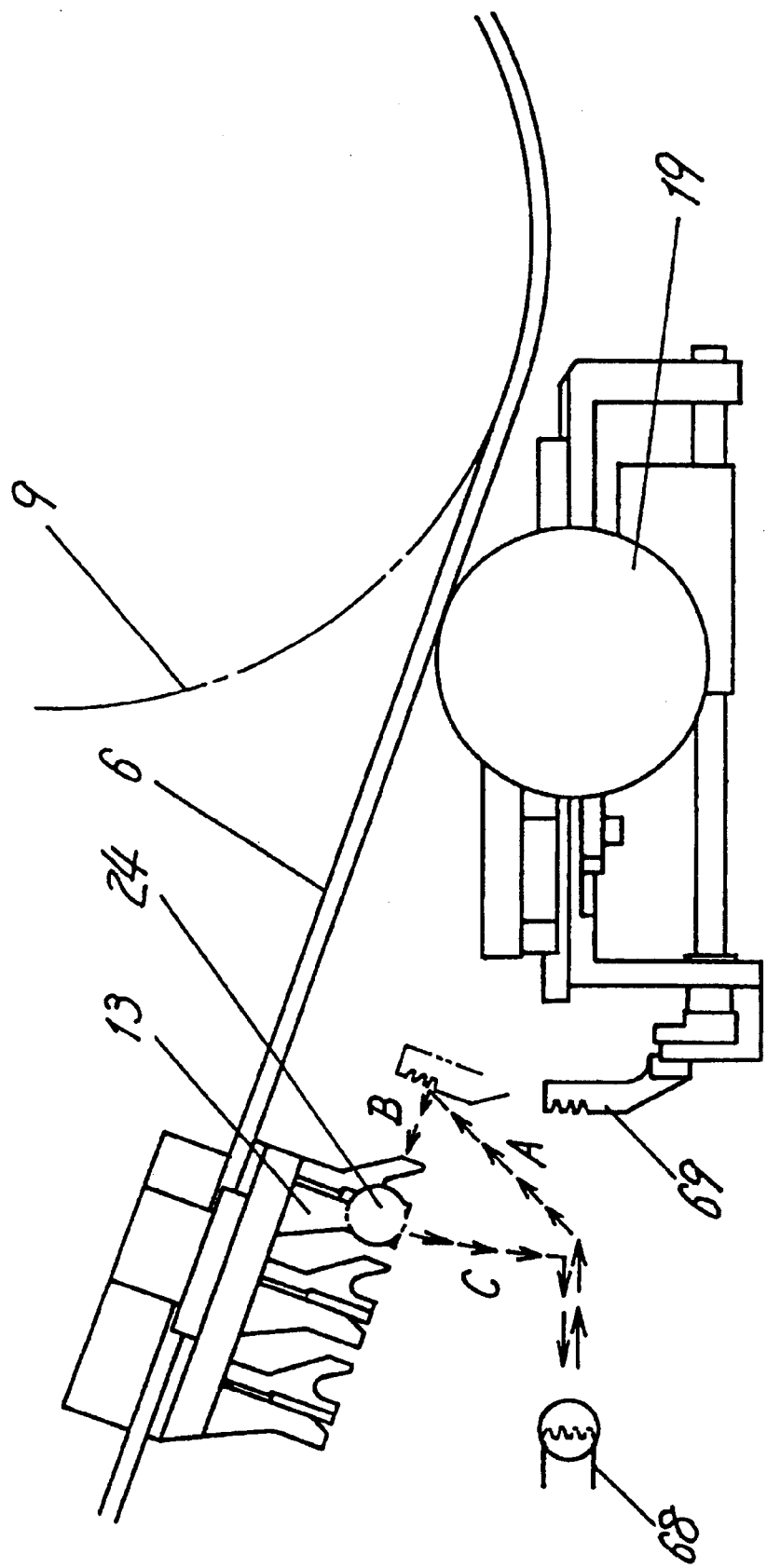
FIG. 22 is a plan view depicting an essential portion around the component transfer unit and the head portion.
Figure 23:
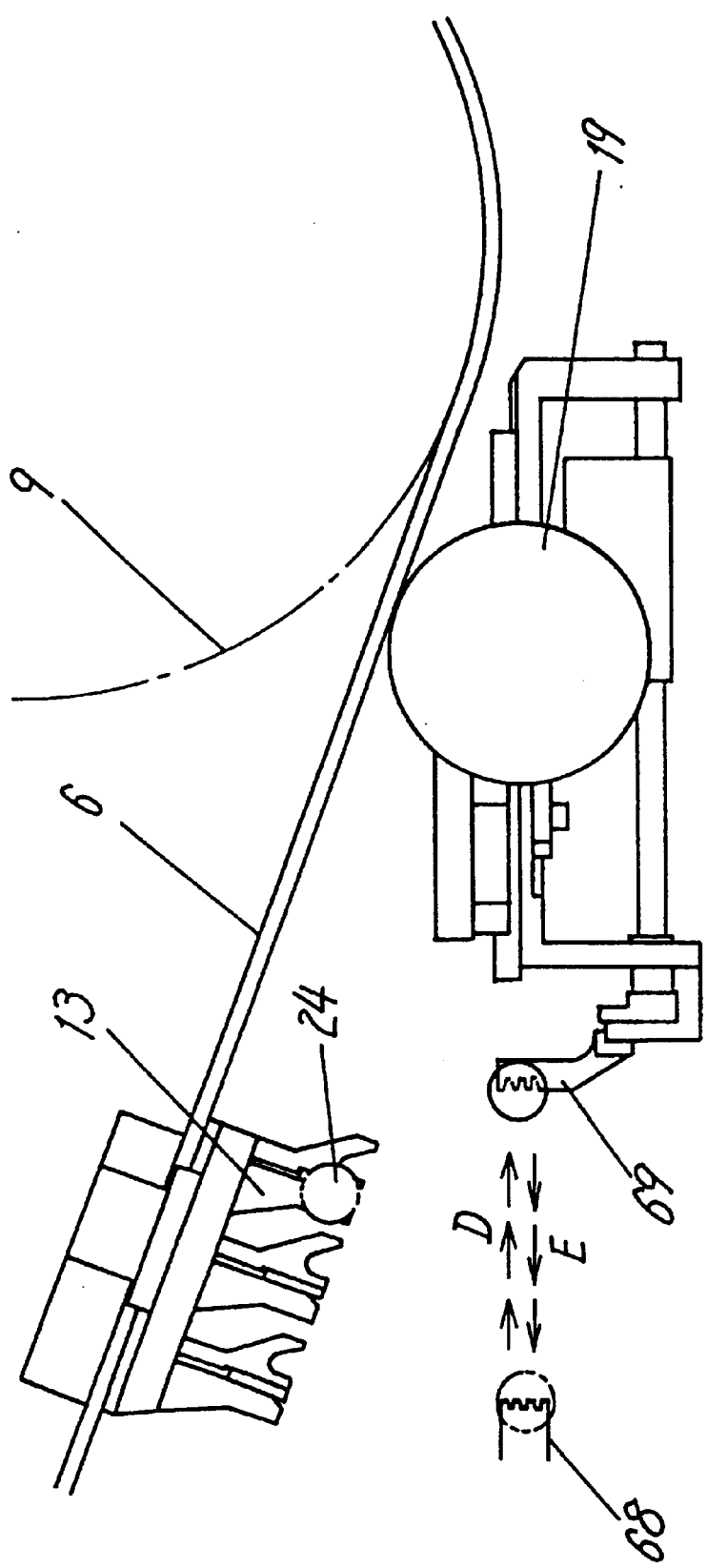
FIG. 23 is another plan view depicting the same essential portion around the component transfer unit and the head portion.
Figure 24:
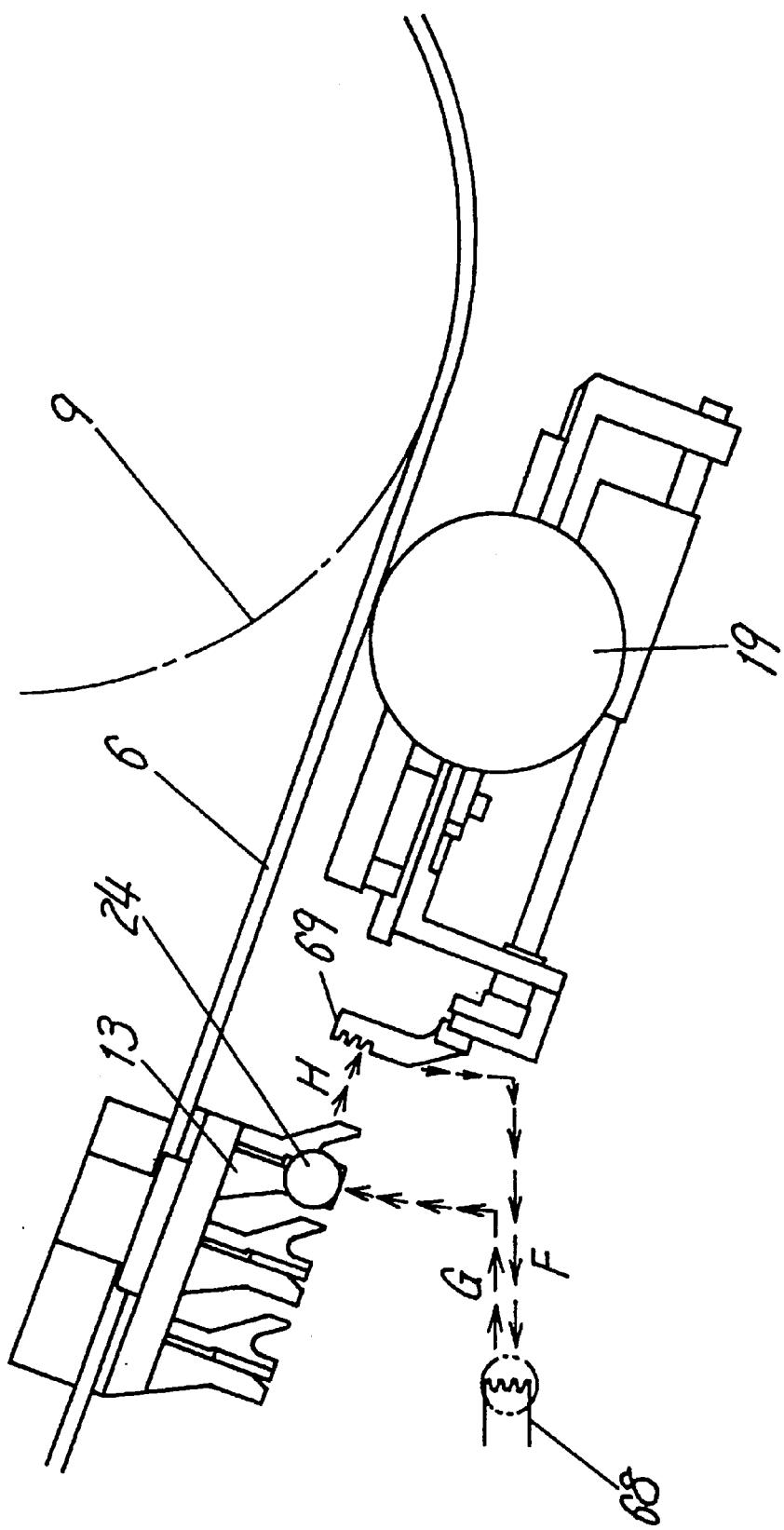
FIG. 24 is still another plan view depicting the same essential portion around the component transfer unit and the head portion.
Figure 25:
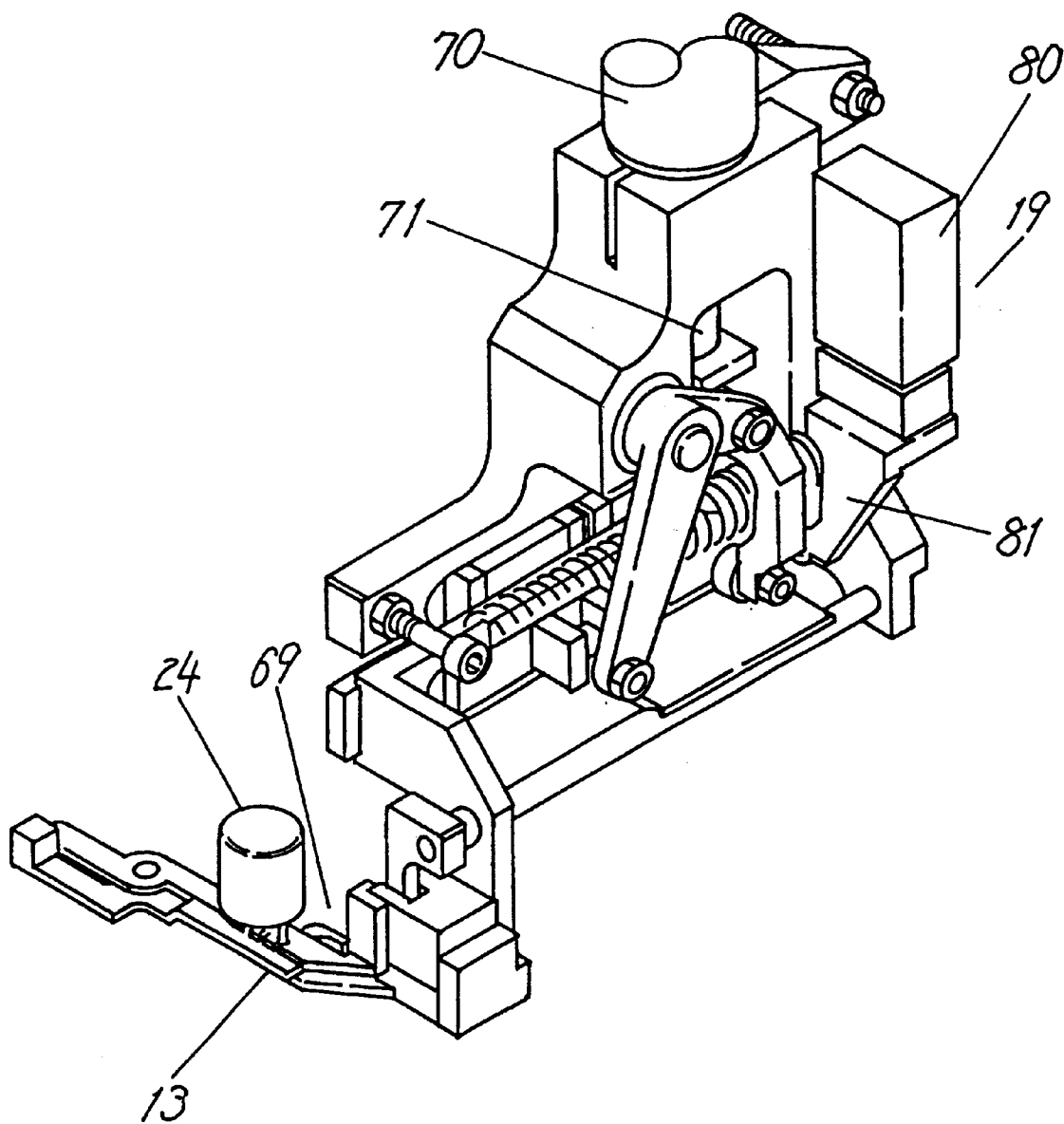
FIG. 25 is a perspective view depicting the same component transfer unit.
Figure 26:
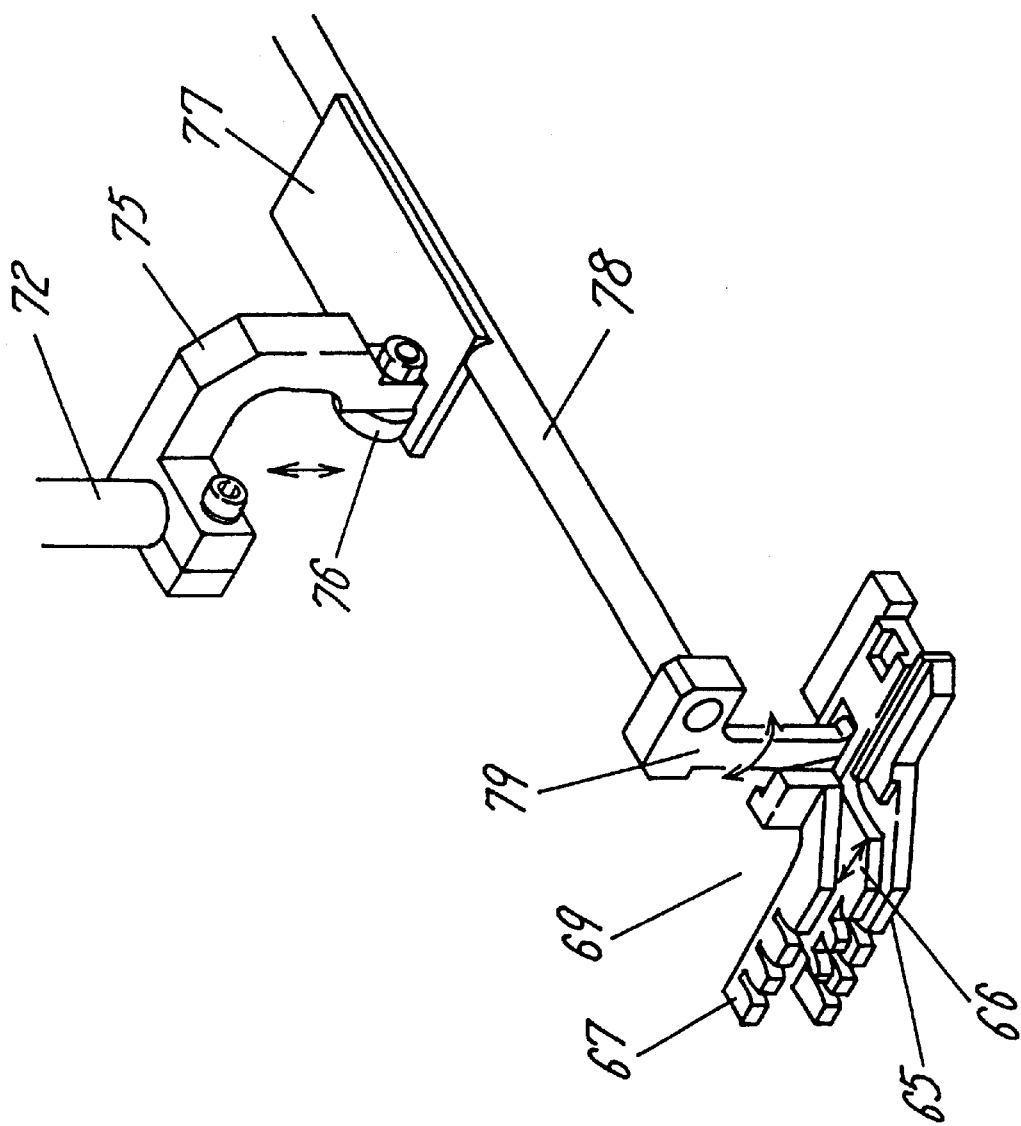
FIG. 26 is a perspective view depicting an essential portion of the same component transfer unit.
Figure 27:
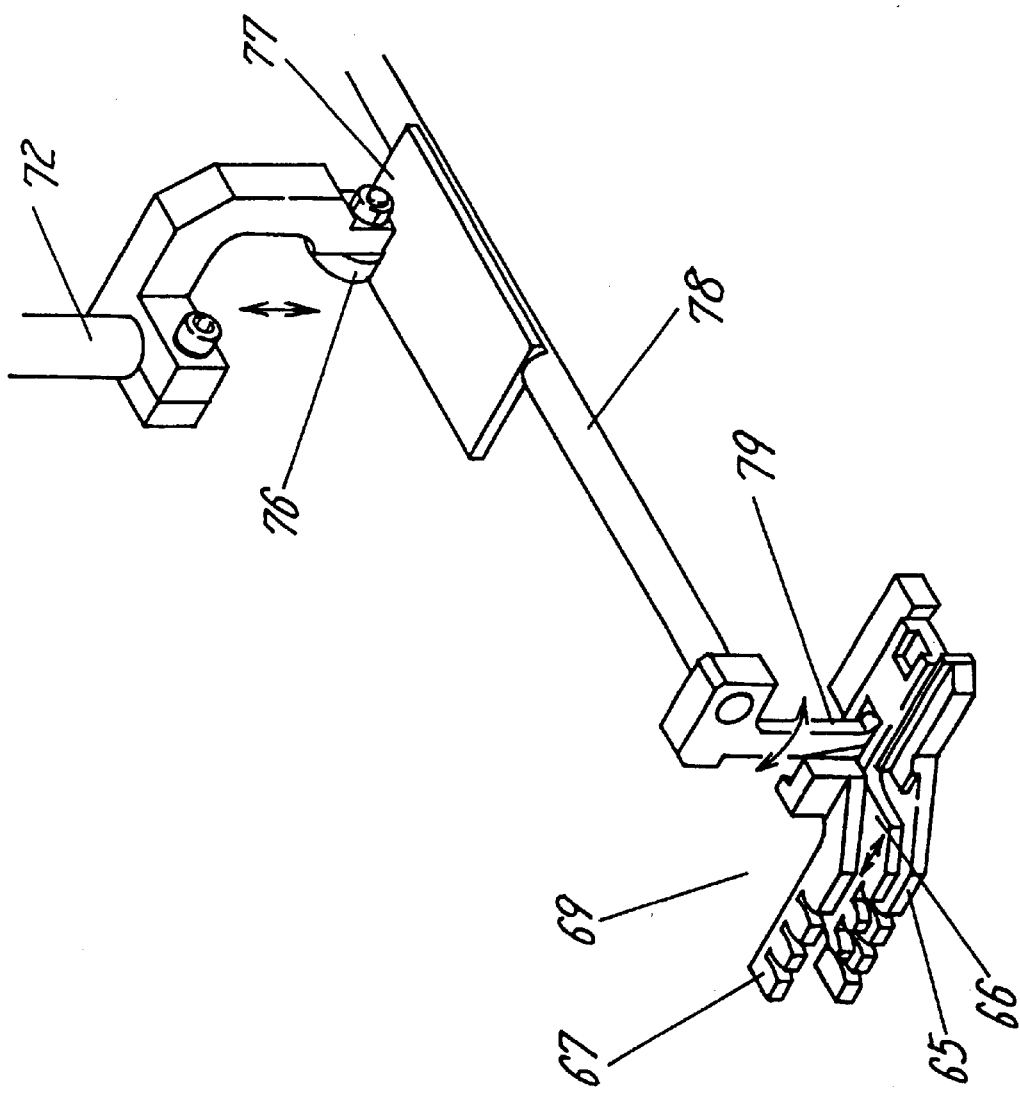
FIG. 27 is another perspective view of the same essential portion of the component transfer unit.
Figure 28:
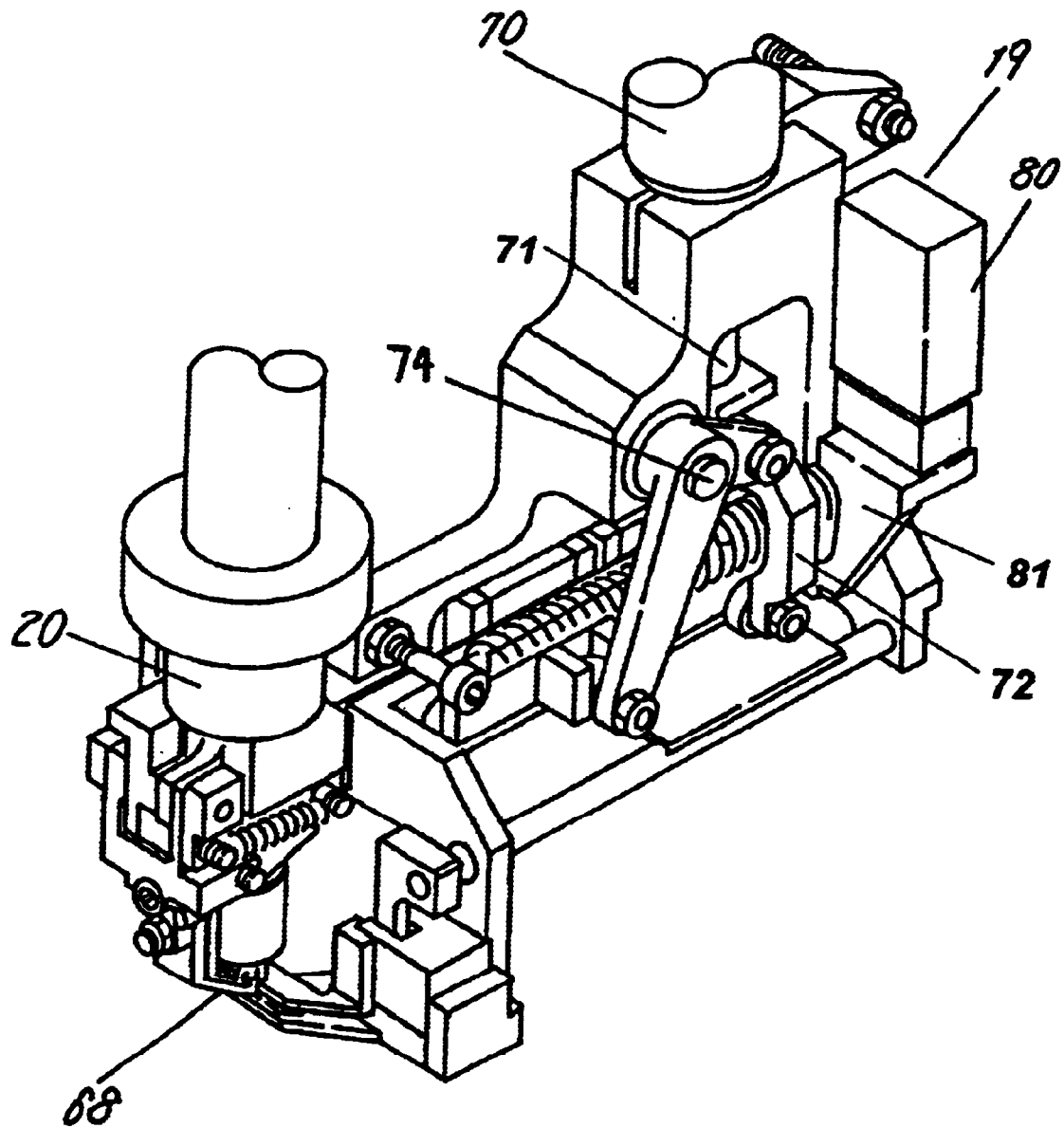
FIG. 28 is a perspective view depicting the same component transfer unit and the head portion.
Figure 29:
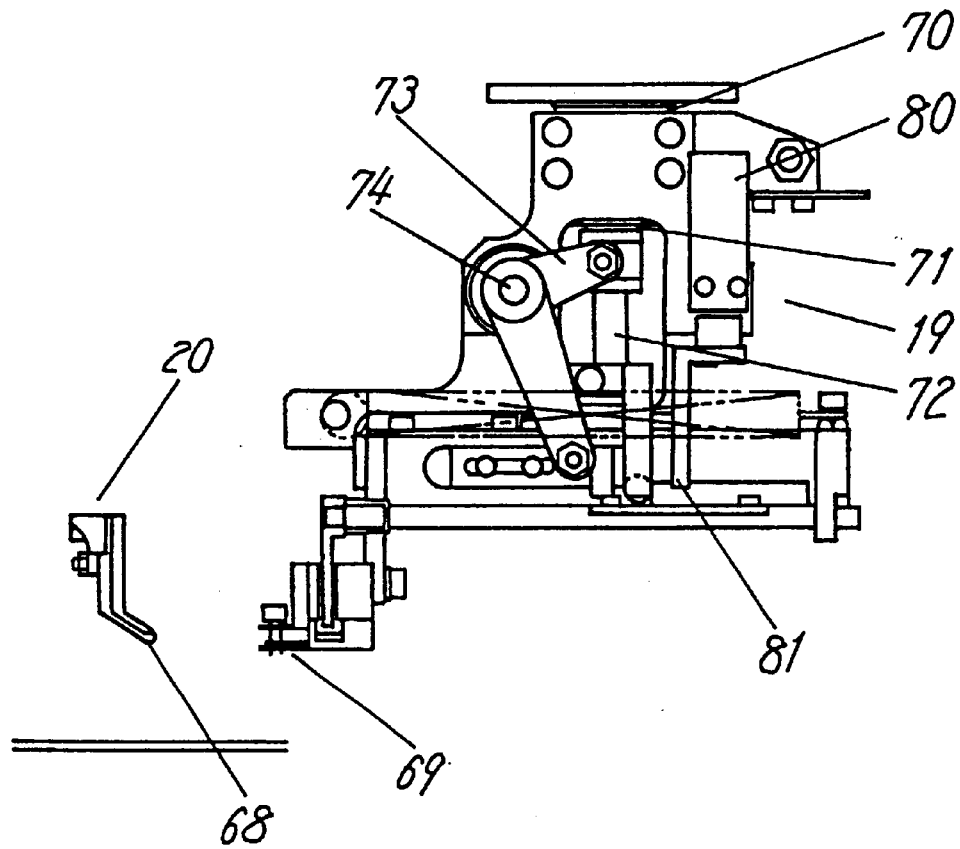
FIG. 29 is a front view depicting the same component transfer unit.
Figure 30:
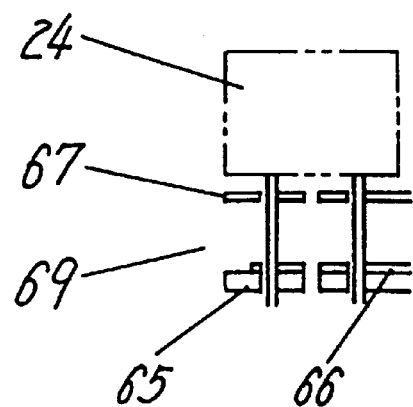
FIG. 30 is a side view depicting a transfer chuck of the same component transfer unit.
Figure 31:
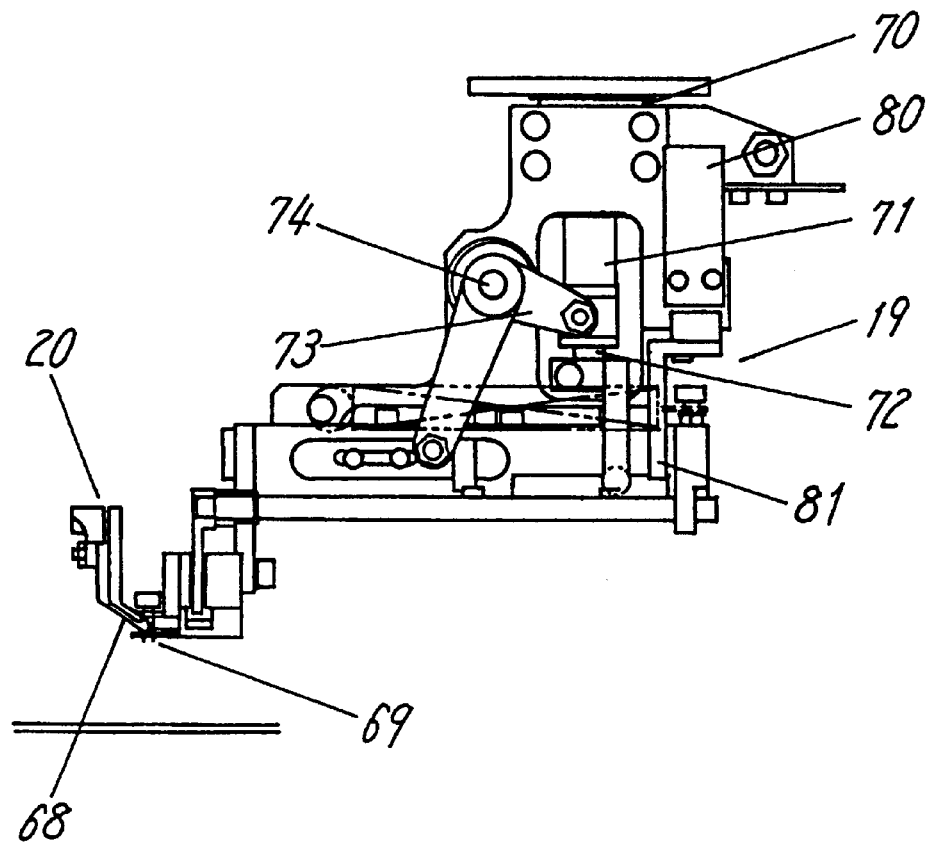
FIG. 31 is another front view of the same component transfer unit.
Figure 32:
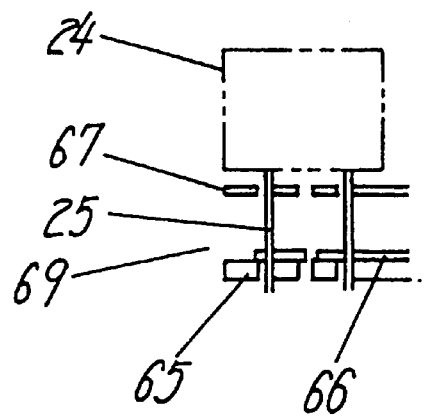
FIG. 32 is another side view of the same transfer chuck of the component transfer unit.
Figure 33:
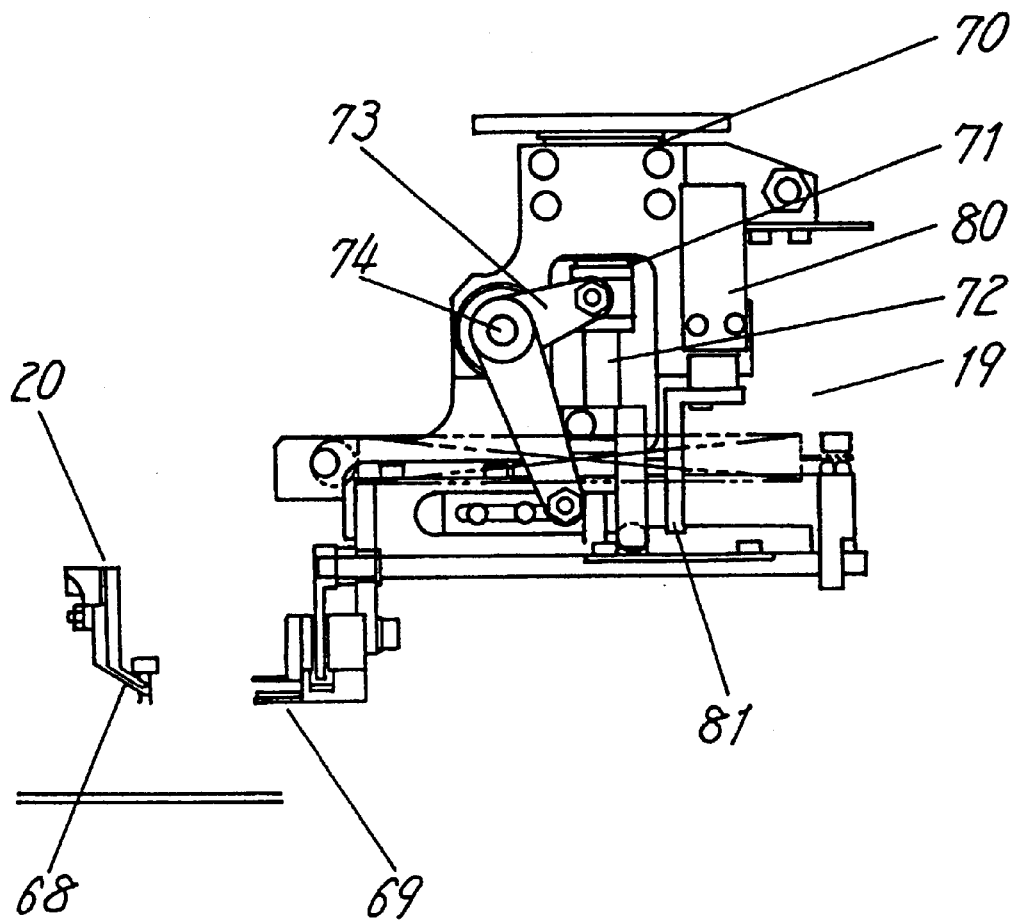
FIG. 33 is still another front view of the same component transfer unit.
Figure 34:
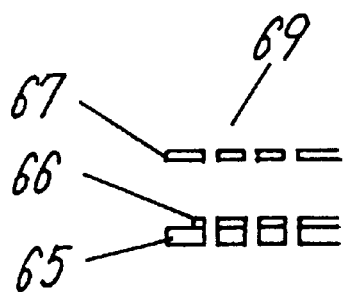
FIG. 34 is still another side view of the same transfer chuck of the component transfer unit.

FIG. 22 through FIG. 24 show sequential operation of the component transfer unit 19. FIG. 22 shows an ordinary operation ofthe component transfer unit 19. In the figure, a transfer chuck 69 first moves toward a side of the chuck 13 as indicated by arrows "A", advances further toward an element 24 held by the chuck 13 as indicated by arrows "B" while maintaining its posture, and catches the element 24 in the same posture. The transfer chuck 69 then moves toward a side of the insertion nail 68 of the head 20 as shown by arrows "C", and returns to the original position by following the arrows "A" after it hands over the element 24 to the insertion nail of the head 20. The foregoing operation as depicted in FIG. 22 takes place under the ordinary mode. During the ordinary operation shown in FIG. 22, the insertion nail 68 of the head 20 mounts the element 24 on the substrate after it receives the element 24. In case of an error in the mounting (e.g., if the insertion nail 68 fails to insert the lead terminals 25 of the element 24 into mounting holes in the substrate, and thus causes the element 24 to fall down) the failure is recovered in a manner which is shown in FIG. 23. In a state in which the element 24 has fallen down, the transfer chuck 69 has handed over another element 24 to the insertion nail 68 of the head 20. Therefore, the new element 24 must be returned again from the insertion nail 68 of the head 20 to the transfer chuck 69. Specifically, the transfer chuck 69 receives the new element 24 from the insertion nail 68, and stays standing after it moves back toward a direction of arrows "D" to a distant position away from the head 20, as shown in FIG. 23. Since the transfer chuck 69 normally opens when it leaves the insertion nail 68 of the head 20 (in the direction of arrows "A" to be specific), it needs to remain closed in order to move it while holding the element 24 in such a direction indicated by arrows "D" or arrows "G" in FIG. 23 and FIG. 24, by depressing a rotary plate 77, which will be described later, with a manipulator (vertically-moving mechanism) 81 on a driving body 80 constituting an exemplified structure of a special opening/closing mechanism. The insertion nail 68 of the head 20, which has been unloaded in the above step, is actuated manually, for instance, to hold the lead terminals 25 of the previously fallen down element 24, and to remount the element 24. Once the remounting is completed, the transfer chuck 69 is advanced along arrows "E", so that it hands over the previously withheld element 24 to the head 20, and it completes the recovery operation upon returning to the original position. The transfer chuck 69 again resumes its normal operation shown in FIG. 22, and repeats the ordinary mounting. FIG. 24 shows another operation that copes with a case in which the insertion nail 68 of the head 20 fails to mount the element 24 on the substrate, wherein the failed element 24 is not reusable. In this instance, the insertion nail 68 needs to again obtain another element 24, which is identical to the failed and non-reusable element 24 among those carried by the belt 6, and to mount the element 24. For this purpose, the transfer chuck 69 receives a succeeding element 24, which it has once handed over to the insertion nail 68 after moving toward arrows "F", and sends it back to the chuck 13 attached to the belt 6 by moving along arrows "G", followed by returning again to the position in front of the insertion nail 168 of the head 20. After the belt 6 rotates to carry away the previously described failed element 24 while maintaining the above state, the transfer chuck 69 moves through the locus shown in FIG. 22 to receive the element 24 from the chuck 13 attached to the belt 6, to pass it over to the insertion nail 68 of the head 20, and to complete the recovery operation for the mounting error. As described above, as shown in FIG. 22 through FIG. 24, the component transfer unit 19 operates in such a manner as to arcuately turn the transfer chuck 69, or to shift the transfer chuck 69 inside and outside of the arcuate locus while keeping the same posture. In order for the component transfer unit 19 to operate in the above manner, it is so constructed as depicted in FIG. 25 through FIG. 34. The component transfer unit 19 is provided with three axles 70, 71 and 72, which are coaxial with one another, as shown in FIG. 25, FIG. 28, FIG. 29, FIG. 31 and FIG. 33. The first axle 70 is provided at an outermost position of the three axles, and rotates the component transfer unit 19. The second axle 71 is provided at an inner side of the axle 70, and shifts the transfer chuck 69 toward the insertion nail 68 of the head 20, toward the chuck 13 on the belt 6, or toward an opposite side thereof. The third axle 72 is provided at an innermost side, and opens and closes the transfer chuck 69. They will be described now in more detail below. The first axle 70 at the outermost position has a horizontally extended cam attached to an upper portion of it, although not shown in FIG. 25, and a lever is also provided for driving the cam. The lever, in combination with the cam, rotates the component transfer unit 19 in the manner as depicted in FIG. 23 and FIG. 24. The second axle 71 in the middle position will be described next. The second axle 71 in the middle is rotatably linked to a shift lever 73 at a lower end portion of it, as shown in FIG. 31. The shift lever 73 is L-shaped, as shown in FIG. 29, FIG. 31 and FIG. 33, and a center portion of it is pivoted with a fourth axle 74. Accordingly, a lower end of the shift lever 73 shifts the transfer chuck 69 toward the insertion nail 68 of the head 20, as is obvious between FIG. 29 and FIG. 31, when the other end of the shift lever 73 is pushed downwardly at the lower end portion of the second axle 71 from a position shown in FIG. 29 to another position in FIG. 31. The third axle 72 located at the innermost position will be described next. As shown in FIG. 26 and FIG. 27, a lever 75 is attached at its upper end to a lower end of the third axle 72, and a roller 76 is mounted on a lower end of the lever 75. The roller 76 is positioned to be in contact with an upper surface of the rotary plate 77. The rotary plate 77 is securely fixed to the rotary axle 78, and a left end of the rotary axle 78, as depicted in FIG. 26, is connected to a lever 79 for sliding the grip nail 66, which composes the transfer chuck 69. In other words, only the grip nail 66 is made to slide with respect to the grip nail 65 and the support nail 67, among the three nails 65, 66 and 67 composing the transfer chuck 69, and this is accomplished by the lever 79. A rotary movement of the lever 79 thus slides the grip nail 66, so as to hold or release the lead terminals 25 of the element 24, as has been described. The transfer chuck 69 needs to be operated, i.e. opened and closed, at each of its shifted positions inside and outside of the rotational arc of the transfer chuck 69 as shown in FIG. 22 through FIG. 24. Although the opening and closing operation is made by the axle 72 provided at the innermost position, the roller 76 attached to the lower end of the axle 72 must be capable of pushing down the rotary plate 77 at any shifted positions, both inside and outside of the rotational arc of the transfer chuck 69, in order to open and close the transfer chuck 69 by a vertical movement alone of the axle 72. Conversely, the rotary plate 77 is made into a board-like shape in line with the rotary axle 78, as shown in FIG. 26 and FIG. 27, in order for the roller 76 to rotate the rotary axle 78 via the rotary plate 77. The transfer chuck 69 can thus open and close only with a vertical movement of the axle 72, by providing the board-shaped rotary plate 77.

The foregoing structure can downsize, simplify, and improve an operational reliability of an assembly for turning shifting, and opening or closing the transfer chuck 69, by providing a coaxial arrangement of the first axle 70 defining a turning means for rotating the transfer chuck 69, the second axle 71 defining a shifting means for shifting the transfer chuck 69 inside and outside of the rotational arc of the transfer chuck 69, and the third axle 72 defining an opening/closing means for opening or closing the transfer chuck 69 after it is shifted by the shifting means.

Figure 35:
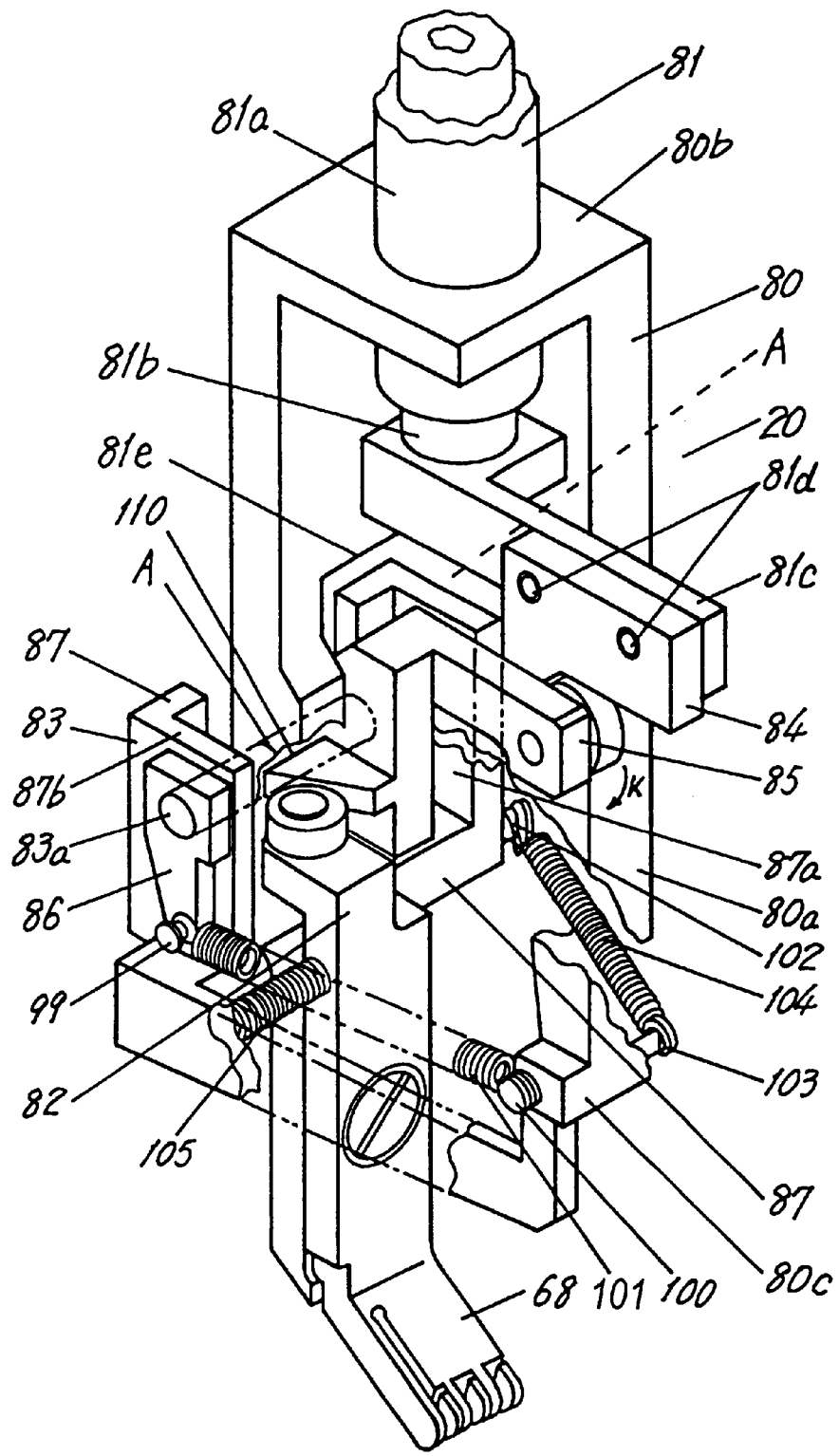
FIG. 35 is a perspective view depicting a head.

FIG. 35 depicts the head 20. The head 20 comprises a main head body 80 having a side wall 80a resembling the letter L in cross section and a top wall 80b, a vertically-moving mechanism (manipulator) 81 for the main head body 80, an insertion nail 68 provided under the main head body 80, an opening/closing mechanism 82 for opening the insertion nail 68, and a turning mechanism 83 for moving the insertion nail 68 in a forward-to-backward direction. A cam plate 84, which constitutes a part of the turning mechanism 83, is detachably mounted on the main head body 80, as will be described later. The vertically-moving mechanism (manipulator) 81 comprises an external axle 81a fixed to the top wall 80b of the main head body 80, and an internal axle 81b arranged in the external axle 81a. The cam plate 84 is detachably mounted with a screw 81d on a mount plate 81c attached to a lower end of the internal axle 81b disposed in the external axle 81a.

Figure 36:
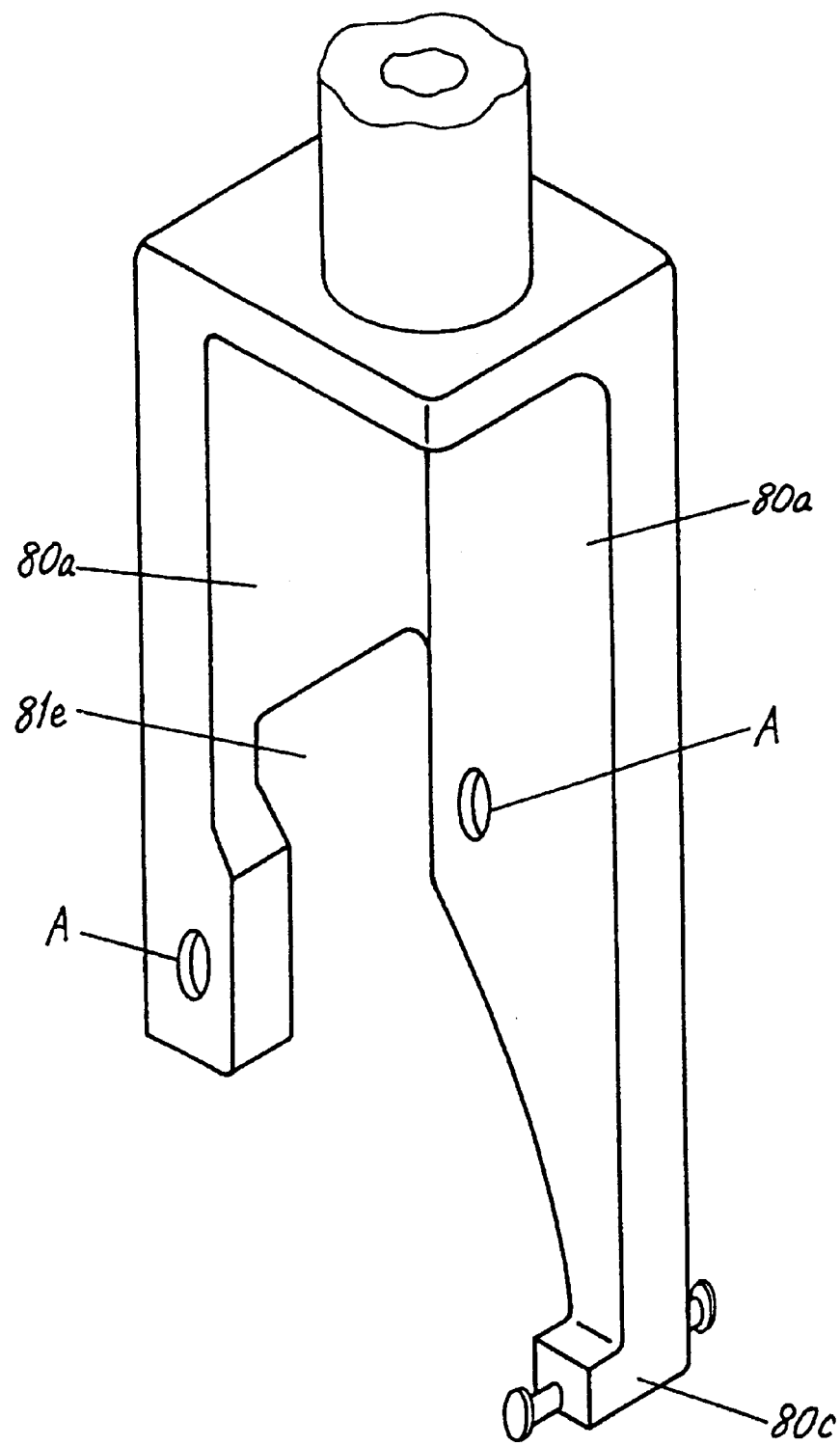
FIG. 36 is a perspective view depicting a main head body of the same head.

The turning means 83 has the following structure. As shown in FIG. 35 and FIG. 36, the turning mechanism 83 has a rotary axle 83a supported axially in through holes "A" provided at two locations in the sidewall 80a of the main head body 80. An opening/closing lever 85, which represents an example of a driving lever shown in FIG. 38, and a spring lever 86 shown in FIG. 35 are integrally fixed to the rotary axle 83a on its right side and left side respectively as viewed in FIG. 35. Furthermore, a U-shaped rotary body 87 is provided behind the opening/closing lever 85.

A right side wall 87a of the rotary body 87 passes through an opening 81e in the side wall 80a of the main head body 80, and protrudes at a side of the main head body 80, as shown in FIG. 35. Also, a left sidewall 87b of the rotary body 87 protrudes forwardly at the outside of the main head body 80. The right sidewall 87a and the left sidewall 87b are rotatably supported in this posture by the rotary axle 83a disposed in through holes "B".

Figure 37:
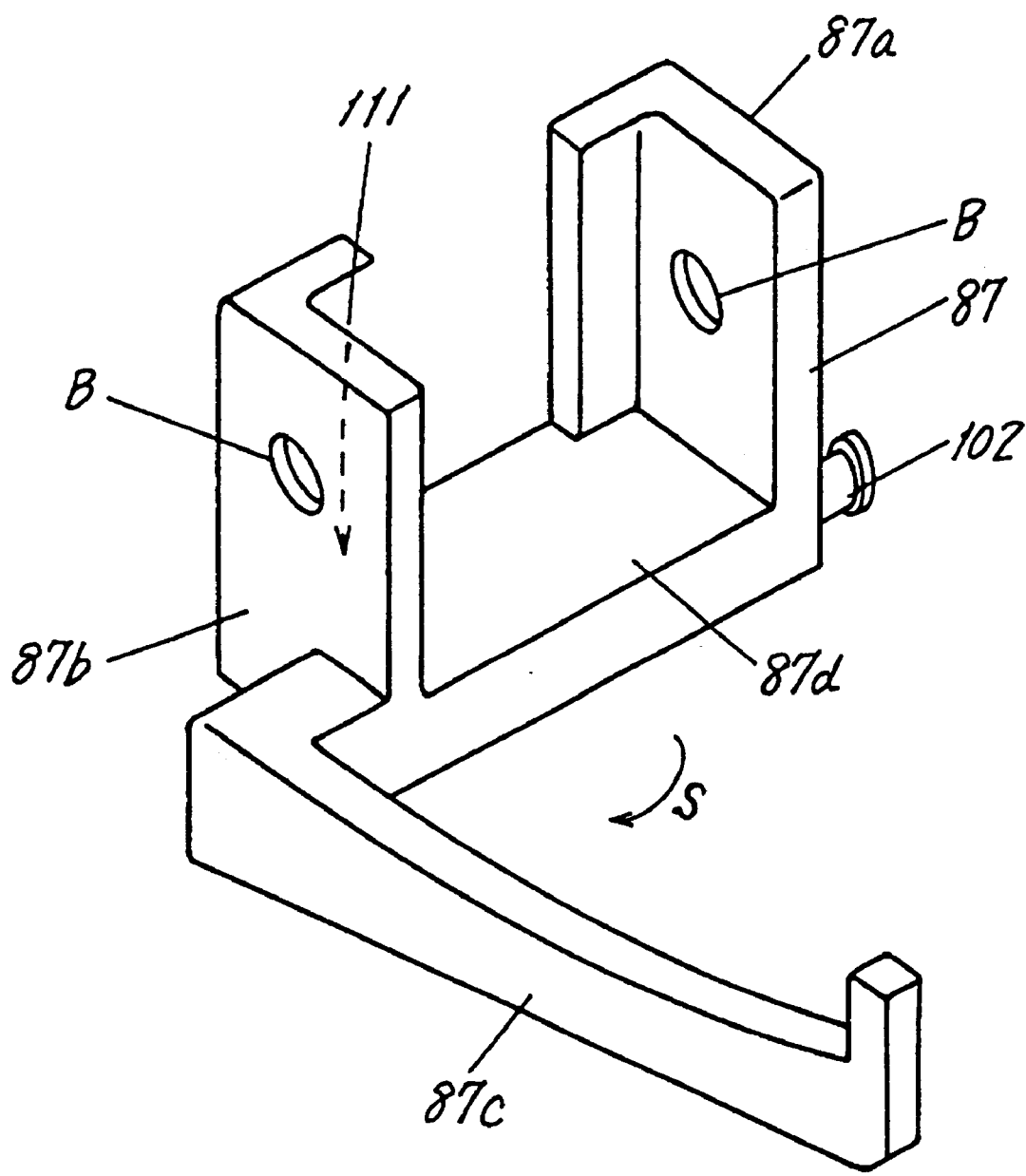
FIG. 37 is a perspective view depicting a rotary body of the same head.

The rotary body 87 is provided with a lever 87c extending forwardly from an outer surface of the sidewall 87b, as shown in FIG. 37. A front end of the lever 87c stays in contact with a butt section 80c at a lower end of the main head body 80, so as to prevent a further movement of the rotary body 87 beyond that shown in FIG. 35.

Figure 38:
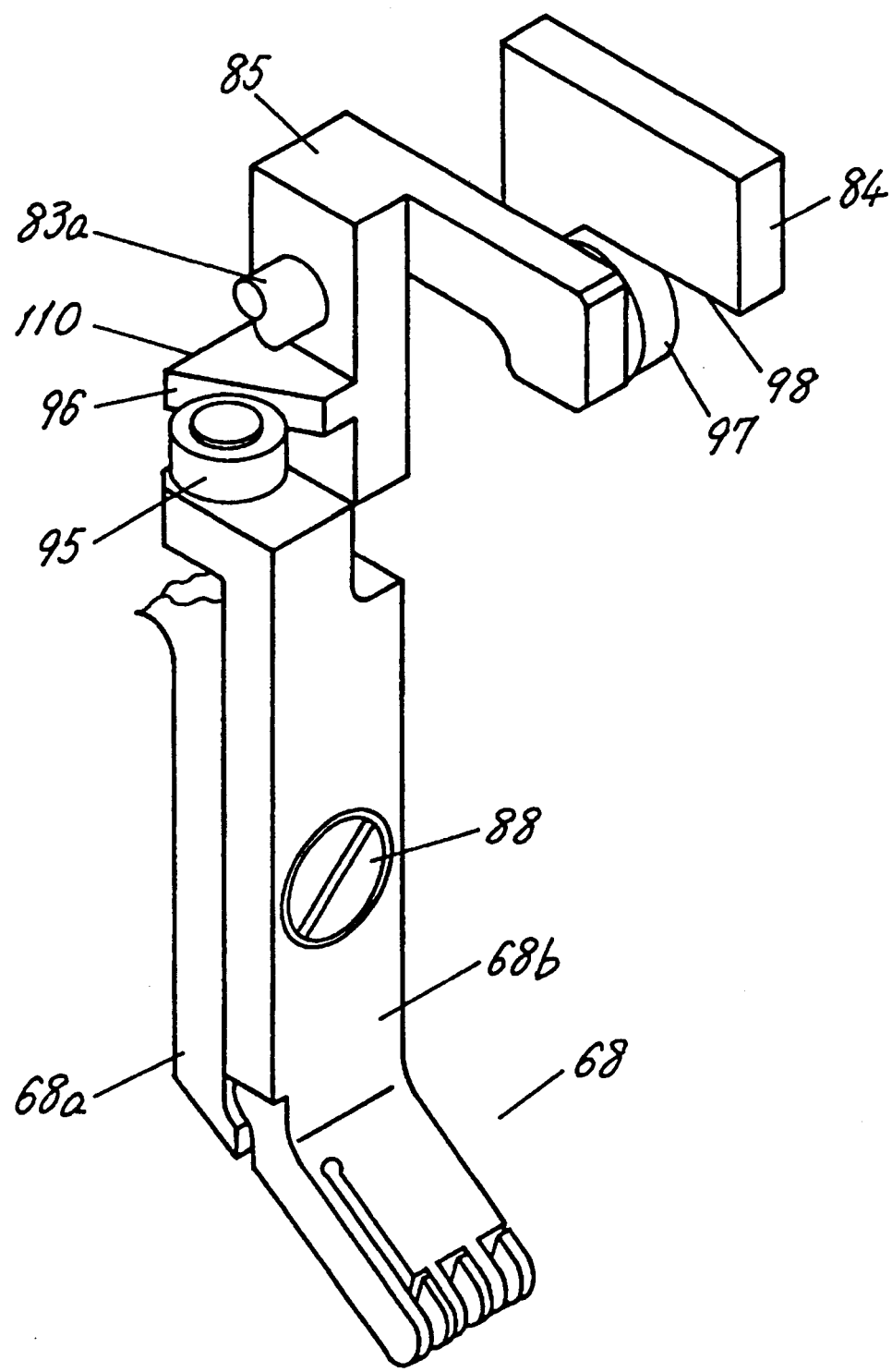
FIG. 38 is a perspective view depicting an insertion nail of the same head.

An upper end of the first insertion nail 68a is fixed to a bottom wall 87d of the rotary body 87, as shown in FIG. 35 and FIG. 38, with a fastener although not shown in the figures.

The first insertion nail 68a and the second insertion nail 68b are engaged together, and the second insertion nail 68b is pivotally supported at its center to a center of the first insertion nail 68a with a pin 88. The above engagement of the first and the second insertion nails 68a and 68b can attain a reduction in size, facilitate a precise positional alignment between the first and the second insertion nails 68a and 68b, and thereby improving reliability of the operation.

Figure 39:
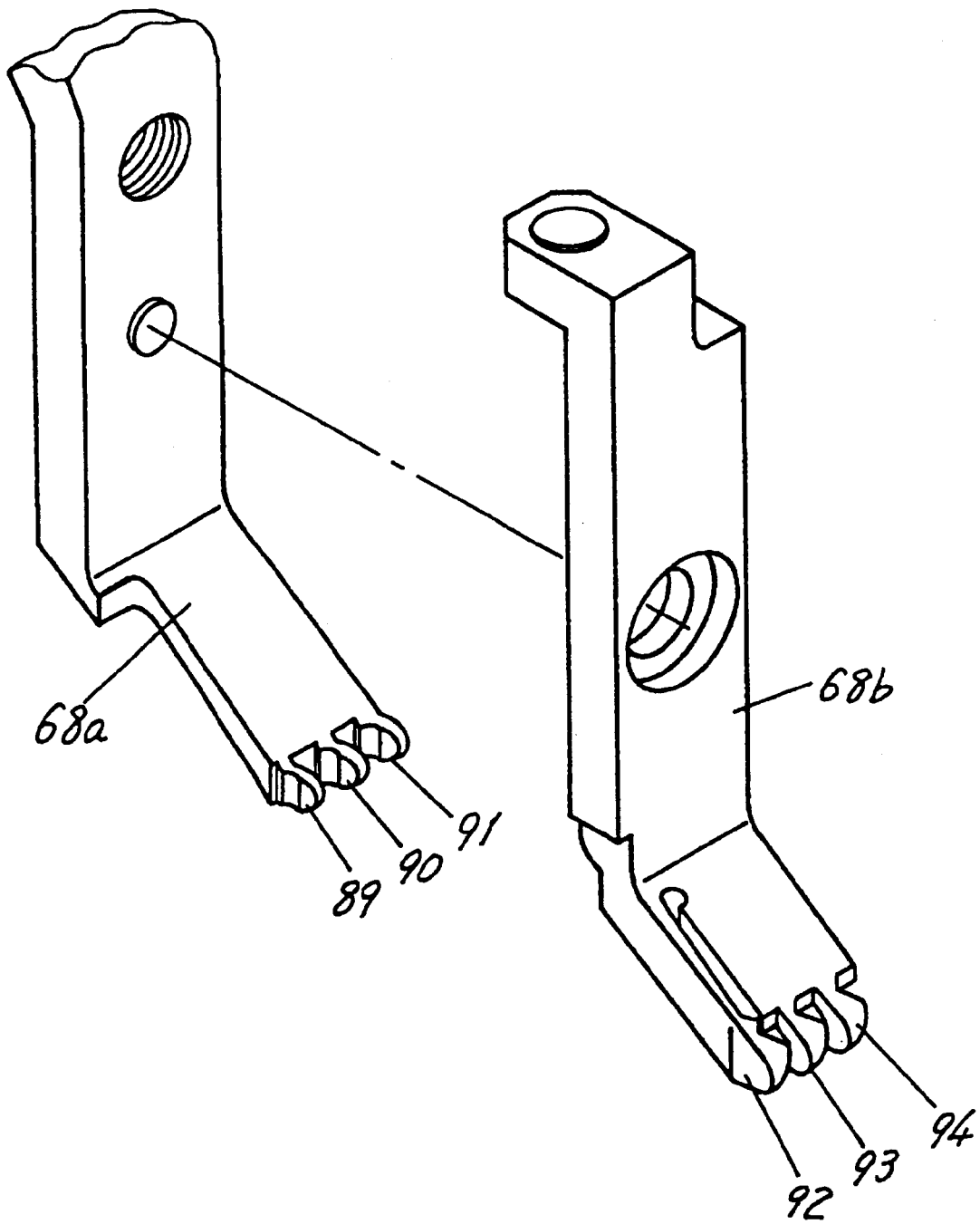
FIG. 39 is an exploded perspective view of the same insertion nail.
Figure 40:
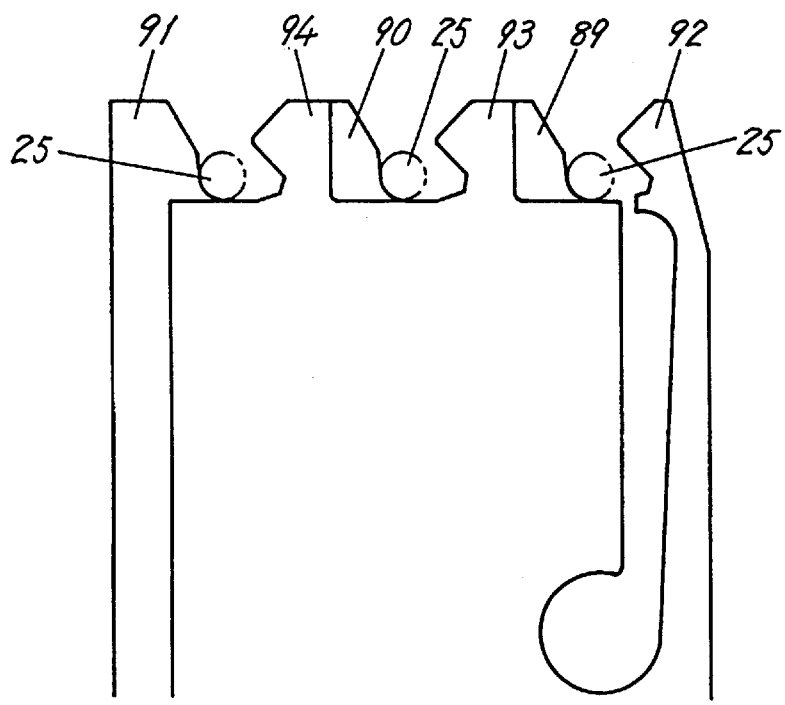
FIG. 40 is a plan view depicting the same insertion nail.
Figure 41:
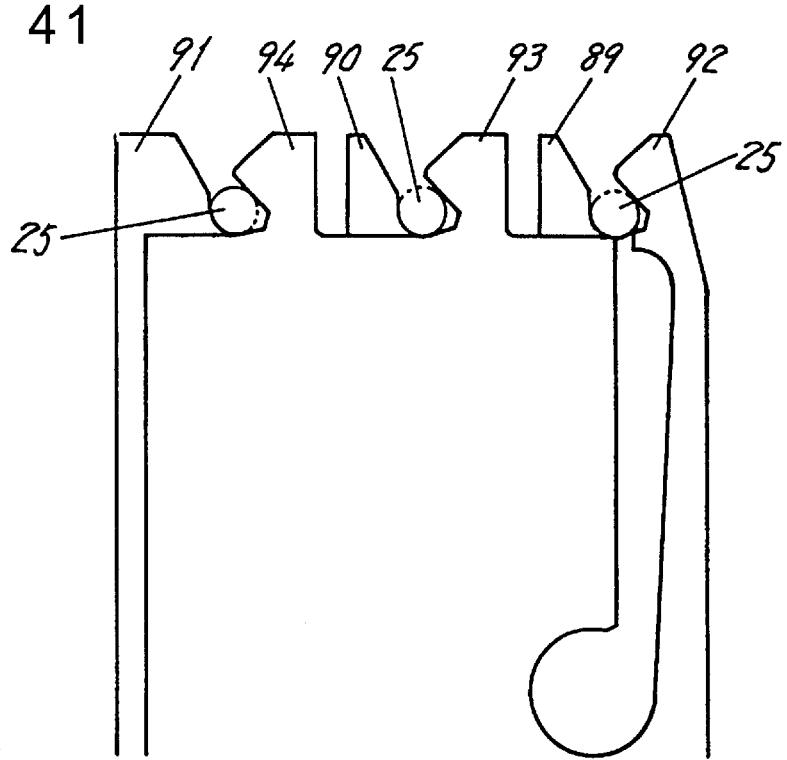
FIG. 41 is another plan view depicting the same insertion nail.

The first and the second insertion nails 68a and 68b are provided with three grip nails 89 through 91 and 92 through 94 at each of their tip ends, for a total of six nails, as shown in FIG. 39. Even if components have three lead terminals 25, these grip nails 89 through 94 are able to hold all of the lead terminals 25 reliably, as shown in FIG. 40 and FIG. 41. Because these lead terminals 25 are held individually between the grip nails 89 through 91 and 92 through 94 of the first and the second insertion nails 68a and 68b, intervening spaces between the lead terminals 25 are not altered, thereby resulting in a smooth mounting of the component.

Figure 52:
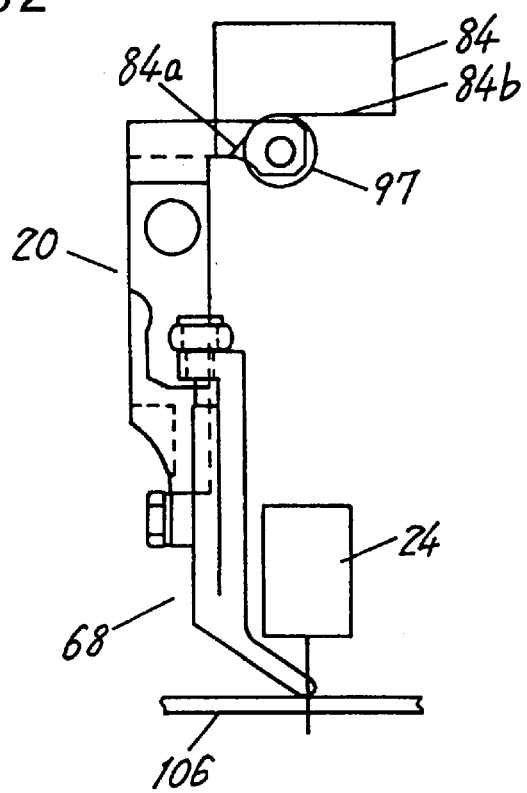
FIG. 52 is a front view depicting a state of insertion by the same head.
Figure 59:
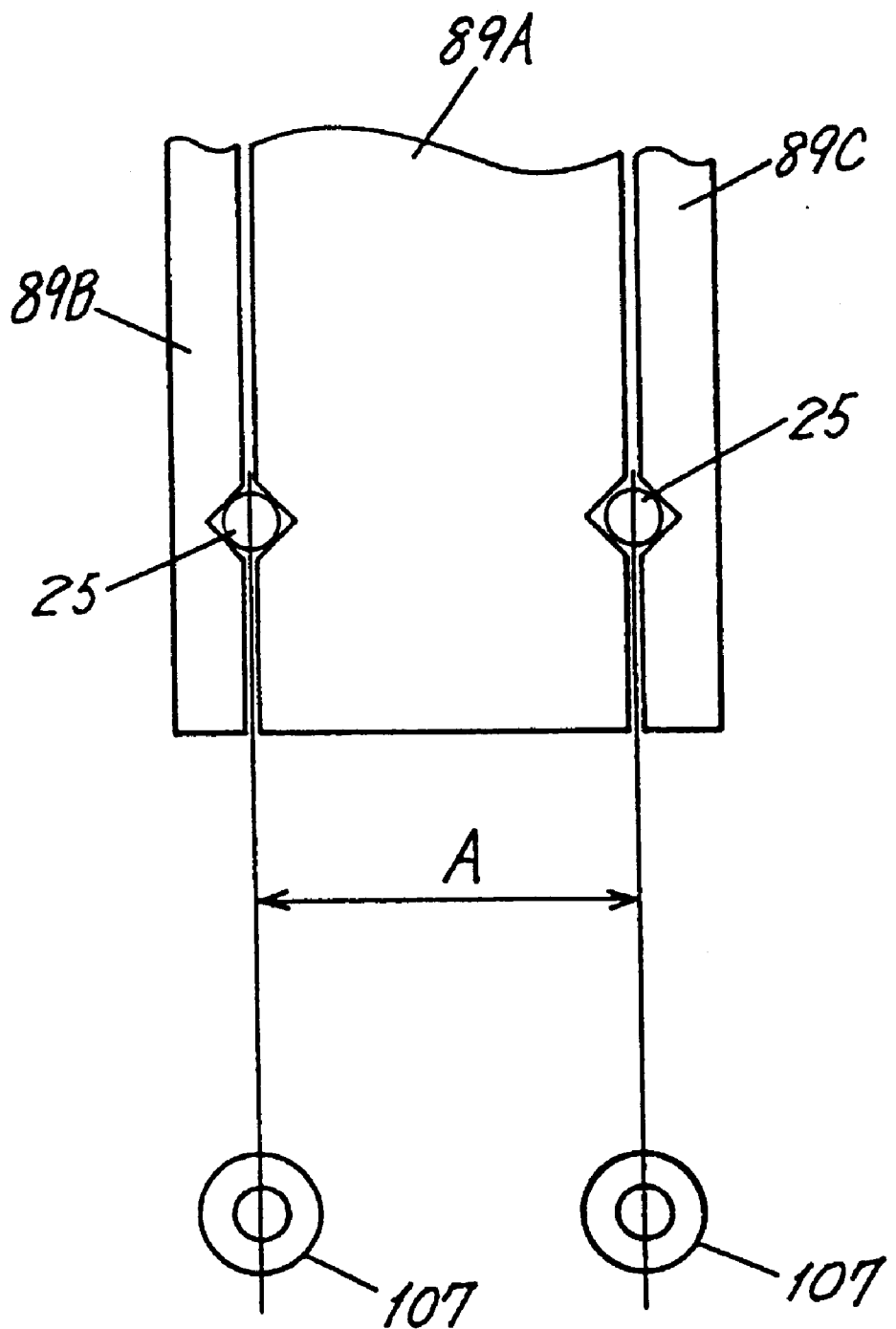
FIG. 59 is a plan view depicting an example of comparing insertion nails.
Figure 60:
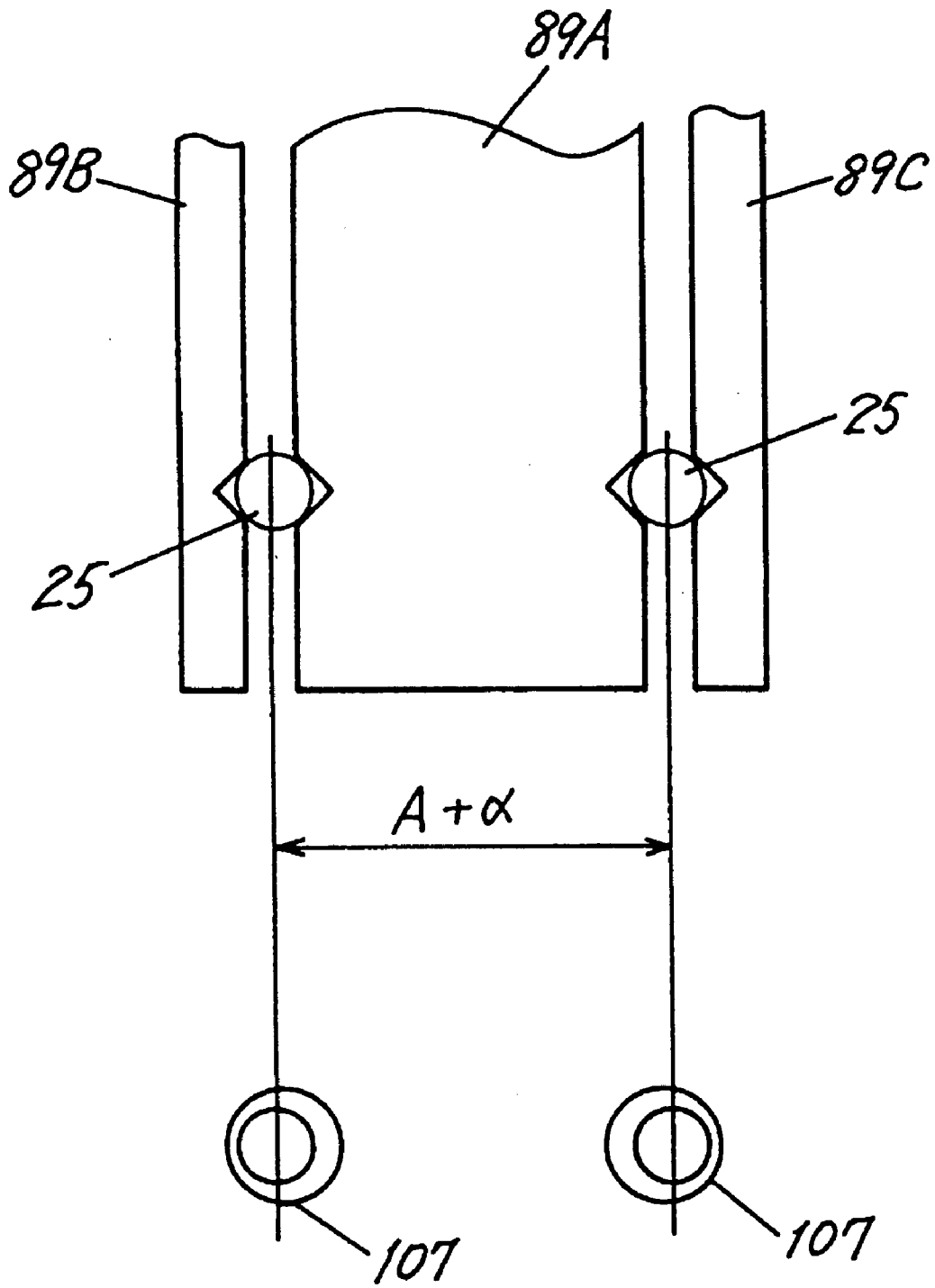
FIG. 60 is a plan view depicting another example of comparing insertion nails.
Figure 61:
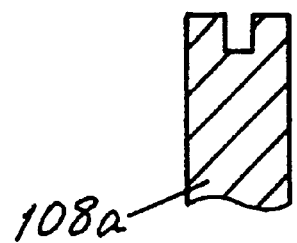
FIG. 61 is a sectional view depicting one example of a catch pin.
Figure 62:
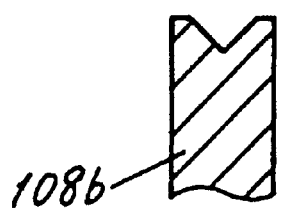
FIG. 62 is a sectional view depicting another example of a catch pin.
Figure 63:
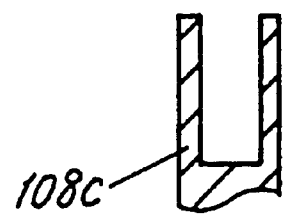
FIG. 63 is a sectional view depicting still another example of a catch pin.
Figure 64:
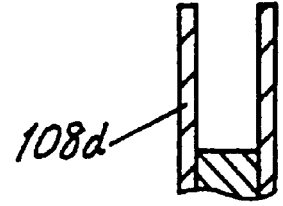
FIG. 64 is a sectional view depicting yet another example of a catch pin.

On the contrary, in the case of another structure, which holds the lead terminals 25 at two sides of an insertion nail 89A with each of other insertion nails 89B and 89C, as shown in FIG. 59 and FIG. 60, an intervening space between the lead terminals 25 varies between "A" and "A+α" depending on the thickness of the lead terminals 25. This can result in the lead terminals 25 being eccentric with respect to via holes 107 in a substrate 106, so as to carry a risk of mounting failures. As best shown in FIGS. 35 and 38, the insertion nail 68 and cam plate 84 are arranged so that the vertical distance between an uppermost portion of the insertion nail 68 and a lowermost portion of the cam plate 84 is less than the height of the cam plate 84. Although not drawn to scale in order to clearly illustrate other features of the invention, FIG. 52 shows the height H of the cam plate 84 and the vertical distance d between the uppermost portion of the insertion nail 68 and lowermost portion of cam plate 84.

Reference is made again to FIG. 39 through FIG. 41 for the following description. The grip nail 92 at one side of the second insertion nail 68b is so constructed that it has a narrower intervening space and larger flexibility than either the grip nail 94 at the other side and the grip nail 93 in the middle. By providing the second grip nail 68b with the grip nail 92 having the narrower intervening space than the other grip nails 93 and 94, the second grip nail 68b is able to hold a component securely with the flexible grip nail 92, even if terminals of the component are deviated in diameter. In other words, the second grip nail 68b provided with the grip nail 92 having narrower intervening space and more flexibility is now able to make effective use of this flexible grip nail 92 also to hold the lead terminals 25, whereas only one pair of the grip nails of the first and the second insertion nails 68a and 68b would otherwise hold the lead terminals 25, in the case of a component having a terminal of larger diameter.

The cam follower 95 is provided rotatably on a top end of the second insertion nail 68b, as shown in FIG. 38. This cam follower 95 stays in contact with the cam surface 96 at a left end of the opening/closing lever 85. In addition, the cam follower 97 at a right end of the opening/closing lever 85 stays in contact with a cam surface 98 of the cam plate 84 as shown in FIG. 38. In the above structure, a spring 101 and a spring 104 are placed to provide spring tensions between a pin 99 of the spring lever 86 and a pin 100 on the butt section 80c of the main head body 80, and between a pin 102 of the rotary body 87 and a pin 103 on the butt section respectively as shown in FIG. 35. Also, the spring 105 is placed between the lever 87c and an upper portion of the second insertion nail 68b to provide a repulsive (pushing) force.

Figure 42:
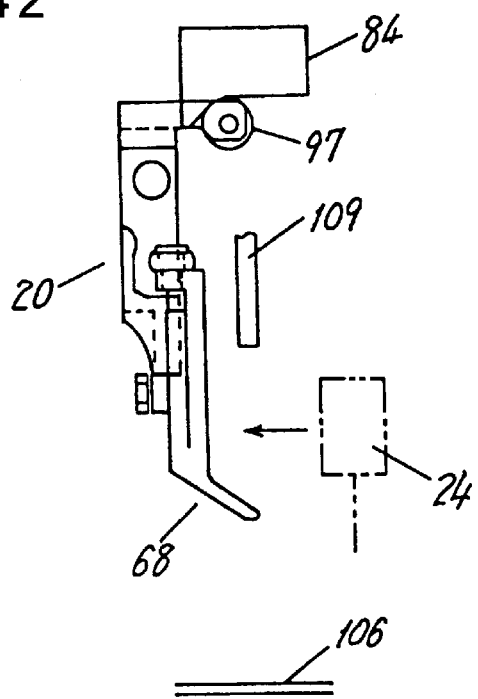
FIG. 42 is a front view depicting an operation of the same head.

These components operate in a manner as described below. First, the transfer chuck 69 of the component transfer unit 19 hands over an element 24 to the insertion nail 68 at an upper position, as shown in FIG. 42. At this moment, the first and the second insertion nails 68a and 68b need to be opened as shown in FIG. 40. In order to accomplish this, the internal axle 81b of the vertically moving mechanism 81 is depressed downwardly, which in turn depresses the opening/closing lever 85 via the cam plate 84. Subsequently, the cam surface 96 of the opening/closing lever 85 shifts backward, and the cam follower 95 on the upper end of the second insertion nail 68b moves to a front side of the cam surface 96. This allows the repulsive force of the spring 105 to push the upper portion of the second insertion nail 68b toward the right side in FIG. 35 and FIG. 38. As a result, the first and the second insertion nails 68a and 68b open as shown in FIG. 40, and the element 24 is transferred from the transfer chuck 69.

Figure 43:
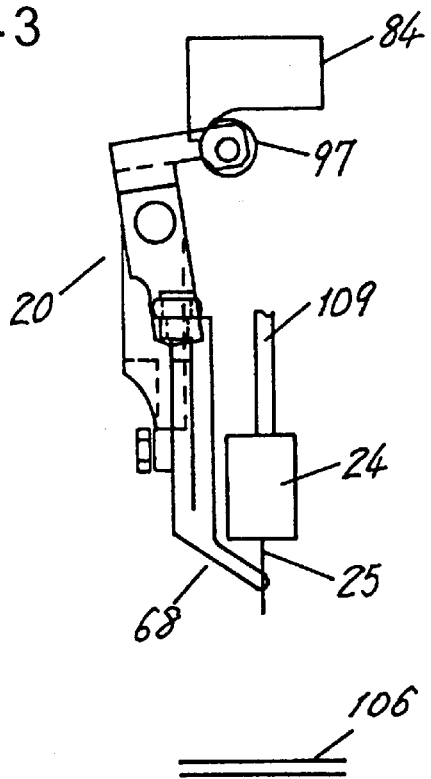
FIG. 43 is another front view depicting an operation of the same head.
Figure 44:
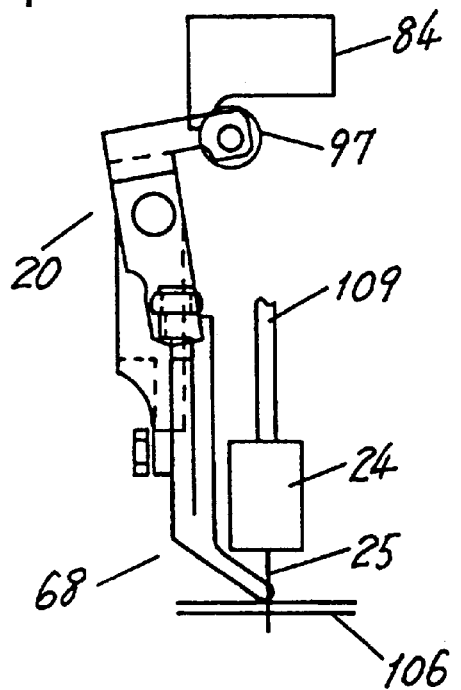
FIG. 44 is another front view depicting an operation of the same head.
Figure 49:
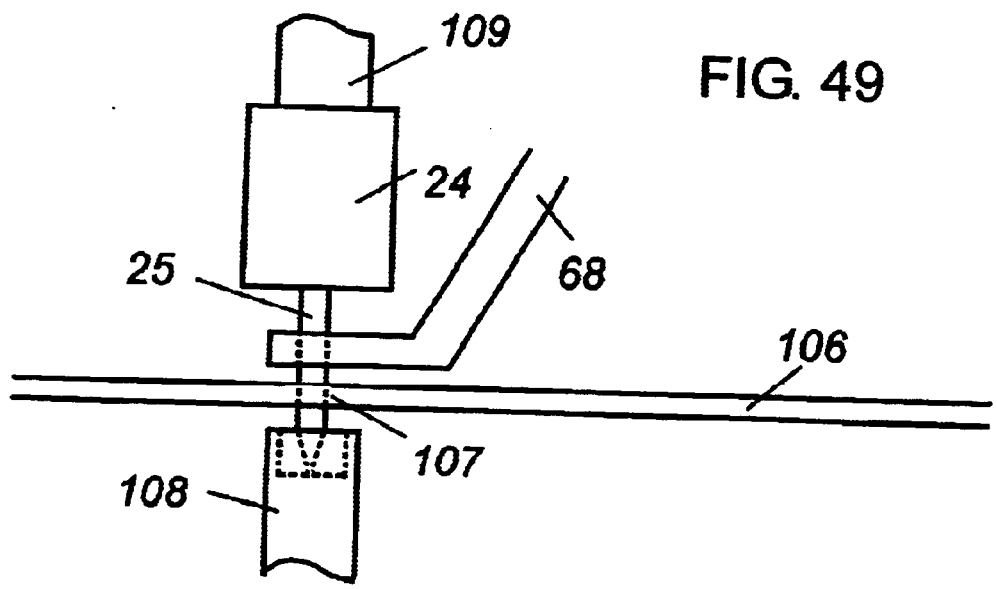
FIG. 49 is a sectional view depicting a state of insertion by the head.

Next, the internal axle 81b rises in order to close the first and the second insertion nails 68a and 68b. The lead terminals 25 are held among the grip nails 89 through 94, as shown in FIG. 41, and the element 24 is thus held up as shown in FIG. 43. The external axle 81a and the internal axle 81b are operable to move downward (simultaneously), so as to lower the main head body 80 toward a substrate 106, as shown in FIG. 44, thereby inserting the lead terminals 25 into via holes 107 in the substrate 106 as illustrated in FIG. 49. During this movement, a catch pin 108 rises up in its position underneath the substrate 106, and waits for the lead terminals 25 to come down. When the lead terminals 25 are inserted into the via holes 107, a pusher 109 disposed coaxially in the internal axle 81b is lowered so as to contact a top of the element 24, so that the element 24 is caught at the top and bottom ends between the pusher 109 and the catch pin 108.

Figure 45:
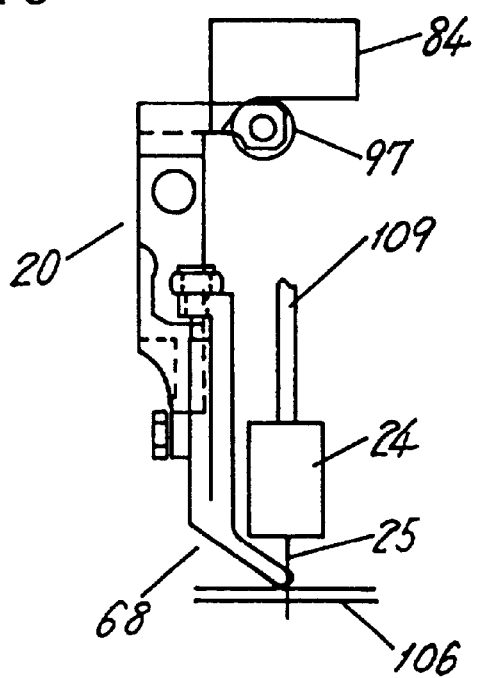
FIG. 45 is another front view depicting an operation of the same head.
Figure 46:
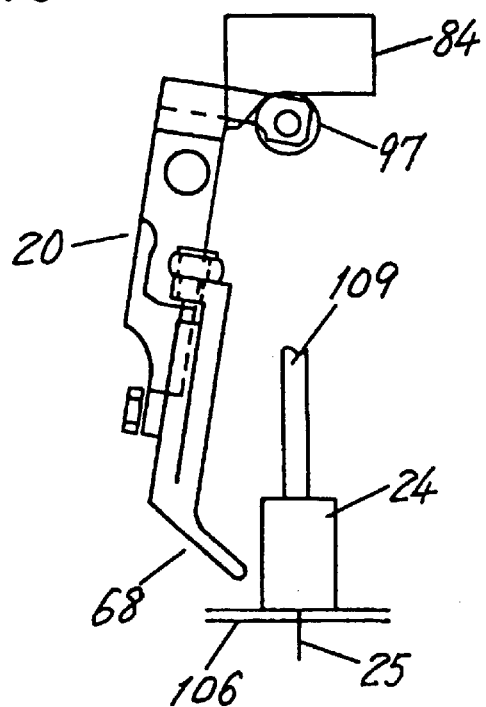
FIG. 46 is another front view depicting an operation of the same head.
Figure 47:
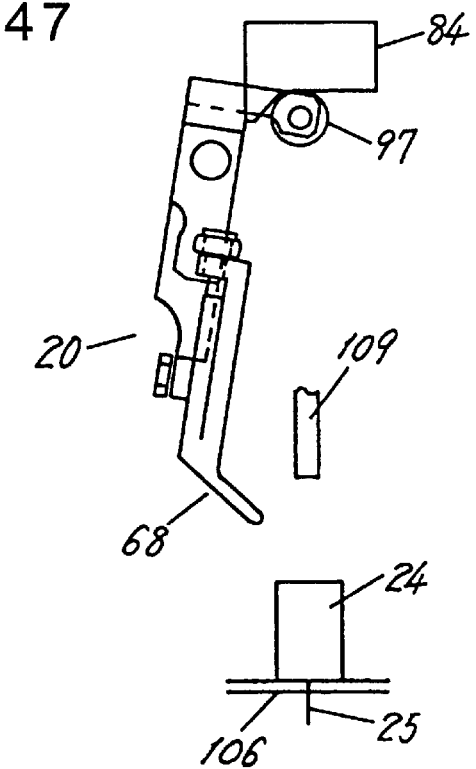
FIG. 47 is still another front view depicting an operation of the same head.
Figure 48:
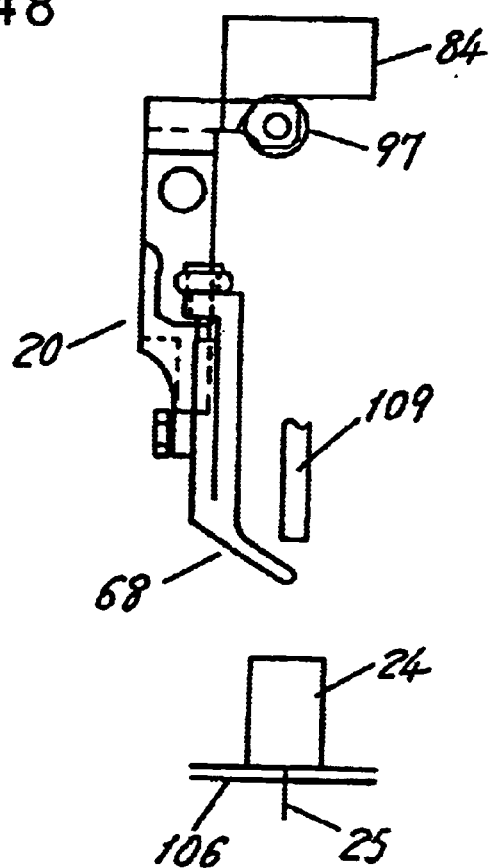
FIG. 48 is yet another front view depicting an operation of the same head.
Figure 50:
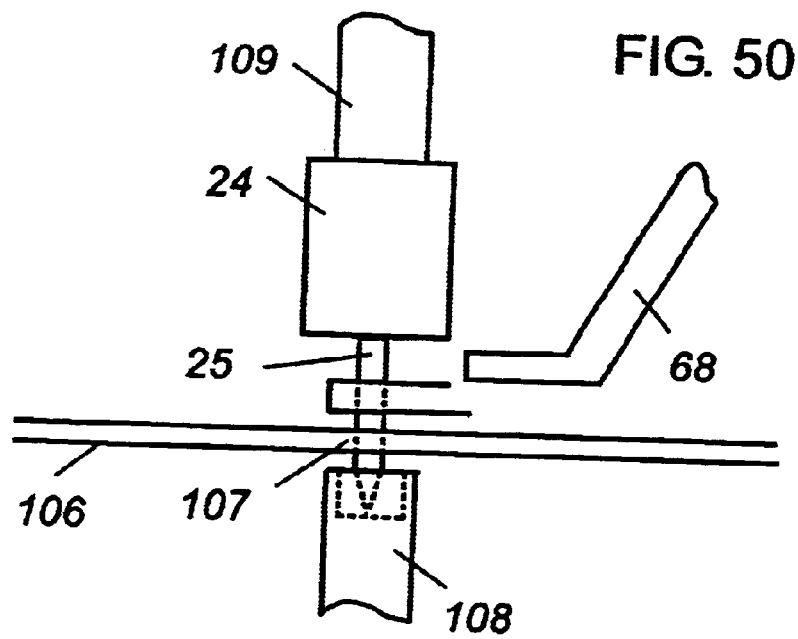
FIG. 50 is a sectional view depicting another state of insertion by the same head.
Figure 51:
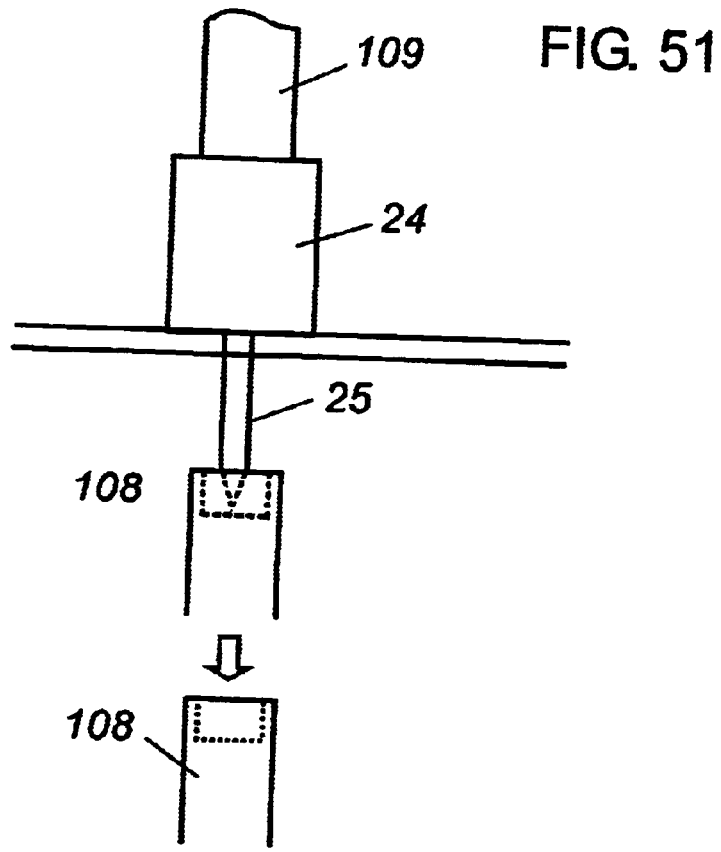
FIG. 51 is a sectional view depicting another state of insertion by the same head.

FIG. 45 depicts the first and the second insertion nails 68a and 68b in their open position as shown in FIG. 40 as the internal axle 81b is depressed. However, the element 24 does not fall down even after it is released from the first and the second insertion nails 68a and 68b, since the element 24 is held now at the top and bottom ends of it by the pusher 109 and the catch pin 108, as depicted in FIG. 49. With the element 24 in this posture, the insertion nail 68 retracts away from the element 24, as shown in FIG. 50. When the insertion nail 68 completes the retraction, the pusher 109 and the catch pin 108 start moving down until a bottom end of the element 24 finally touches an upper surface of the substrate 106 as shown in FIG. 46 and FIG. 51. The catch pin 108 moves further down, as shown in FIG. 51, while the top surface of the element 24 is kept pushed by the pusher 109. Mounting of the element 24 is completed thereafter, when the anvil mechanism 23, although not shown in the figures, cuts and clinches the lower ends of the lead terminals 25. During this operation, the insertion nail 68 moves up while shifting backward as shown in FIG. 46 through FIG. 48.

The insertion nail 68 shifts backward in the following manner. The internal axle 81b stays at its lower position with respect to the external axle 81a, in order to keep the first and the second insertion nails 68a and 68b open. While keeping the internal axle 81b at the depressed position, only the external axle 81a is lifted. This movement also provides the opening/closing lever 85 with a lifting force, since the opening/closing lever 85 is attached to the external axle 81a together with the main head body 80. However, because the cam plate 84 fixed to the internal axle 81b remains at its lower position, the opening/closing lever 85 turns downwardly as shown by arrow "K" in FIG. 35. A rear edge 110 in the back side of the cam surface 96 eventually comes in contact with a butt surface 111 inside the side wall 87b of the rotary body 87 below the through hole "B", and it turns the rotary body 87 backward in a direction shown by arrow "S" in FIG. 37. As the rotary body 87 is provided with the insertion nail 68, as described above, the insertion nail 68 moves upwardly while turning backward in a manner to avoid the mounted element 24, as shown in FIG. 46 and FIG. 47. In the, step of FIG. 47, the internal axle 81b starts moving upward, and the insertion nail 68 also moves radually into its original posture as shown in FIG. 48. The pusher 109, which is coaxial with the internal axle 81b, also starts moving upward at the moment shown in FIG. 47.

One of the distinctive features of this exemplary embodiment is that the cam plate 84 is easily removable from the mount plate 81c and replaceable by removing a screw 81d. Thus, the cam plate 84 can be easily replaced with alternate cam plates, so as to change the path of movement of cam follower 97 and, thus insertion nail 68, as described further below.

Figure 53:
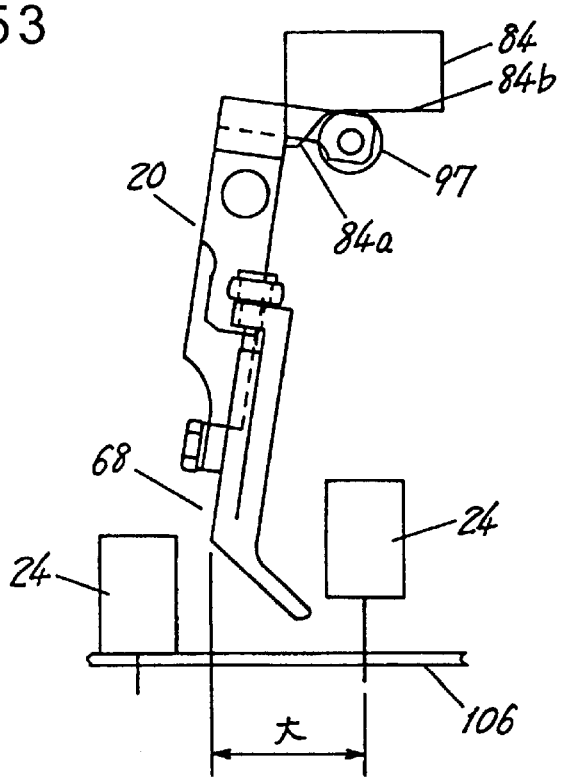
FIG. 53 is a front view depicting another state of insertion by the same head.
Figure 54:
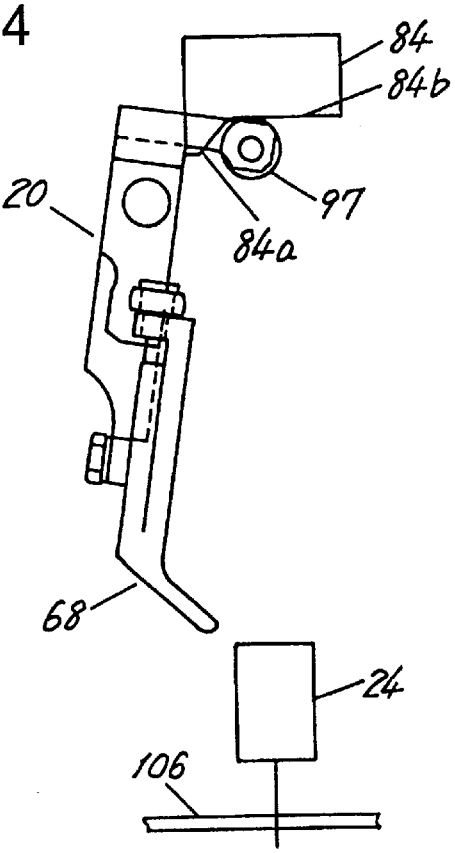
FIG. 54 is a front view depicting another state of insertion by the same head.
Figure 55:
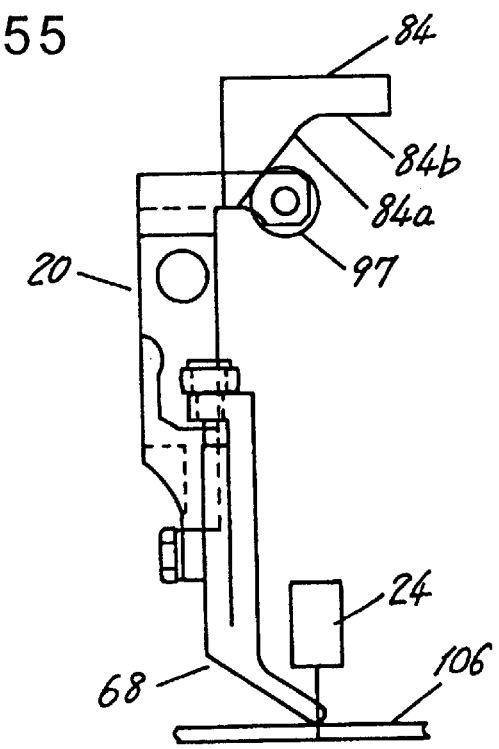
FIG. 55 is a front view depicting another state of insertion by the same head.
Figure 56:
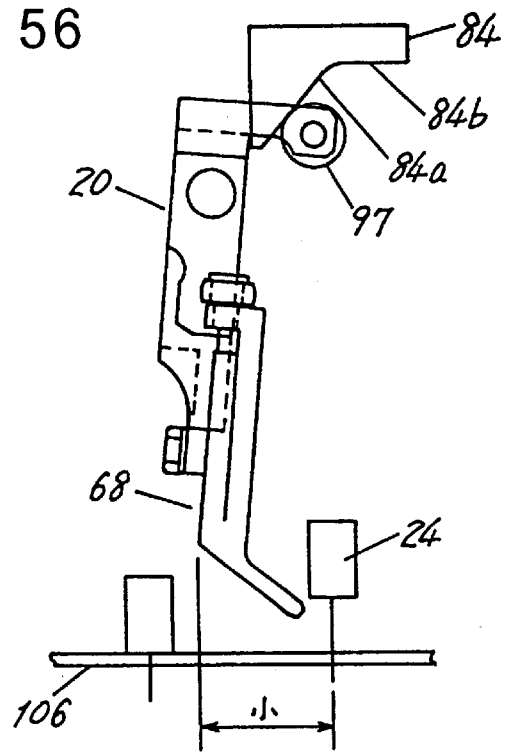
FIG. 56 is a front view depicting still another state of insertion by the same head.
Figure 57:
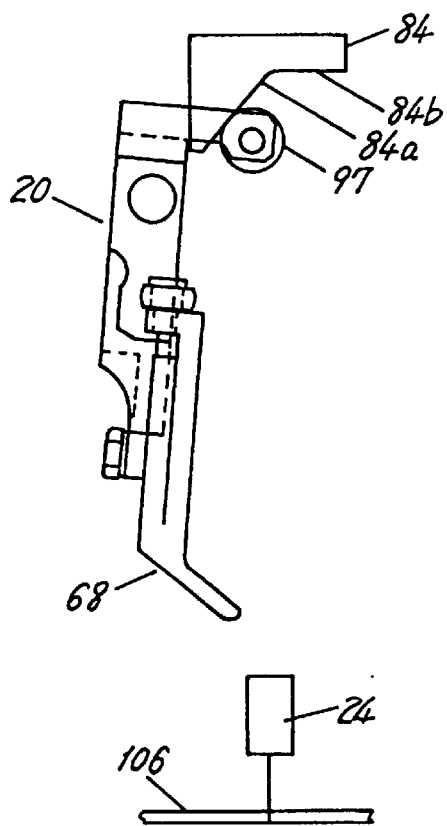
FIG. 57 is a front view depicting yet another state of insertion by the same head.

FIG. 52 through FIG. 54 show a case wherein there is a large space between elements 24 on a substrate 106, and FIG. 55 through FIG. 57 show another case wherein there is a small space between elements 24 on a substrate 106. In the case shown in FIG. 52 through FIG. 54, the insertion nail 68 does not strike any elements 24 already mounted behind the insertion nail 68, even if an amount of backward movement (amount of retractive movement) is increased in order for the insertion nail 68 to cope with large elements 24 such as those shown in FIG. 52 through FIG. 54, because the space between the elements 24 is large enough.

However, if the space is reduced between the elements 24 on the substrate 106 in an attempt to increase mounting density on the substrate 106, the insertion nail 68 may strike the element 24 behind it when the insertion nail 68 makes a large retractive movement backward. In this case, it is often likely that smaller size elements 24, such as those shown in FIG. 55 through FIG. 57, are used as compared to the case of FIG. 52 through FIG. 54. It is therefore necessary to reduce the amount of backward movement (amount of retractive movement) of the insertion nail 68.

Figure 58:
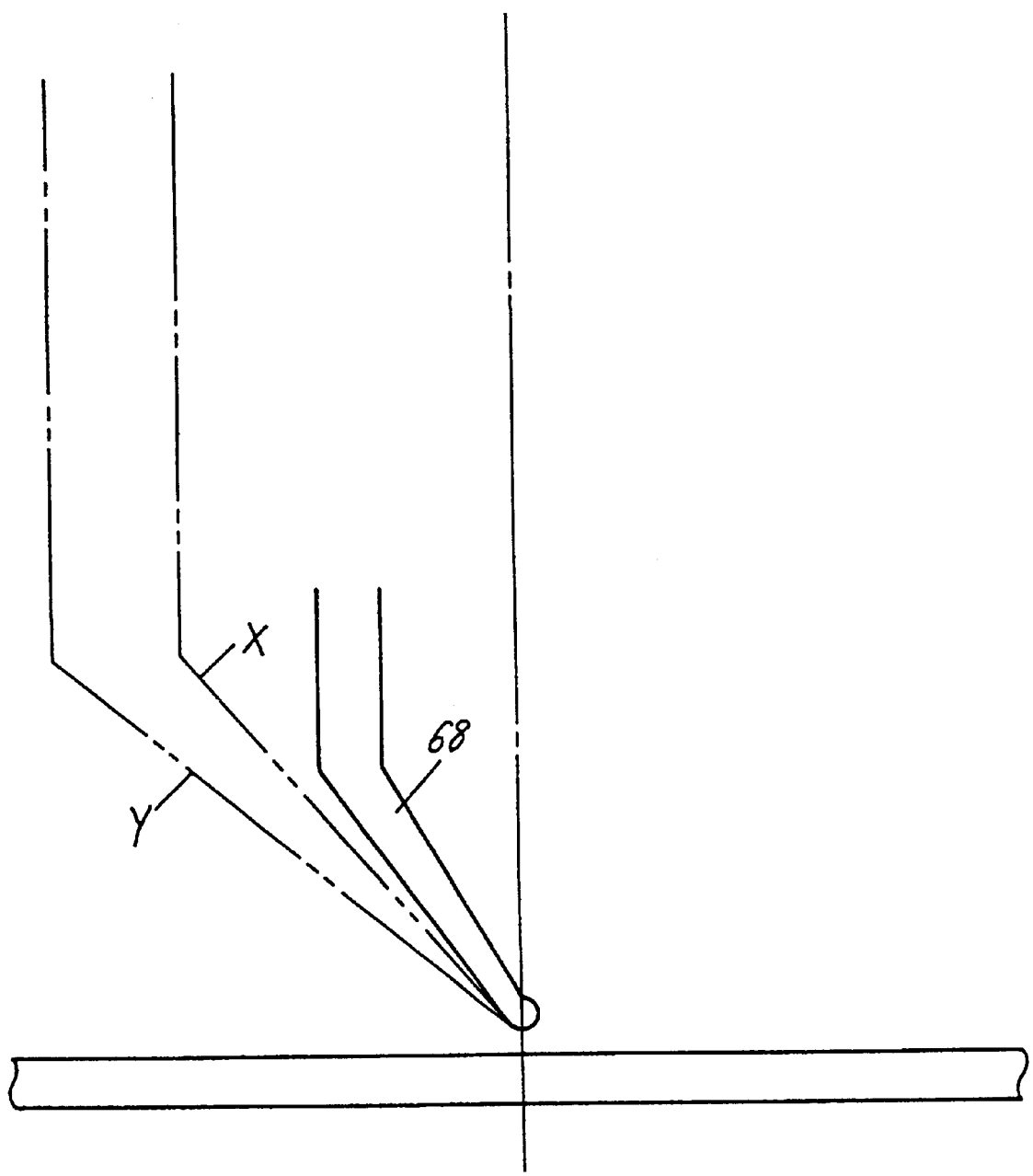
FIG. 58 is a front view depicting the same operation.

This object is accomplished in the present exemplary embodiment by removing the screw 81d and replacing the cam plate 84. The cam plate 84 shown in FIG. 55 through FIG. 57 has a longer slope 84a on a cam surface contacting the cam follower 97, and a top wall 84b in a higher position as compared to the other cam plate 84 shown in FIG. 52 through FIG. 54. As described above, since the insertion nail 68 moves backward as the cam follower 97 is pushed relative to the cam surface of cam plate 84, and eventually turns the rotary body 87, the backward movement of the insertion nail 68 can be altered from a phantom line "Y" to a smaller phantom line "X" in FIG. 58, if the slope 84a of the cam plate 84 is longer and the top wall 84b is higher. This enables the head 20 to mount the element 24, as shown in FIG. 56, even if there is a limited space between the elements 24 on the substrate 106, and thereby increase the mounting density of the elements 24 on the substrate 106.

FIG. 61 through FIG. 64 depict catch pins. A catch pin 108a has a circular recess at a top of it, a catch pin 108b has a conoidal recess, a catch pin 108c has a deep recess, and a catch pin 108d is made out of a cylinder.

All of the catch pins 108, or 108a through 108d are made to have diameters greater than a diameter of the via hole (through-hole) 107 perforated in the substrate 106, as shown in FIG. 49. The head 20 is able to mount the element 24 reliably on the substrate 106 by positively holding the top and the bottom of the element 24 with the pusher 109 and the catch pin 108, or 108a through 108d, even if the lead terminals 25 of the element 24 are slightly eccentric, because the catch pins 108, or 108a through 108d are greater in diameter than the via hole (through-hole) 107 in the substrate 106.

As has been described, the component mounting apparatus of the present exemplary embodiment comprises: the component delivery unit; the chuck 13 provided on the component delivery unit; the component transfer unit 19 for receiving a component held by the chuck 13; and the head 20 for receiving the component held by the component transfer unit 19. The head 20 comprises: the main head body 80; the vertically-moving mechanism 81 for moving the main head body 80; the insertion; nail 68 provided at the bottom portion of the main head body 80; the opening/closing mechanism 82 of the insertion nail 68; and the turning mechanism 83 for moving the insertion nail 68 in forward and backward directions. The cam plate 84, which is a portion of the turning means 83, is mounted detachably on the main head body 80, so that a locus of backward movement of the insertion nail 68 (i.e. a retractive path of the insertion nail 68 after mounting a component) can be altered readily by mounting another cam plate 84 having a different shape on the main head body 80. This can result in an increase of mounting density of components on a substrate, and an improvement of workability, since all that is necessary is to replace only the cam plate 84, without requiring any alignment of the insertion nail 68 with respect to the substrate after the replacement.

Figure 65:
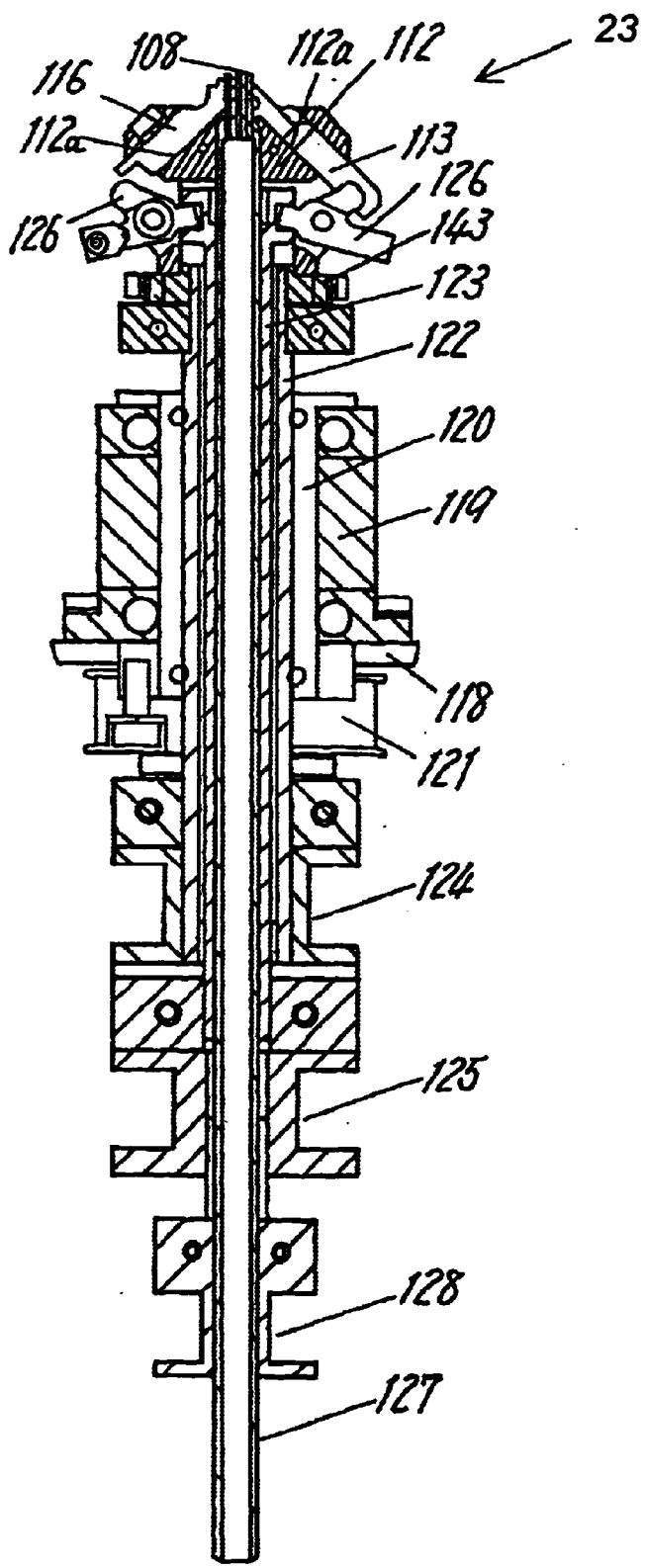
FIG. 65 is a longitudinal sectional view depicting an anvil mechanism of the same component mounting apparatus.

FIG. 65 depicts the anvil mechanism 23.

Figure 75:
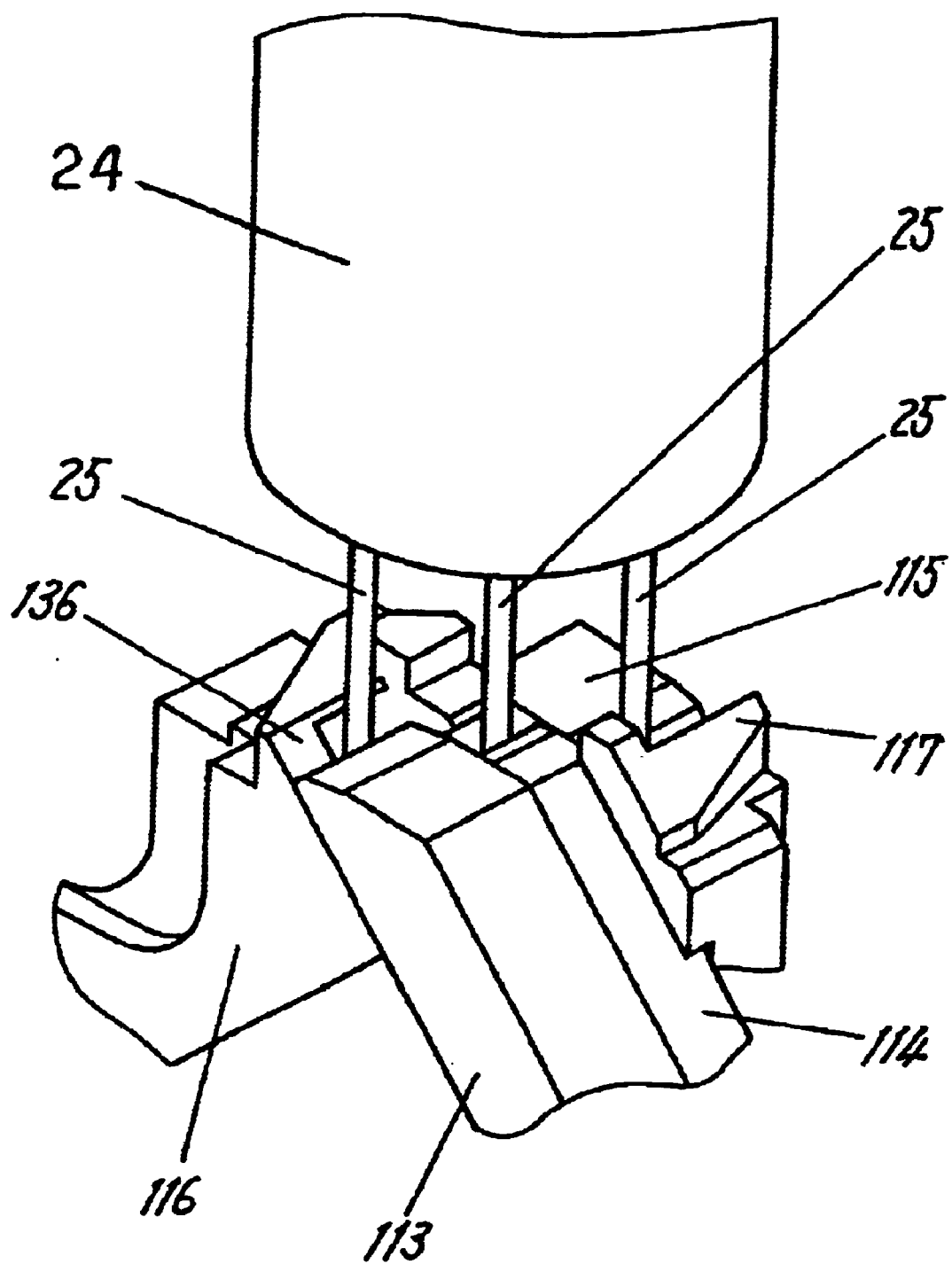
FIG. 75 is an oblique expanded perspective view depicting an essential upper portion of the same anvil mechanism in the state shown in FIG. 70.

The anvil mechanism 23 comprises: a mounting base 112 having two slant surfaces 112a opposed to each other; first through third movable blades 113, 114 and 115, and first and second fixed blades 116 and 117, all of which are disposed on the slant surfaces 112a of the mounting base 112 as shown in FIG. 75; the previously described catch pin 108; and a rotating and vertically moving mechanism.

The rotating and vertically moving mechanism will be described hereinafter. A reference numeral 118 in FIG. 65 is a base, which represents a basis of movement, and the base 118 neither rotates nor moves vertically. A rotary bearing 119 is fixed to the base 118, and a rotary axle 120 is rotatably supported on the inside of the rotary bearing 119. A timing pulley 121 is fixed to a lower end of the rotary axle 120, and a belt is looped up around the timing pulley 121, though the belt is not shown in the figure.

A cylinder 122 is placed inside of the rotary axle 120 so that the cylinder 122 rotates together with the rotary axle 120, but so that it is freely movable vertically with respect to the rotary axle 120. A cam follower, not shown in the figure, is engaged in a cain follower receptacle 124 at a lower end of the cylinder 122, and the cam follower moves the mounting base 112 together with the cylinder 122.

In other words, the mounting base 112 is fixed on top of the cylinder 122. The cylinder 122 also has an operating rod 123 arranged inside in such a manner that the operating rod 123 rotates together with the cylinder 122, but it is freely movable vertically with respect to the cylinder 122.

Another cam follower, also not shown in the figure, is engaged in a cam follower receptacle 125 at a lower end of the operating rod 123, and the cam follower vertically moves the operating rod 123, which in turn opens and closes the first through third movable blades 113 through 115 shown in FIG. 75, via a coupling lever 126.

Furthermore, the operating rod 123 has a cylinder 127 arranged inside so that the cylinder 127 is rotatable together with the operating rod 123. The cylinder 127 is also vertically movable freely with respect to the operating rod 123, and the vertical movement is produced by a cam follower, which is not shown in the figure, engaged in a cam follower receptacle 128.

Figure 82:
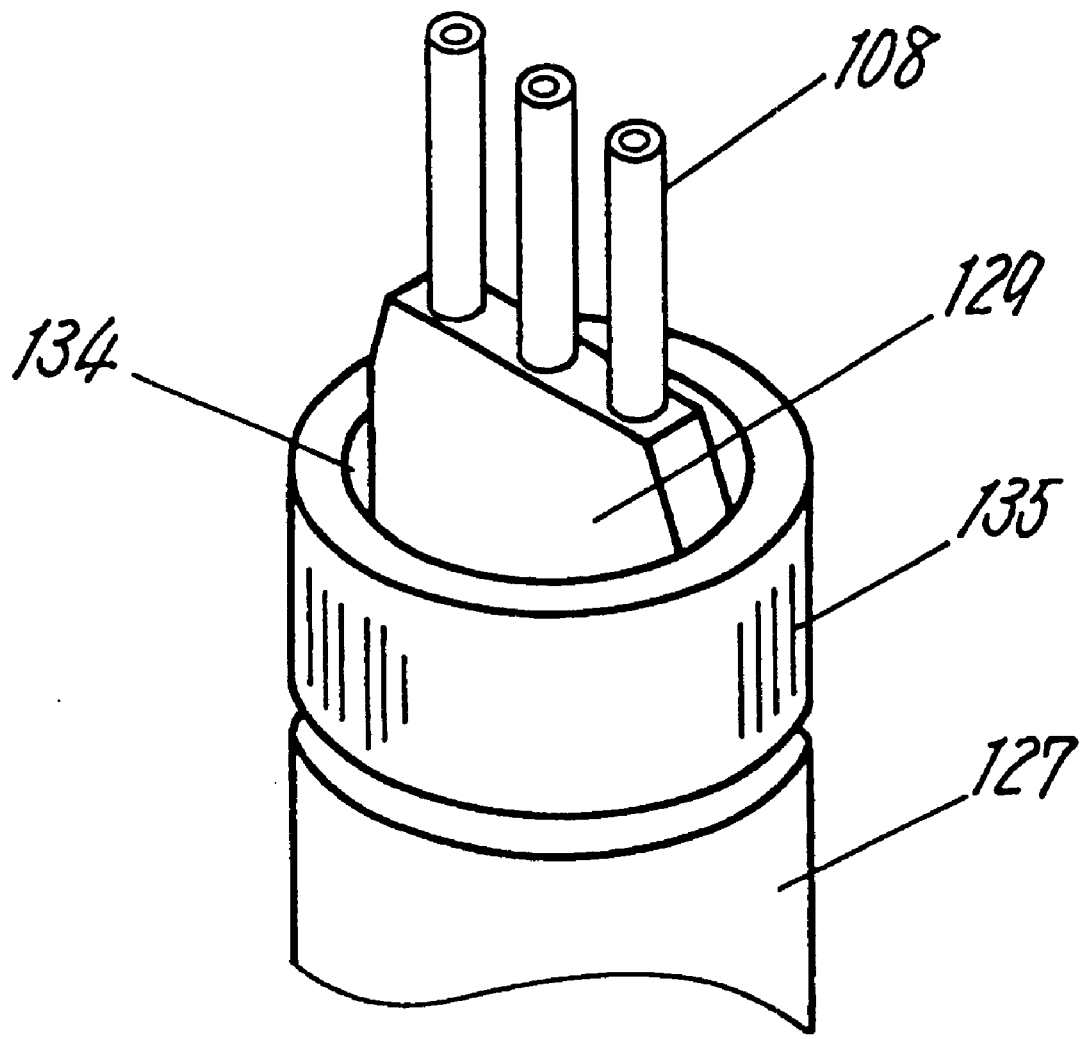
FIG. 82 is a perspective view depicting a catch pin portion of the same anvil mechanism.
Figure 83:
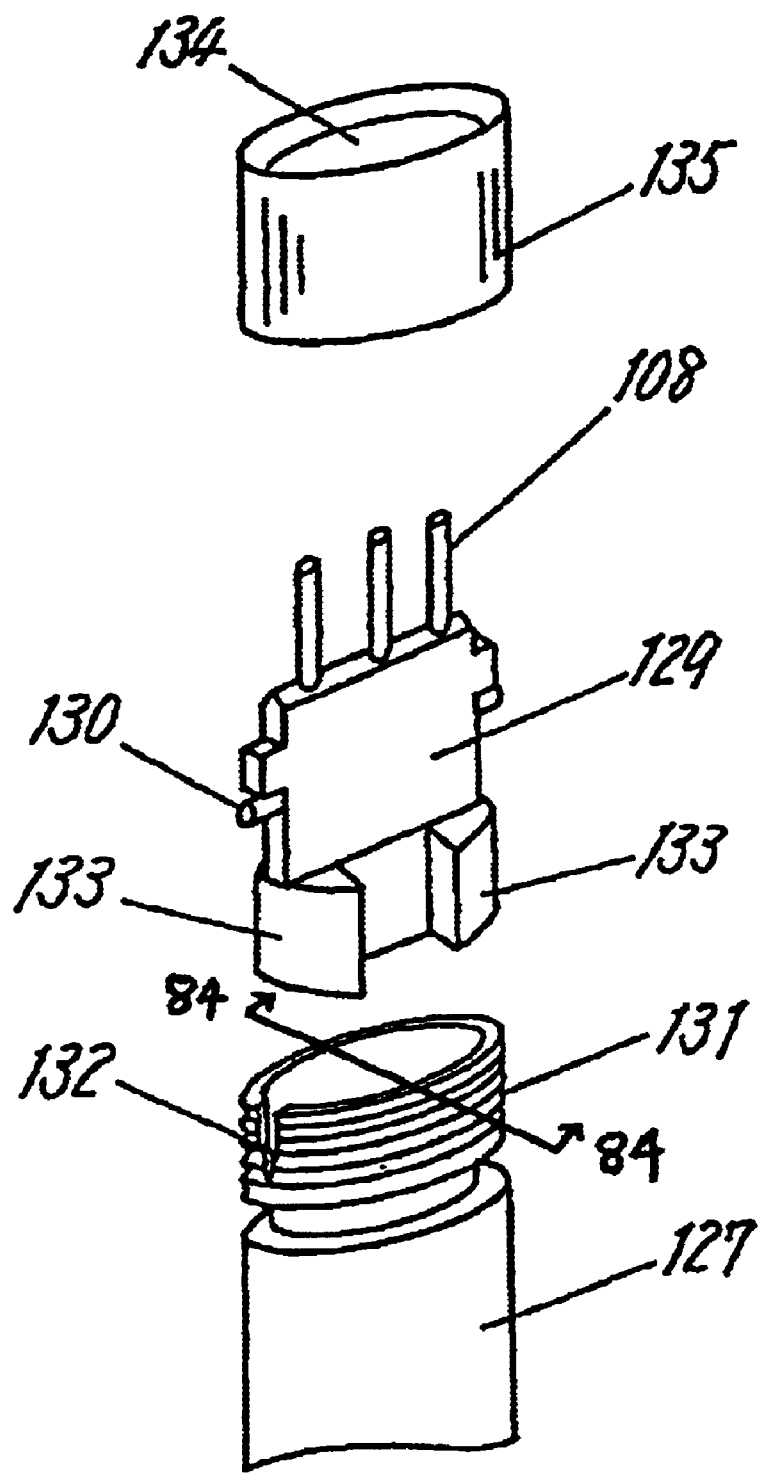
FIG. 83 is an exploded perspective view depicting the same catch pin portion.

The catch pins 108 are mounted on a top end of the cylinder 127 as shown in FIG. 82 and FIG. 83. Specifically, a supporting body 129 is disposed to bridge across an upper end opening of the cylinder 127. As shown in FIG. 83, the supporting body 129 has a board-like (substantially flat) shape, and a supporting pin 130 is inserted horizontally through the board-like supporting body 129. The catch pins 108 are secured in the supporting body 129 with their lower ends butted on the supporting pin 130, so that the heights of the catch pins 108 become uniform, and thereby lower ends of the lead terminals 25 are supported uniformly by the catch pins 108.

Figure 84:
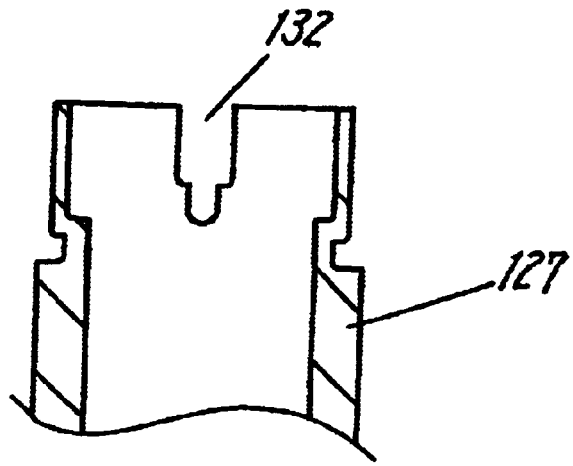
FIG. 84 is a sectional view depicting the same catch pin portion.

An upper peripheral portion ofthe cylinder 127 has a male thread 131, and a notch 132 is provided from the top end of the cylinder 127 vertically downward through the male thread 131 as shown in FIG. 83 and FIG. 84. The supporting pin 130 is engaged in the notch 132. This engagement of the supporting pin 130 in the notch 132 of the cylinder 127 fixes the heights of the catch pins 108 with respect to the cylinder 127, thereby resulting in a uniform support of the lower ends of the lead terminals 25 by the catch pins 108. In addition, a fitting body 133 is provided under the supporting body 129 to fit into an inside of the cylinder 127, so as to prevent the supporting body 129 from wobbling.

A cap 135 having a female thread around an internal periphery and an opening 134 on top is screwed detachably over the top end of the cylinder 127 in the above arrangement. The cap 135 screw-fitted on the top end not only prevents the catch pins 108 from coming off upwardly, but also makes the catch pins 108 replaceable with ease, when necessary, by removing the cap 135.

Figure 76:
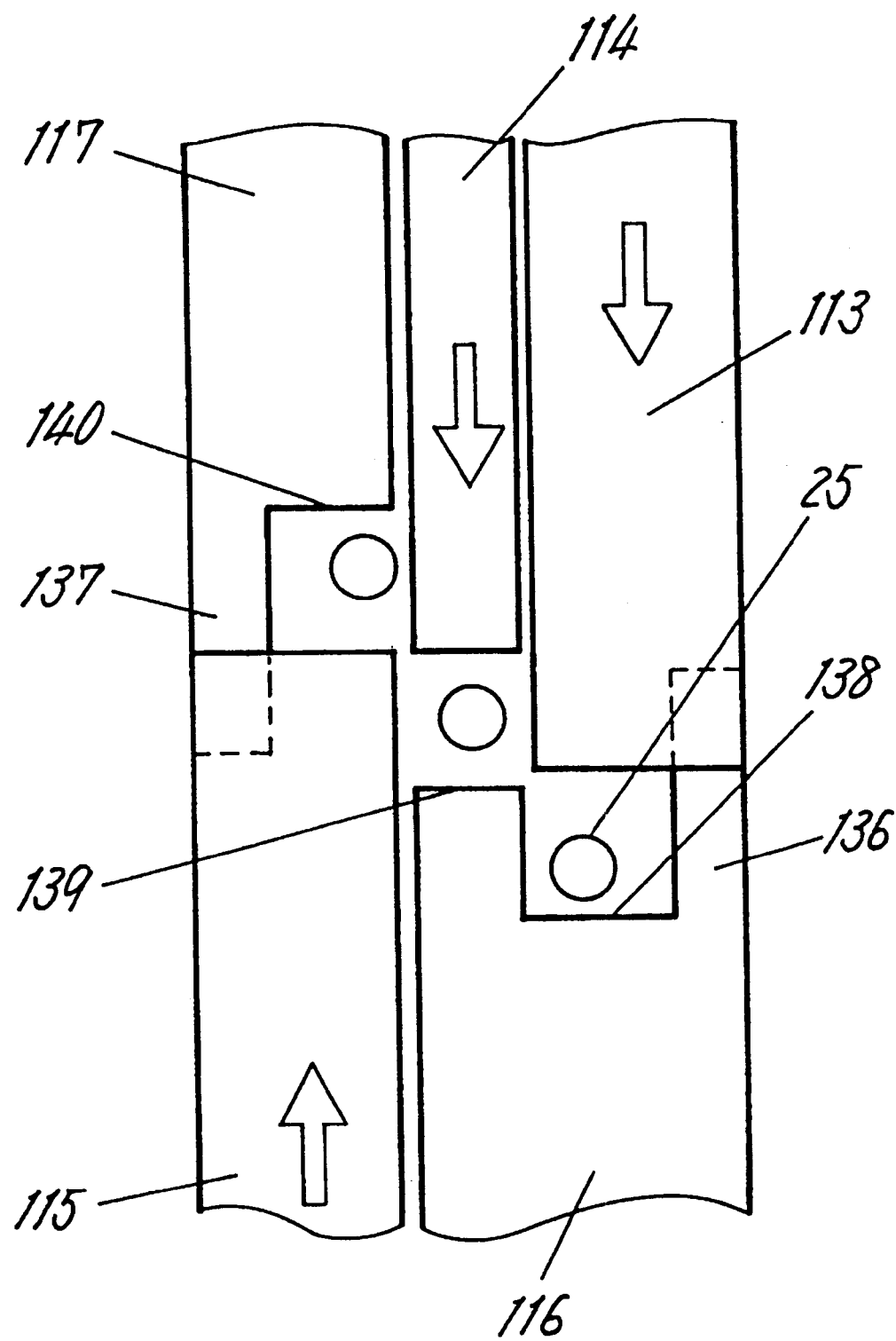
FIG. 76 is a plan view depicting the essential portion of the same anvil mechanism.

The mounting base 112 will be described next. The mounting base 112 is provided with the first through third movable blades 113, 114 and 115, and the first and second fixed blades 116 and 117, all mounted using the opposing pair of slant surfaces 112a, as has been described. They are positioned relative to one another as shown in FIG. 75 and FIG. 76. That is, two of the movable blades, 113 and 114, and one of the fixed blades, 117, are positioned at one side, and the one remaining movable blade 115 and the fixed blade 116 are positioned at the other side, so as to be capable of cutting all three lead terminals 25 at once. The first and the second fixed blades 116 and 117 are provided with their respective guide surfaces 136 and 137 at sides facing outward in this arrangement, as shown in FIG. 75 and FIG. 76. Cutting edges 138, 139 and 140 are formed beside the guide surfaces 136 and 137, pointing toward their respective counterparts, the first and the second movable blades 113 and 114, as well as the third movable blade 115. The first through third movable blades 113, 114 and 115, and the first and second fixed blades 116 and 117 are therefore in their open positions at the moments shown in FIG. 75 and FIG. 76.

The lead terminals 25 are inserted when the blades are open, and they are cut off when the cutting edges 138 through 140 and the first through third movable blades 113 through 115 are closed, details of which will be later described.

It is important to prevent an undesirable gap from being developed between the first through third movable blades 113 through 115 and the cutting edges 138 through 140 of the first and second fixed blades 116 and 117 in order to cut the lead terminals 25. In the present exemplary embodiment, the first and the second fixed blades 116 and 117 are loosely set on the slant surfaces 112a of the mounting base 112 in order to achieve the above object. Initially, the first and second movable blades 113 and 114, as a pair, are slid over the slant surface 112a of the mounting base 112 up to positions which are slightly above anticipated points where the movable blades meet with the cutting edges 138 and 139 of the first fixed blade 116. The first fixed blade 116 is then pushed up along the slant surface 112a of the mounting base 112. This brings the guide surface 136 of the first fixed blade 116 into contact with a lower surface of the first movable blade 113, which is already in the slid up position. The first fixed blade 116 is now secured to the mounting base 112 at this point.

The above procedure assures that the first movable blade 113 slides up along the guide surface 136 of the first fixed blade 116, after it slides up over the slant surface 112a. As a result, no undesirable gap is created between the first movable blade 113 and the cutting edge 138 of the first fixed blade 116, and thereby the lead terminal 25 is cut smoothly. Also, since the second movable blade 114 slides over the same slant surface 112a of the mounting base 112 as the first movable blade 113, an undesirable gap is also prevented between the second movable blade 114 and the second cutting edge 139, when the first fixed blade 116 is properly positioned according to the above procedure. Hence, the lead terminal 25 can be cut smoothly by the second movable blade 114 and the second cutting edge 139.

In the like manner, the third movable blade 115 is slid over the slant surface 112a of the mounting base 112 up to a position slightly above an anticipated point where the movable blade 115 meets with the cutting edge 140 of the second fixed blade 117, when setting a position of the second fixed blade 117. The second fixed blade 117 is then pushed up along the slant surface 112a of the mounting base 112 until the guide surface 137 ofthe second fixed blade 117 comes in contact with a lower surfade of the third movable blade 115. The second fixed blade 117 is then secured to the mounting base 112 at this position after it contacts with the lower surface of the third movable blade 115. In this way, the third movable blade 115 reaches the cutting edge 140 after sliding up along the guide surface 137, when the third movable blade 115 is moved thereafter, and therefore no undesirable gap is made between the blades, thereby cutting the lead terminal 25 smoothly.

Figure 68:
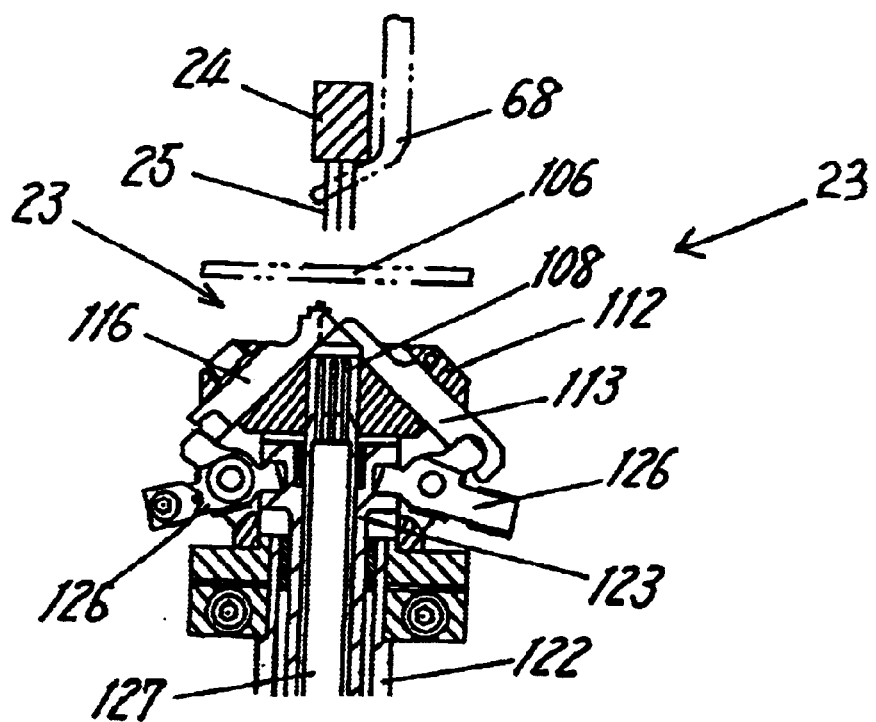
FIG. 68 is a sectional view of the anvil mechanism showing an operation thereof.
Figure 69:
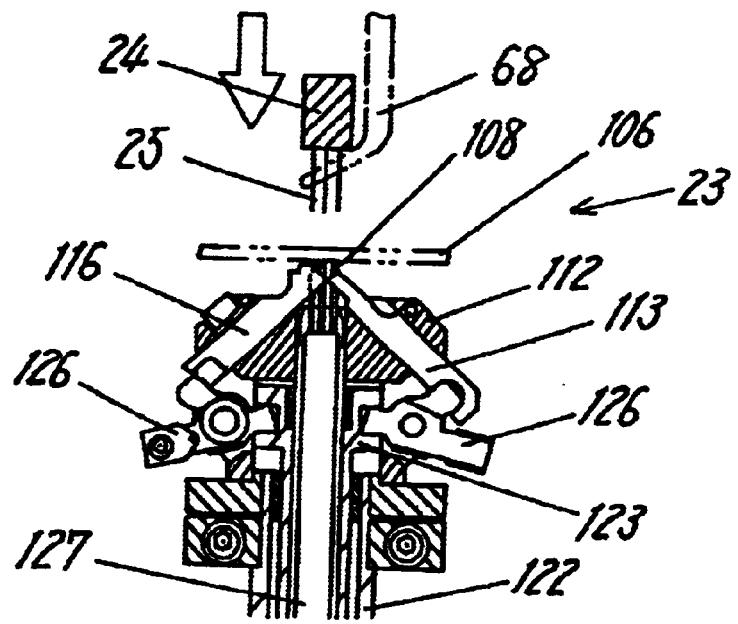
FIG. 69 is another sectional view of the same anvil mechanism showing an operation thereof.

The next description pertains to mounting the element 24 on the substrate 106. FIG. 68 depicts a state just prior to the mounting, in which the mounting base 112 is located below the substrate 106, and the insertion nail 68 is located above the substrate 106. From this state of FIG. 68, the cam follower receptacles 125 and 128 are raised by their respective cam followers as shown in FIG. 69. Since the amount of rise of the cylinder 127 is set to be greater than that of the cylinder 122, the catch pins 108 move up near a lower surface of the substrate 106 as shown in FIG. 69.

Figure 70:
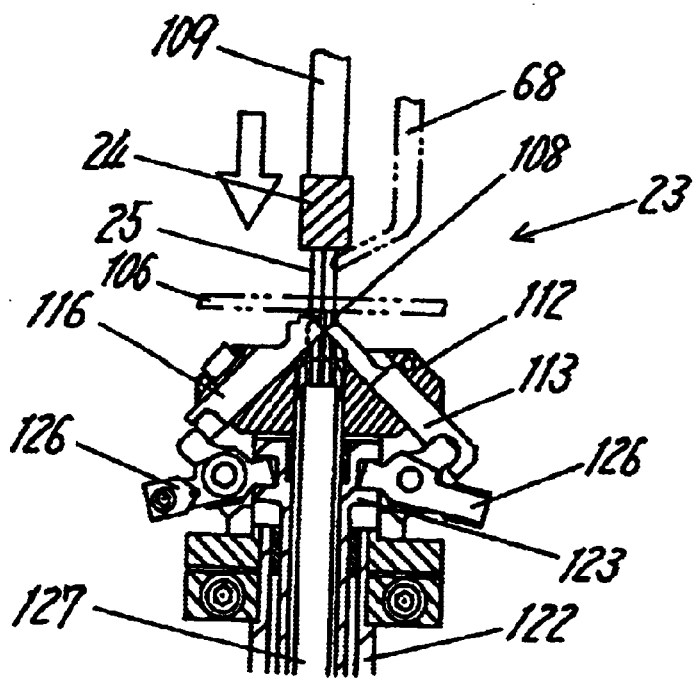
FIG. 70 is another sectional view of the same anvil mechanism showing an thereof.
Figure 71:
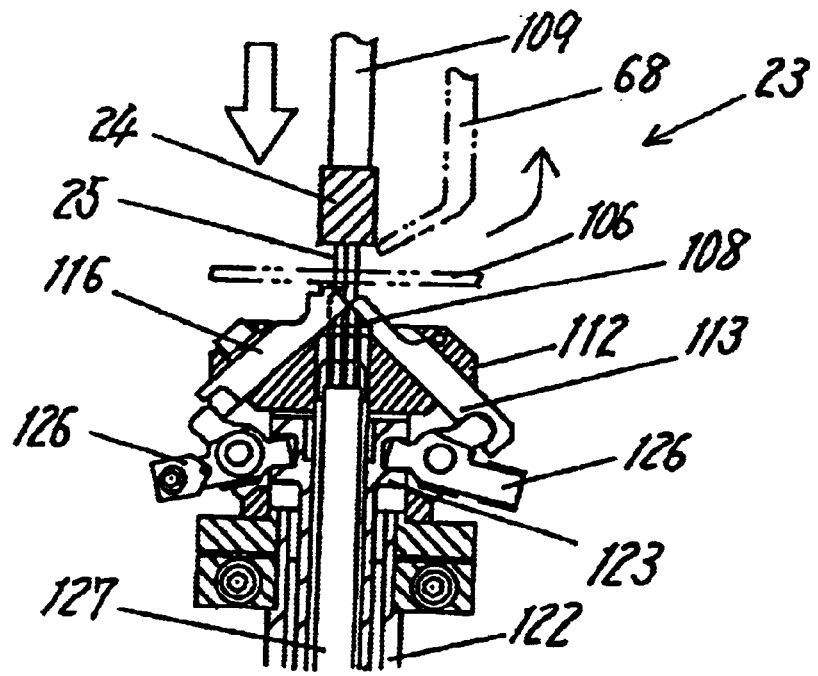
FIG. 71 is another sectional view of the same anvil mechanism showing an operation thereof.
Figure 72:
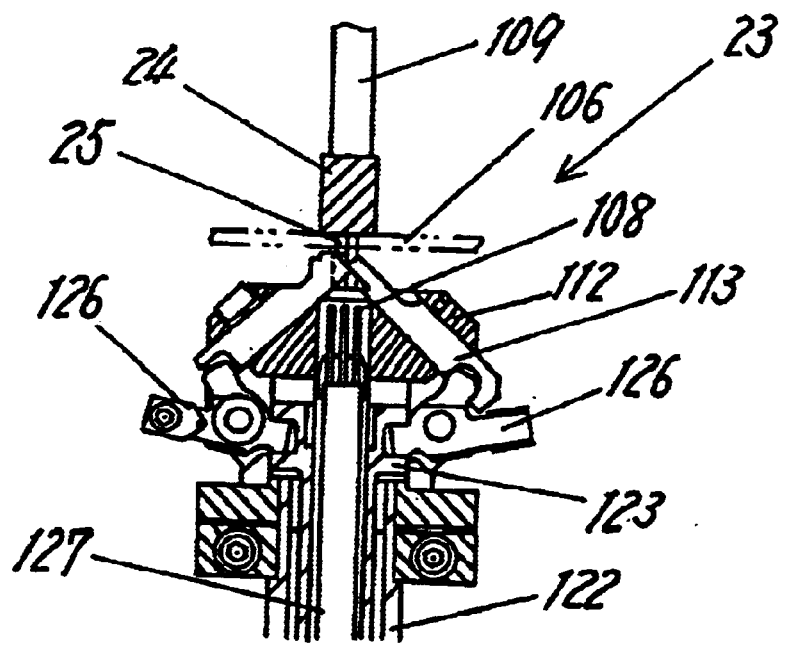
FIG. 72 is another sectional view of the same anvil mechanism showing an operation thereof.

The first through the third movable blades 113 through 115, and the first and the second fixed blades 116 and 117, are in their open positions, as shown in FIG. 75 and FIG. 76, between the steps depicted in FIG. 68 through FIG. 72, and the catch pins 108 are therefore vertically movable through these openings. The lead terminals 25 are then inserted through the via holes 107 in the substrate 106 by lowering the insertion nail 68 until the lead terminals 25 contact the catch pins 108. While maintaining this state, the pusher 109 is lowered from above the element 24 until it touches the element 24 as shown in FIG. 70. This way, the element 24 is held at the top and the bottom between the pusher 109 and the catch pins 108, and the insertion nail 68 retracts outward with the element 24 held in this position, as shown in FIG. 70 and FIG. 71. When the pusher 109 and the catch pins 108 are positioned in a synchronized motion, a bottom end of the element 24 comes to contact with an upper surface of the substrate 106 as shown in FIG. 72, and the catch pins 108 at one side move apart from the bottom ends of the lead terminals 25.

Figure 73:
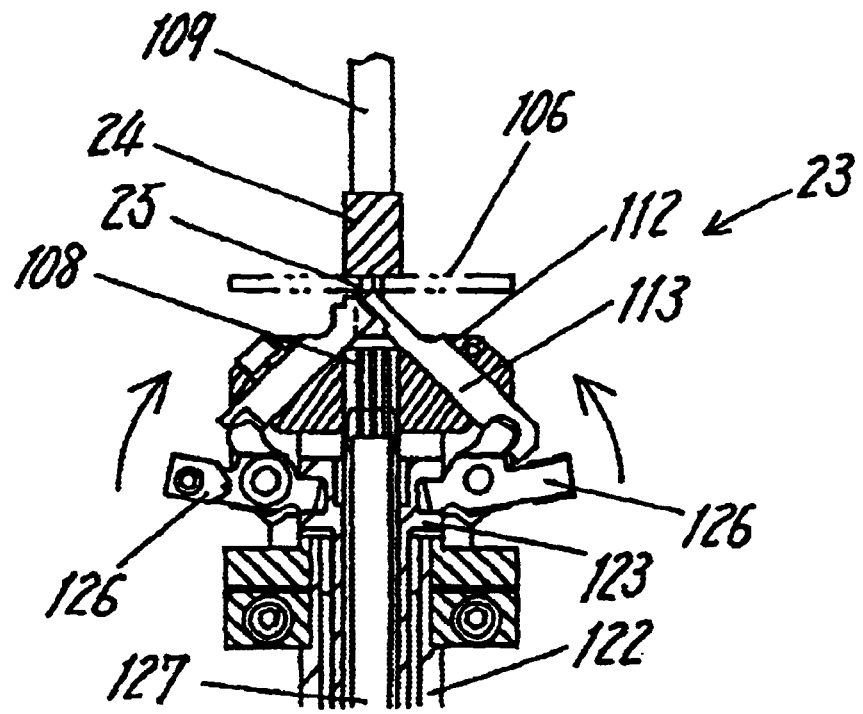
FIG. 73 is still another sectional view of the same anvil mechanism showing an operation thereof.
Figure 77:
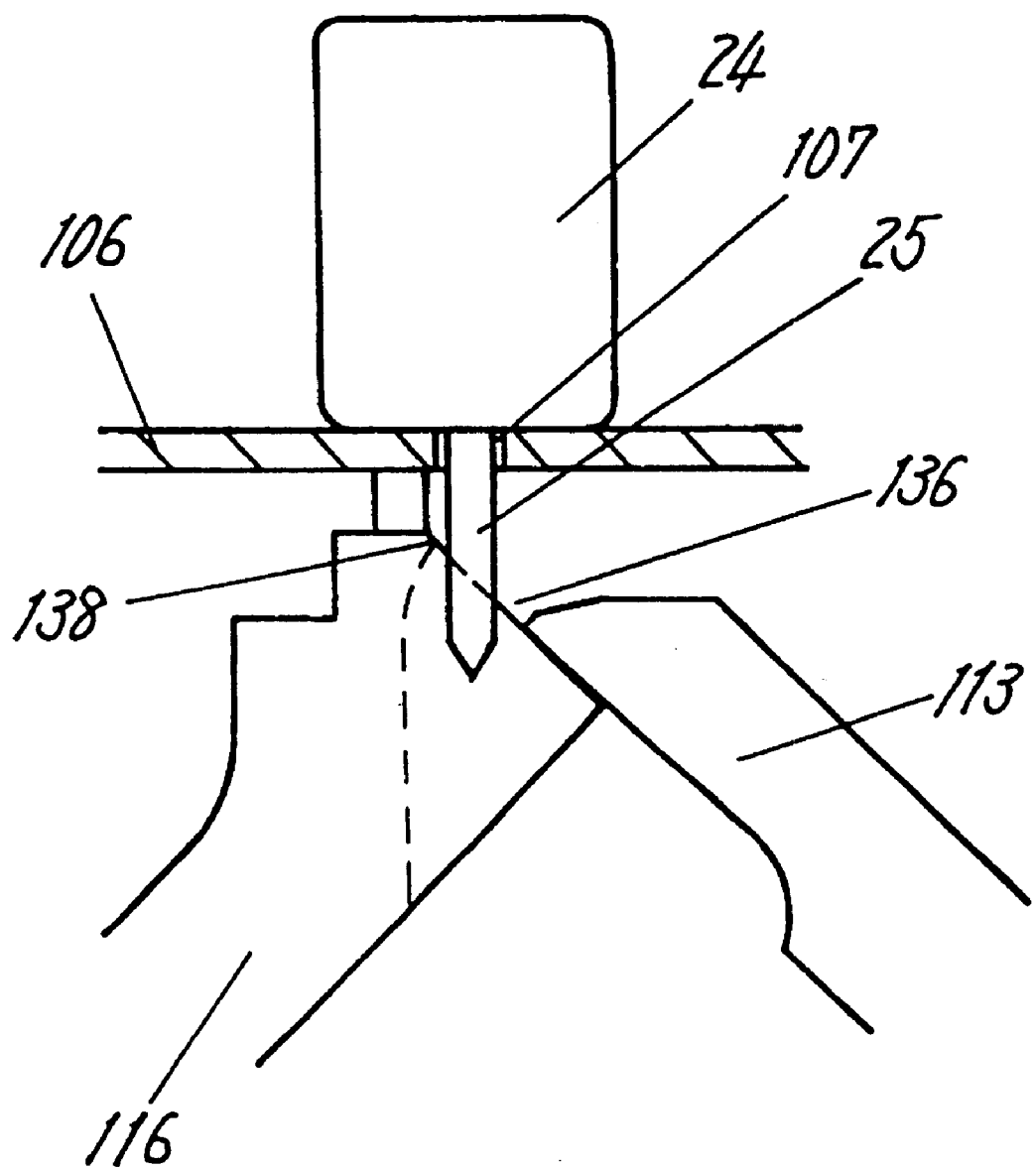
FIG. 77 is a front view depicting the essential portion of the same anvil mechanism.
Figure 78:
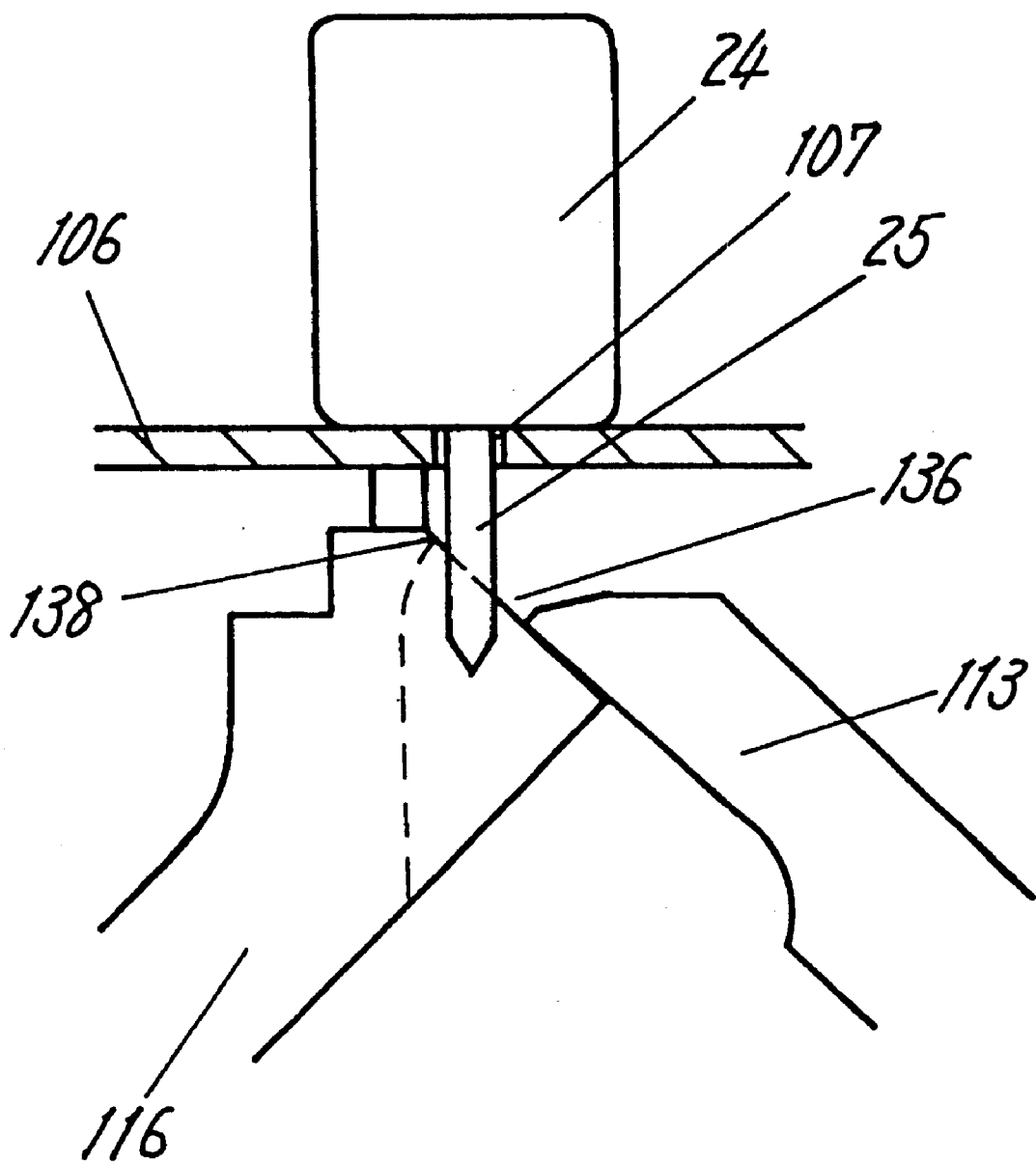
FIG. 78 is another front view of the essential portion of the same anvil mechanism.
Figure 79:
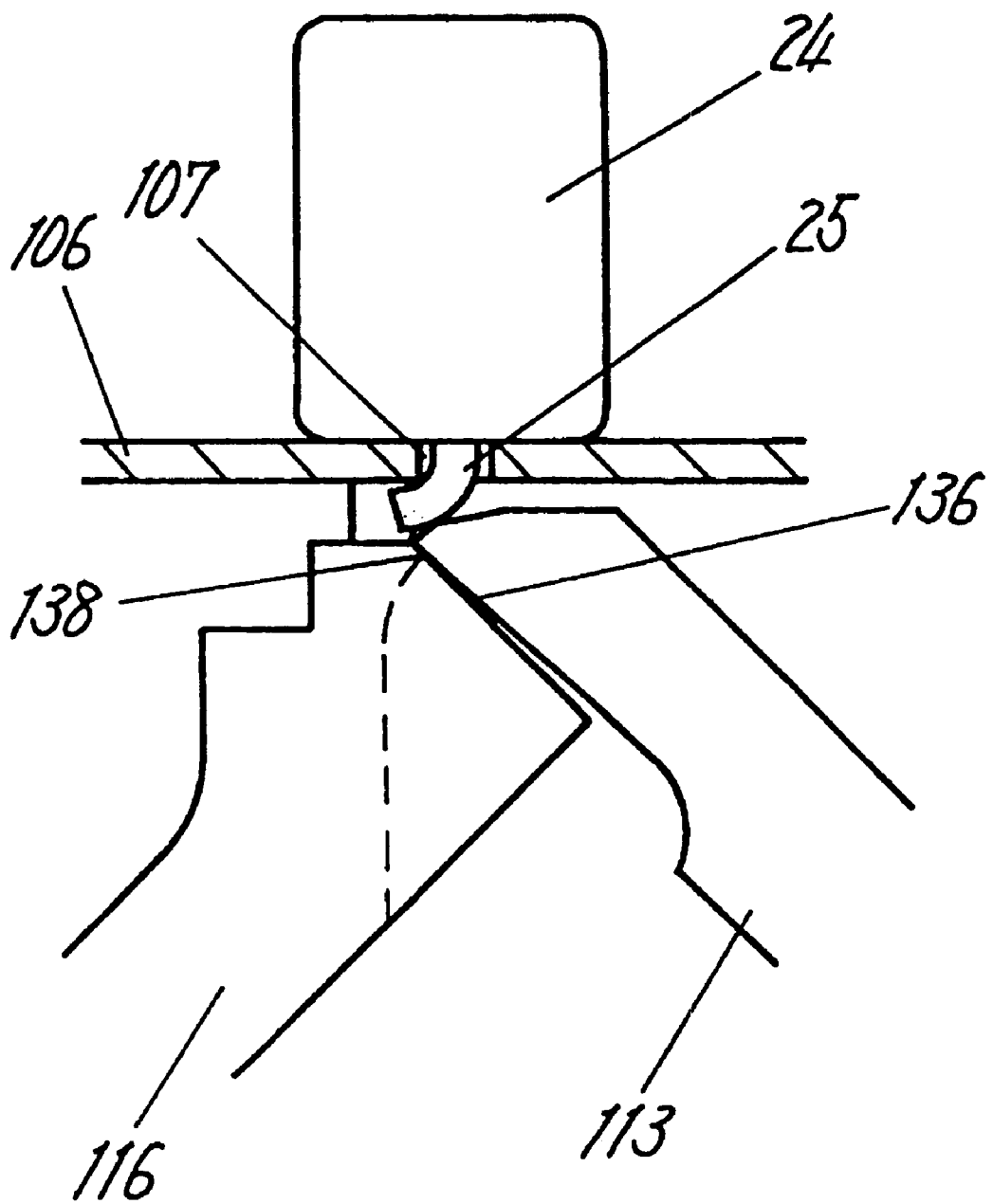
FIG. 79 is still another front view of the essential portion of the same anvil mechanism.

When the operating rod 123 is lowered next, as shown in FIG. 73, a point of application (a first end) of the coupling lever 126 comes down, and a point of action (an opposite second end) comes up around a fulcrum. This moves the first through the third movable blades 113 through 115 upward, so that the first through the third cutting edges 138 through 140 and the first through the third movable blades 113 through 115 cut the lead terminals 25 in a manner as shown in FIG. 77 and FIG. 78. The first through the third movable blades 113 through 115 slide up further beyond that point along the slant surface 112a, and bend the lead terminals 25 at their lower ends, after cut off, toward the substrate 106 as shown in FIG. 79, so as to prevent the element 24 from coming out of the via holes 107 in the substrate 106.

Figure 74:
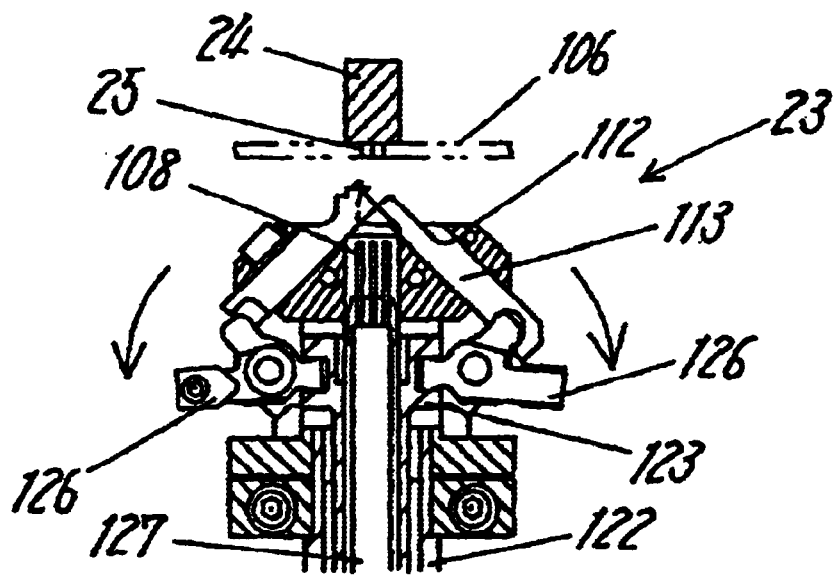
FIG. 74 is yet another sectional view of the same anvil mechanism showing an operation thereof.

Fragments 141 ofthe: cut off lead terminals 25, shown in FIG. 78, fall into the cylinder 127 through the opening 134 in the cap 135 shown in FIG. 82 and FIG. 83, and they are collected in a storage vessel provided below a bottom opening of the cylinder 127. The cylinder 122 is then lowered together with the operating rod 123 as shown in FIG. 74. During this lowering step, the amount of down movement of the cylinder 122 is set to be greater than that of the operating rod 123, which has been lowered in the preceding step in FIG. 73, for bringing the cylinder 122 and operating rod 123 Into the standby mode of FIG. 68.

The first through the third movable blades 113 through 115 and the first and the second fixed blades 116 and 117 are replaceable by taking steps, which will be described hereinafter.

Figure 66:
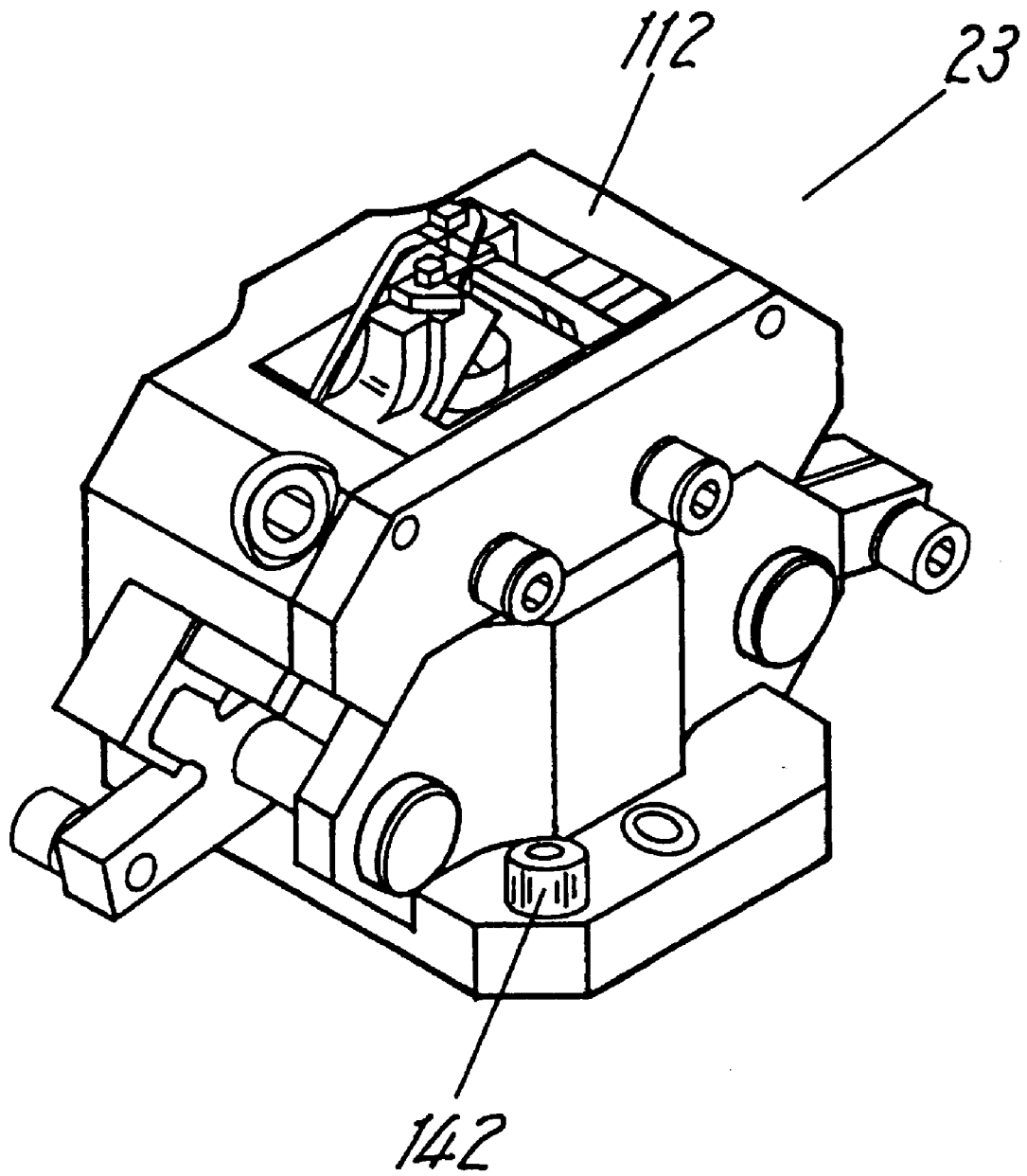
FIG. 66 is a perspective view depicting a mounting base of the anvil mechanism.
Figure 85:
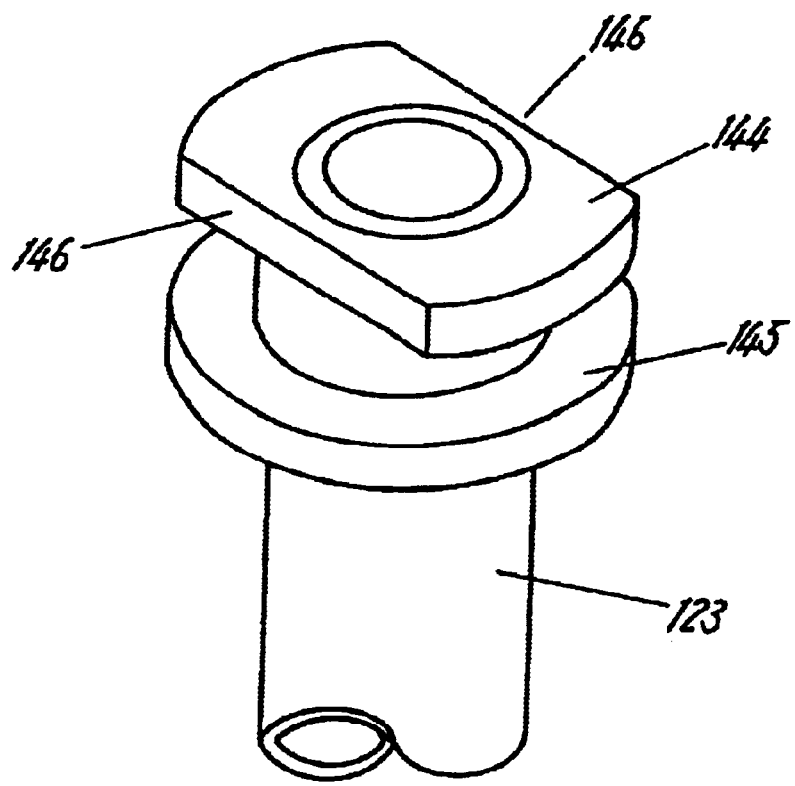
FIG. 85 is a perspective view depicting an operating rod of the same catch pin portion.
Figure 86:
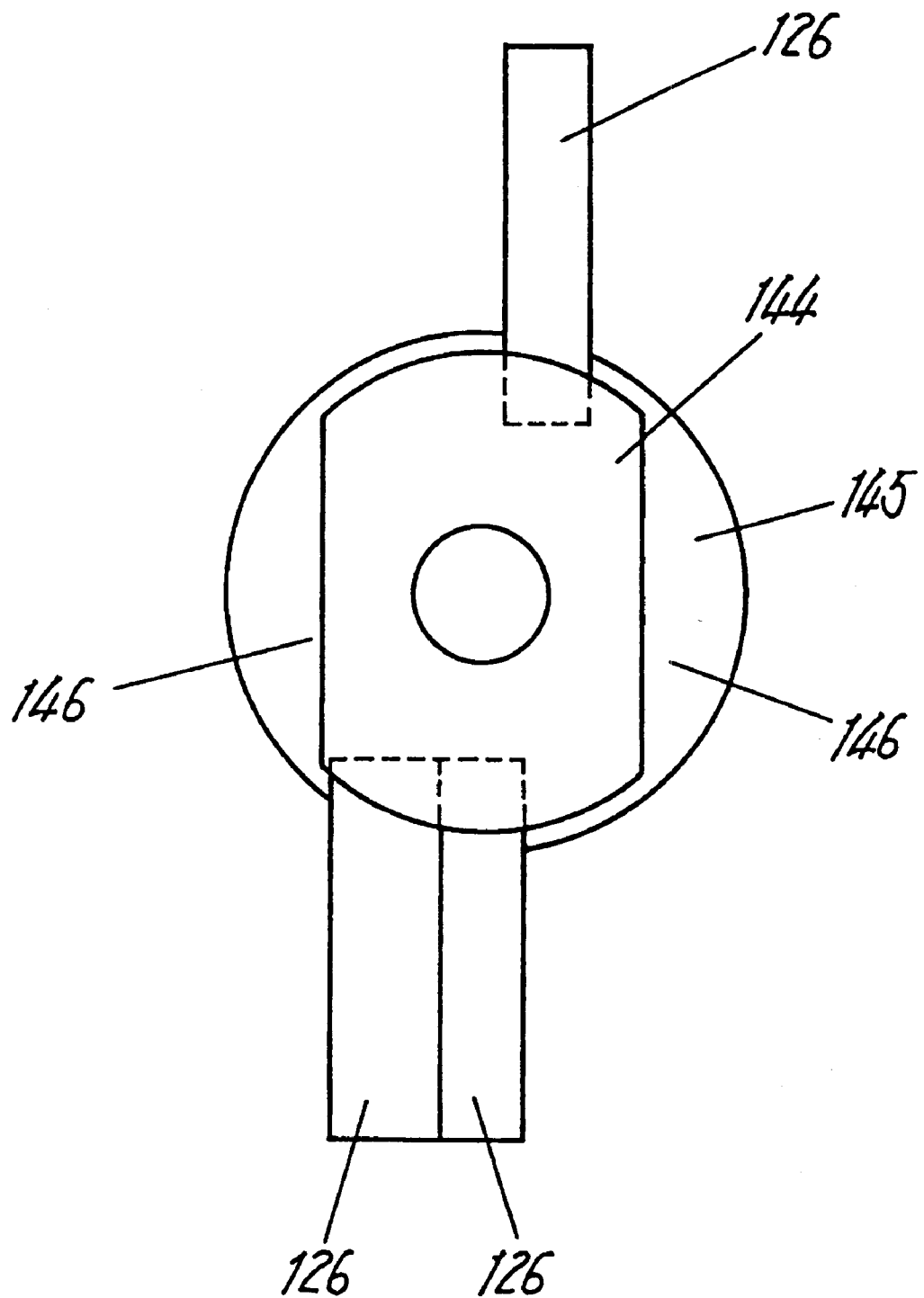
FIG. 86 is a plan view of the same operating rod.
Figure 87:
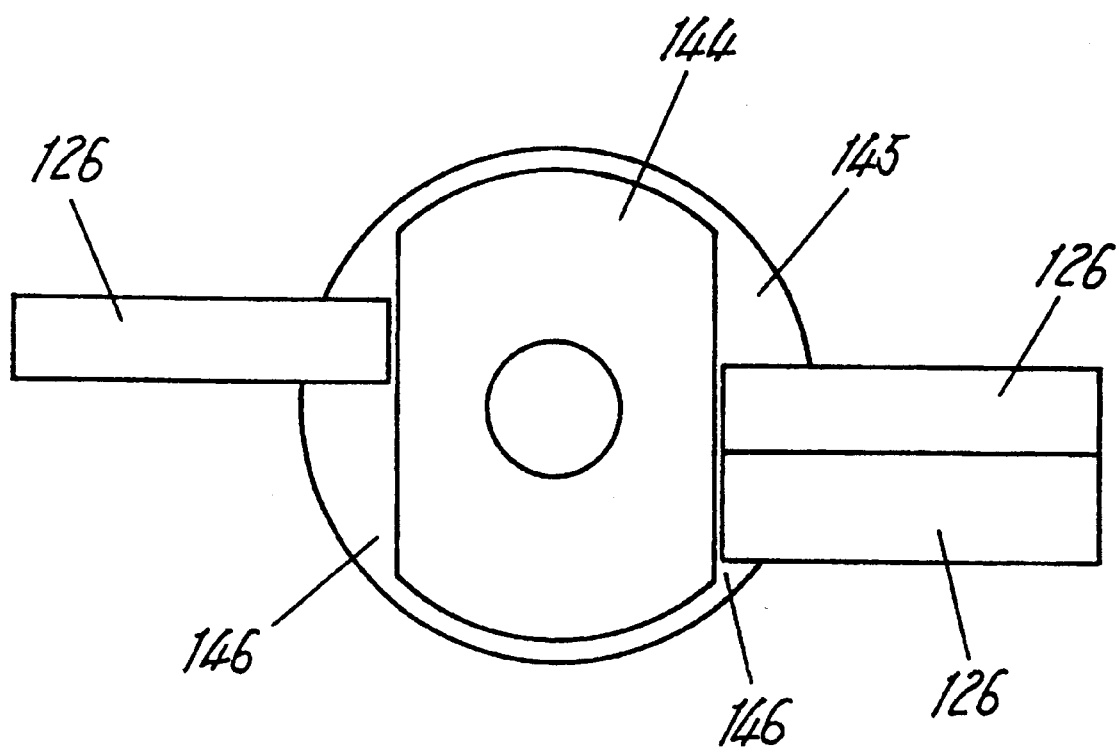
FIG. 87 is another plan view of the same operating rod.

First, the mounting base 112 is freed from a mount section 143 at a top end of the cylinder 122, as shown in FIG. 65, by removing the screw 142 shown in FIG. 66, and the mounting base 112 is rotated 90 degrees while maintaining its posture. The top end of the cylinder 123 is provided with two flanges 144 and 145 around the periphery at a predetermined space as shown in FIG. 85, and the upper flange 144 has two cut-back portions 146 at opposite sides. Therefore, the coupling levers 126 connected between the operating rod 123 and the mounting base 112 are disengaged from the cut-back portions 146 by rotating the mounting base 112 (or the operating rod 123) by 90 degrees, when removing the mounting base 112. A connection of the mounting base 112 to the operating rod 123 is easily made by rotating the mounting base 112, when reinstalling it, thereby providing good workability.

Figure 67:
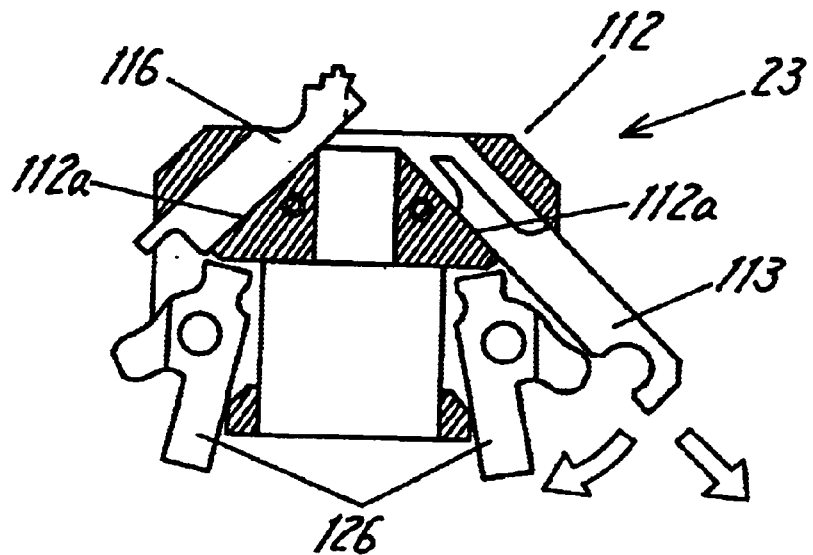
FIG. 67 is a sectional view depicting the mounting base.

As shown in FIG. 67, the points of action (second end) of the coupling levers 126 disengage from the first through the third movable blades 113 through 115, when the mounting base 112 is removed from the operating rod 123. Thus, the first through the third movable blades 113 through 115, in particular, come off the slant surfaces 112a due to their own weight.

Figure 80:
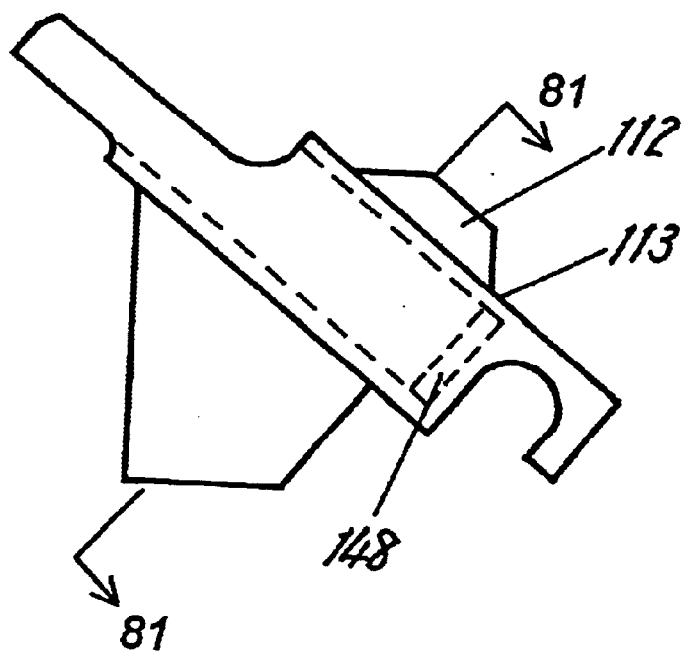
FIG. 80 is a front view depicting a movable blade of another exemplary embodiment.
Figure 81:
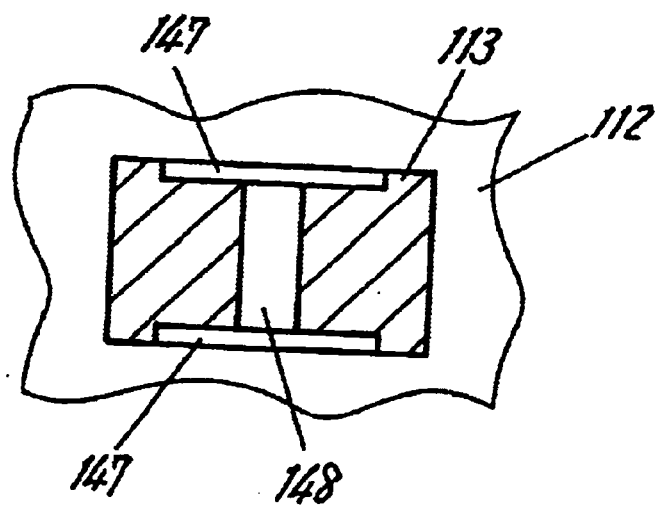
FIG. 81 is a cross sectional view depicting the same movable blade.

FIG. 80 and FIG. 81 depict another exemplary embodiment, in which grooves 147 are formed on top and bottom surfaces of the first through the third movable blades 113 through 115. The first through the third movable blades 113 through 115 and the first and the second fixed blades 116 and 117 produce pulverized cutting dust from cut-off portions of the lead terminals 25, when they cut off the lead terminals 25. The grooves 147 can prevent the cutting dust falling from the upper and/or lower surfaces of the first through the third movable blades 113 through 115 from accumulating on these surfaces, and from impeding the first through the third movable blades 113 through 115 from sliding. In other words, the first through the third movable blades 113 through 115 will fail to operate due to a jam between the first through the third movable blades 113 through 115 and their sliding surfaces, if cutting dust falls and accumulates upon the first through the third movable blades 113 through 115 and the sliding surfaces. However, because the grooves 147 are formed on top and bottom surfaces of the first through the third movable blades 113 through 115, as described above, the cutting dust moves into the grooves 147 as the first through the third movable blades 113 through 115 slide. Consequently, operating failure can be avoided, since the cutting dust does not accumulate on the first through the third movable blades 113 through 115 and the sliding surfaces.

In addition, a through hole 148 is provided between the lower end of the upper and lower grooves 147 for discharging through it the cutting dust moved into the grooves 147. The through hole 148 can prevent the first through the third movable blades 113 through 115 from eventually failing to operate, if the cutting dust accumulates in the grooves 147 by such an amount that the grooves 147 no longer accept the cutting dust from the first through the third movable blades 113 through 115 and the sliding surfaces.

As has been described, the anvil mechanism 23 comprises: a mounting base 112 having two slant surfaces 112a opposed to each other; fixed blades 116 and 117 mounted on one of the slant surfaces 112a of the mounting base 112; and movable blades 113 through 115 mounted on the other slant surface 112a of the mounting base 112. The fixed blades 116 and 117 are mounted on the mounting base 112 with a fixing means by sliding the movable blades 113 through 115, mounted on the slant surfaces 112a of the mounting base 112, over the slant surfaces 112a up to position, which are slightly above anticipated points where the movable blades 113 through 115 meet with the fixed blades 116 and 117; and, while maintaining the above positions, setting positions of the fixed blades 116 and 117 by sliding them upwardly over the slant surfaces 112a of the mounting base 112 until they come in contact with the movable blades 113 through 115. In other words, the fixed blades 116 and 117 and the movable blades 113 through 115 come to be in their proper positions with respect to each other, when the fixed blades 116 and 117 are secured to the mounting base 112 with the fixing means after they are set in positions by sliding them upwardly over one slant surface 112a of the mounting base 112 until they come in contact with the movable blades 113 through 115. The movable blades 113 through 115, mounted on the other slant surface 112a of the mounting base 112, are slid over that slant surface 112a and maintained in their positions above the points where the movable blades 113 through 115 are anticipated to meet with the fixed blades 116 and 117. Because of the above, the movable blades 113 through 115 never collide with the fixed blades 116 and 117 during the sliding movement. Also, since the gap between the blades is not necessarily too large in order to avoid collisions, they can cut the lead terminals 25 reliably.

Figure 88:
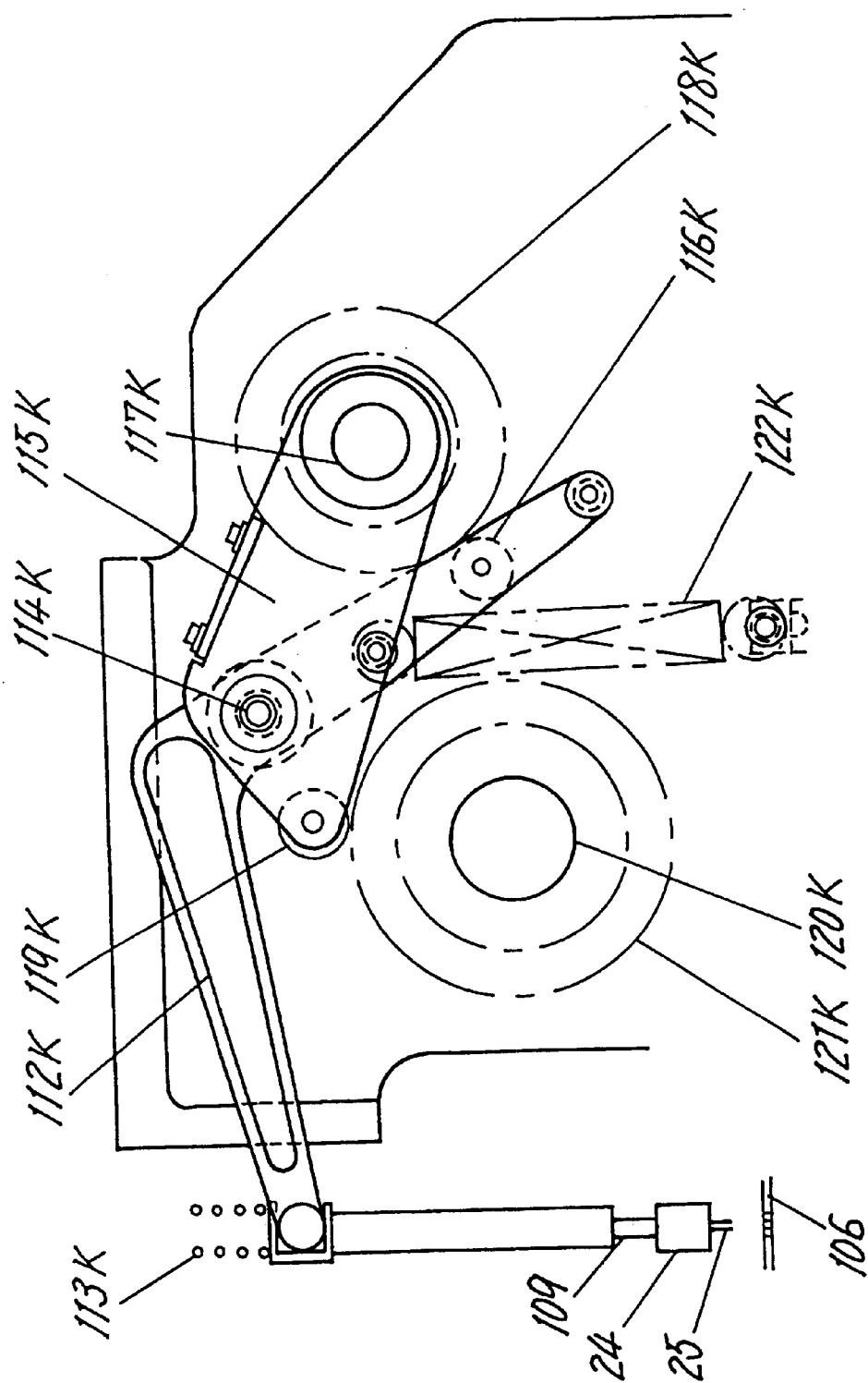
FIG. 88 is a side view depicting a mechanism for determining a standby position of a pusher in another exemplary embodiment of the present invention.

FIG. 88 through FIG. 94 depict still another exemplary embodiment of the present invention. In this exemplary embodiment, the pusher 109 is constructed so that it is held in a standby position above an element 24 representing a component, before it comes in contact with the element 24 and presses it down toward the substrate 106. The standby position is adjusted according to a height of the element 24 held by the head 20. As for the structure, in particular, an upper end of the pusher 109 is linked freely movably, as shown in FIG. 88, with a point of action (first end) of a first lever 112K shown in FIG. 92 having a dog-legged shape. The upper end of the pusher 109 is biased with a downward force by a spring 113K at all times. A fulcrum 114K of the first lever 112K is supported axially by a second lever 115K shown in FIG. 93, and a cam follower 116K, which functions as a point of application of the first lever 112K, engages a first cam 118K, which is supported axially by an axle 117K. The second lever 115K is also supported axially by the axle 117K, and a cam follower 119K serving as its point of application engages a second cam 121K, which is rotatably supported by an axle 120K. The second lever 115K is biased with a downward force by a spring 122K at all times.

The foregoing structure operates in a nianner as described hereinafter. Described first is a case wherein a component (an element 24) to be mounted has a large height, as shown in FIG. 88. In this instance, a servomotor 124K shown in FIG. 94 rotates the first cam 118K, making good use of an idle time of the pusher 109 before the pusher 109 actually depresses the element 24 toward the substrate 106, so as to position the cam follower 116K in a recess of the first cam 118K. This causes the point of action (first end) of the first lever 112K to rotate downwardly round the fulcrum 114K, and the pusher 109 slowly moves down until it touches on the element 24. When the pusher 109 touches the element 24, a contact-sensitive switch (i.e. a detector 123K in FIG. 94), though not shown in the figures, calculates the height of the element 24 based on a rotational angle of the first cam 118K.

Figure 89:
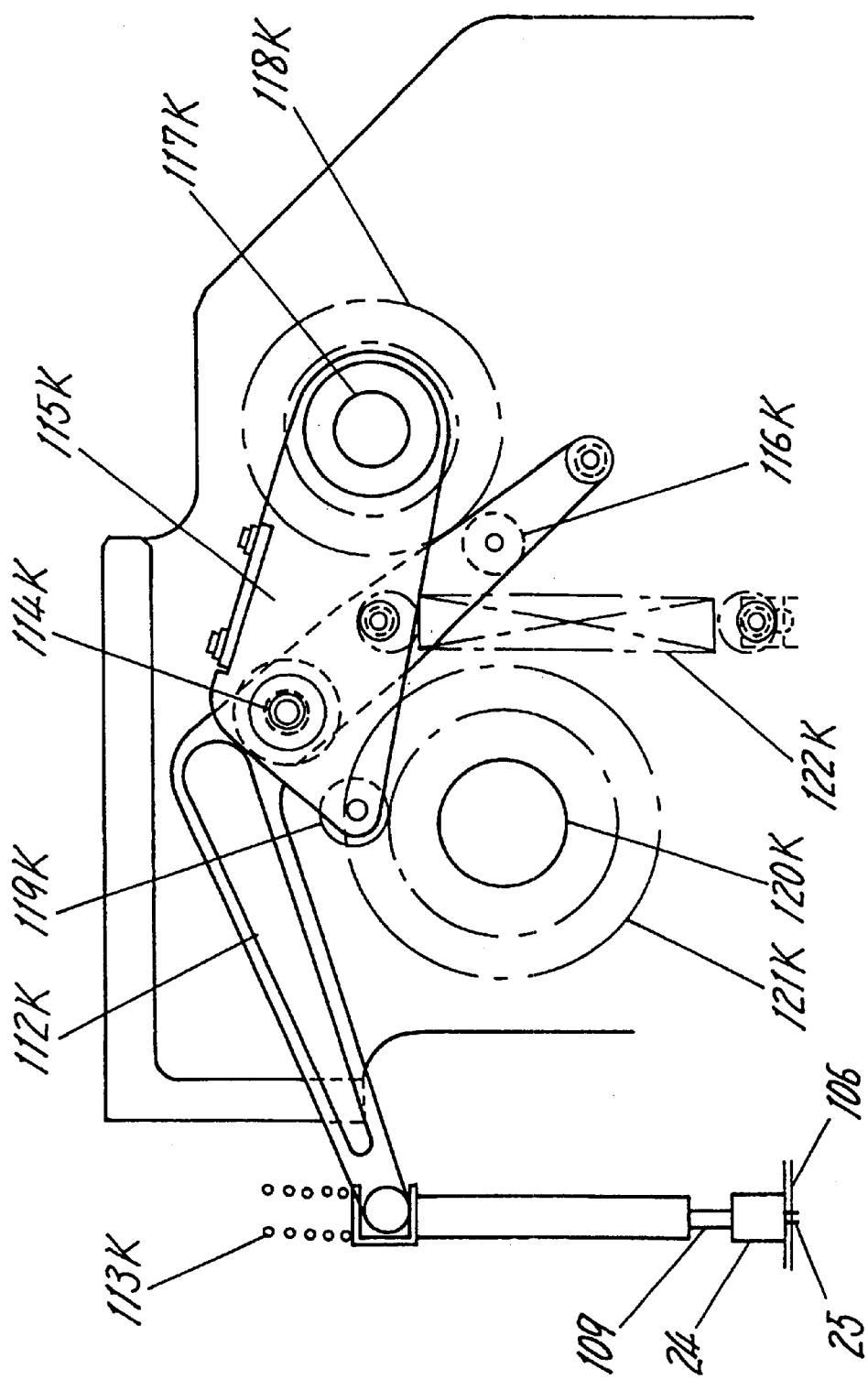
FIG. 89 is another side view of the same mechanism.

This enables the apparatus to recognize the height of the element 24 to be mounted now, and the pusher 109 is held in this position for a standby. Subsequently, the pusher 109 starts from this standby position, when it presses down the element 24 toward the substrate 106 as shown in FIG. 89. Although not shown in FIG. 88 through FIG. 91, there is the catch pin 108 under the substrate 106. The pusher 109 and the catch pin 108 mount the element 24 by holding it between the top of the element 24 and bottom of the lead terminals 25, as shown in FIG. 49 through FIG. 51.

Figure 90:
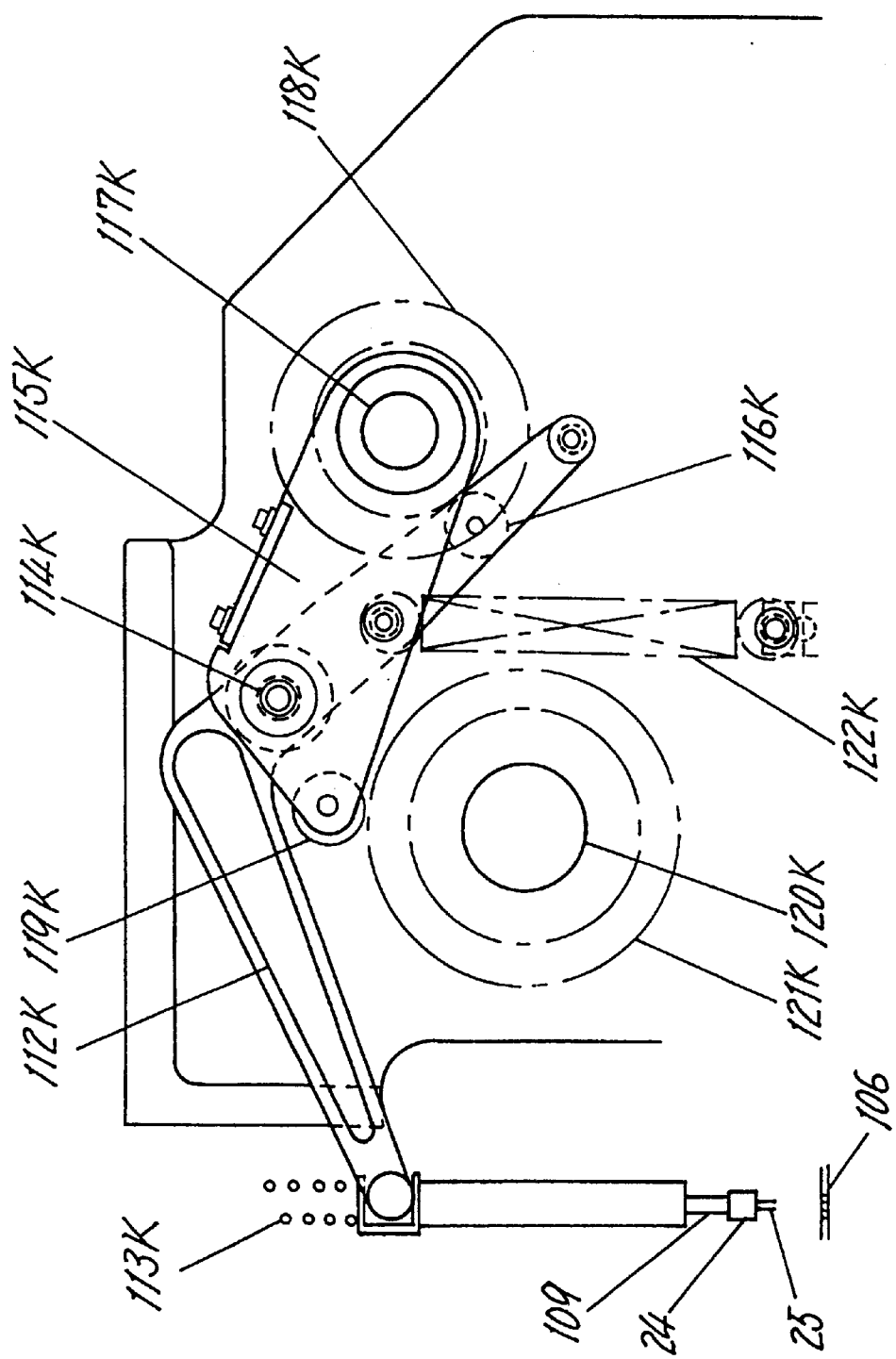
FIG. 90 is still another side view of the same mechanism.
Figure 91:
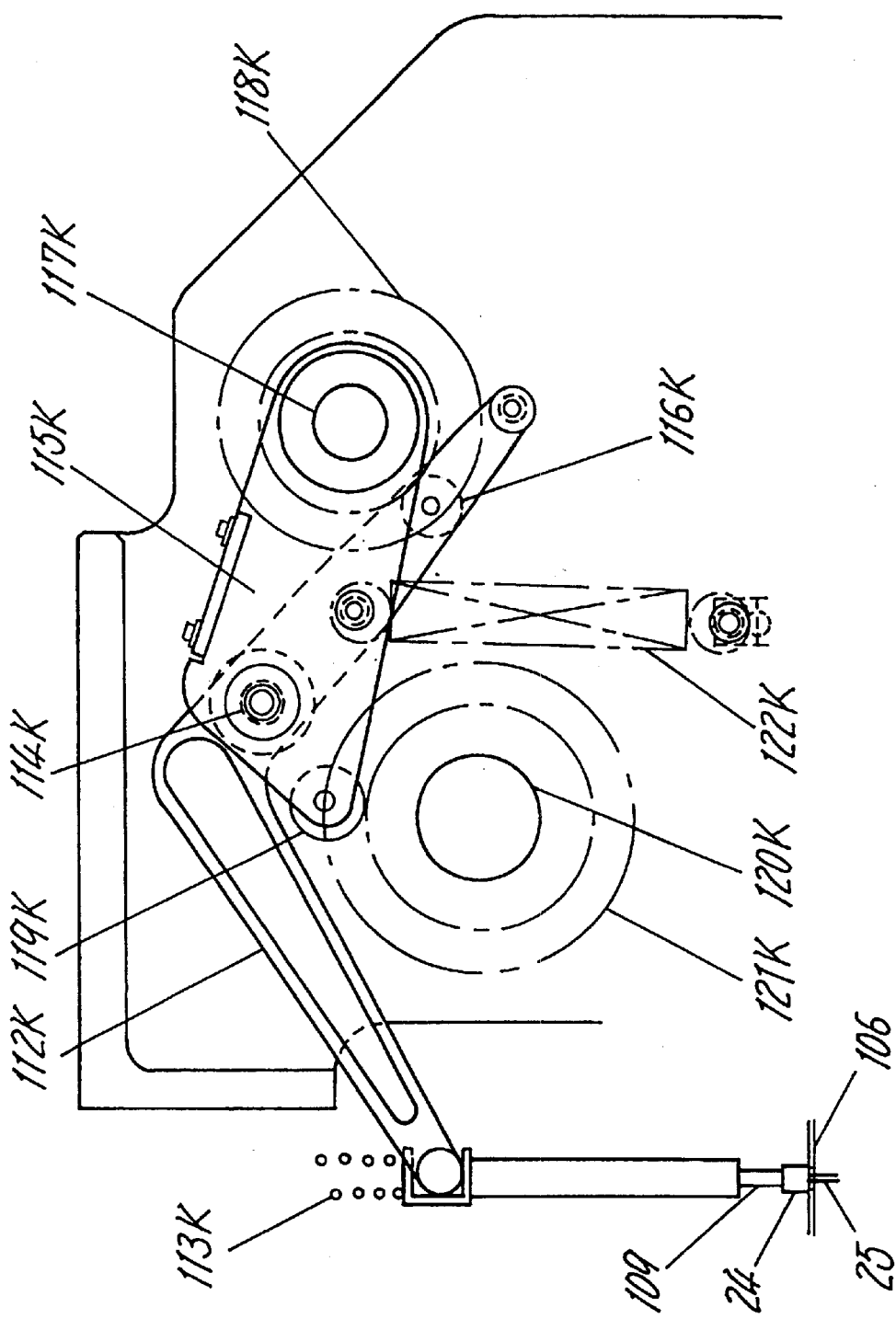
FIG. 91 is yet another side view of the same mechanism.
Figure 92:
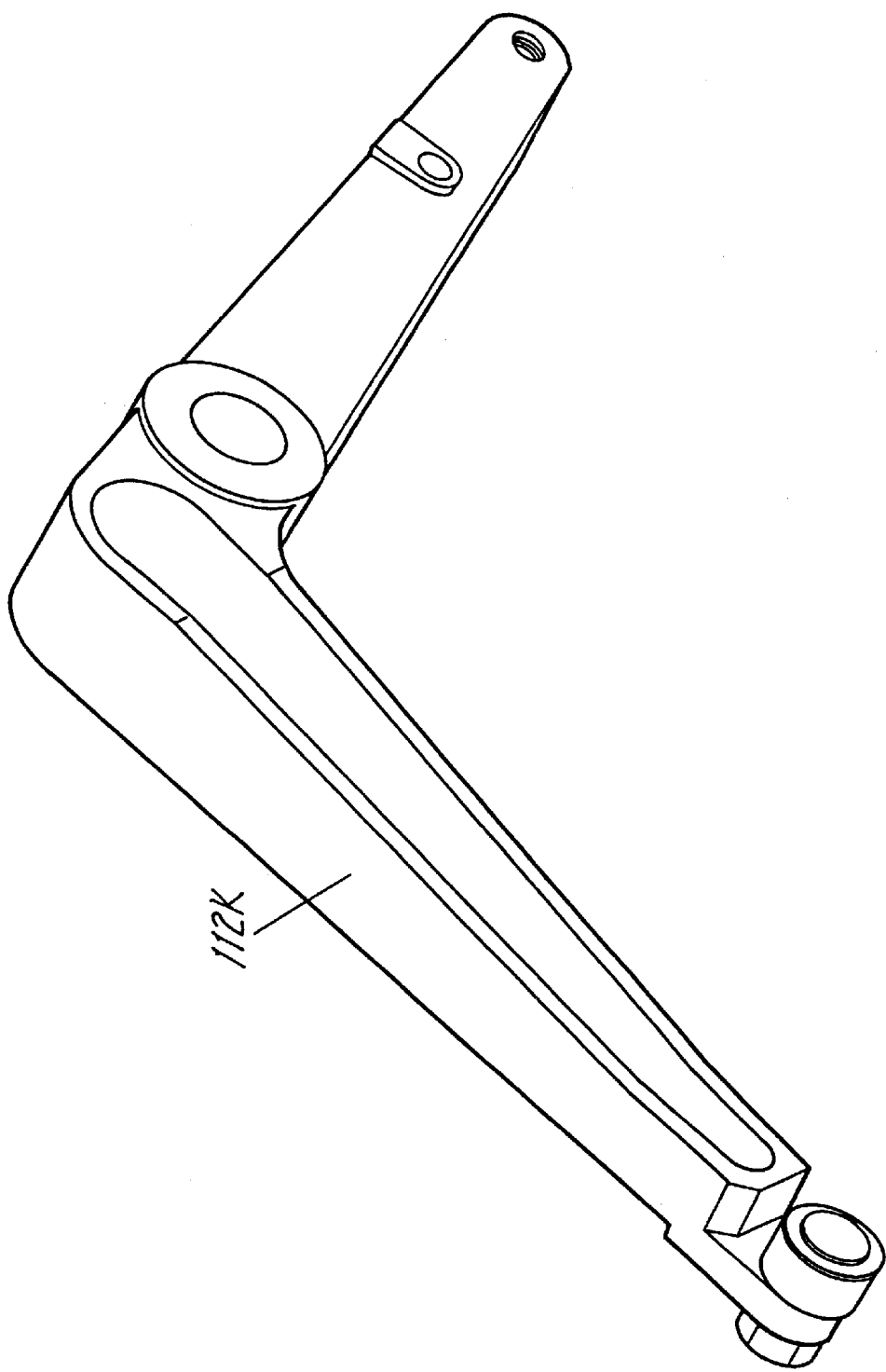
FIG. 92 is a perspective view depicting a first lever of the same mechanism.
Figure 93:
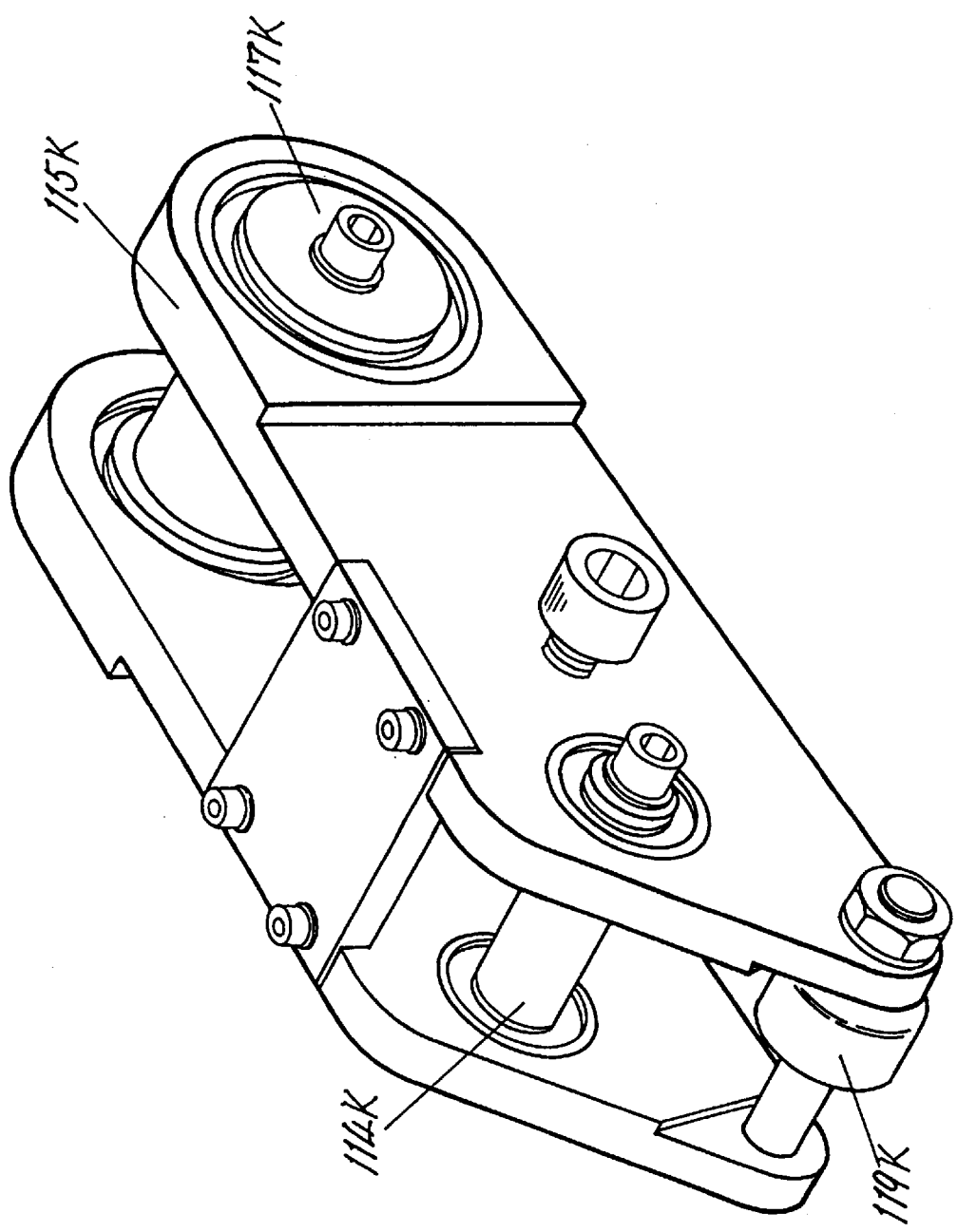
FIG. 93 is an oblique expanded perspective view of second lever 115K shown in FIG. 88.

FIG. 90 and FIG. 91 depict another case wherein the element 24 is small in height. In this case, in the like manner as described above, the pusher 109 touches the element 24, as shown in FIG. 90, by rotating the first cam 118K during an idle time of the pusher 109 before the pusher 109 starts a pressing motion. The cam follower 116K of the first lever 112K stays at a position deeper in the recess of the first cam 118K, in this case, as is obvious by comparing FIG. 90 with FIG. 88. This enables the apparatus to recognize the element 24 as being small in height, and the pusher 109 starts the pressing movement hereafter as shown in FIG. 91.

Figure 94:
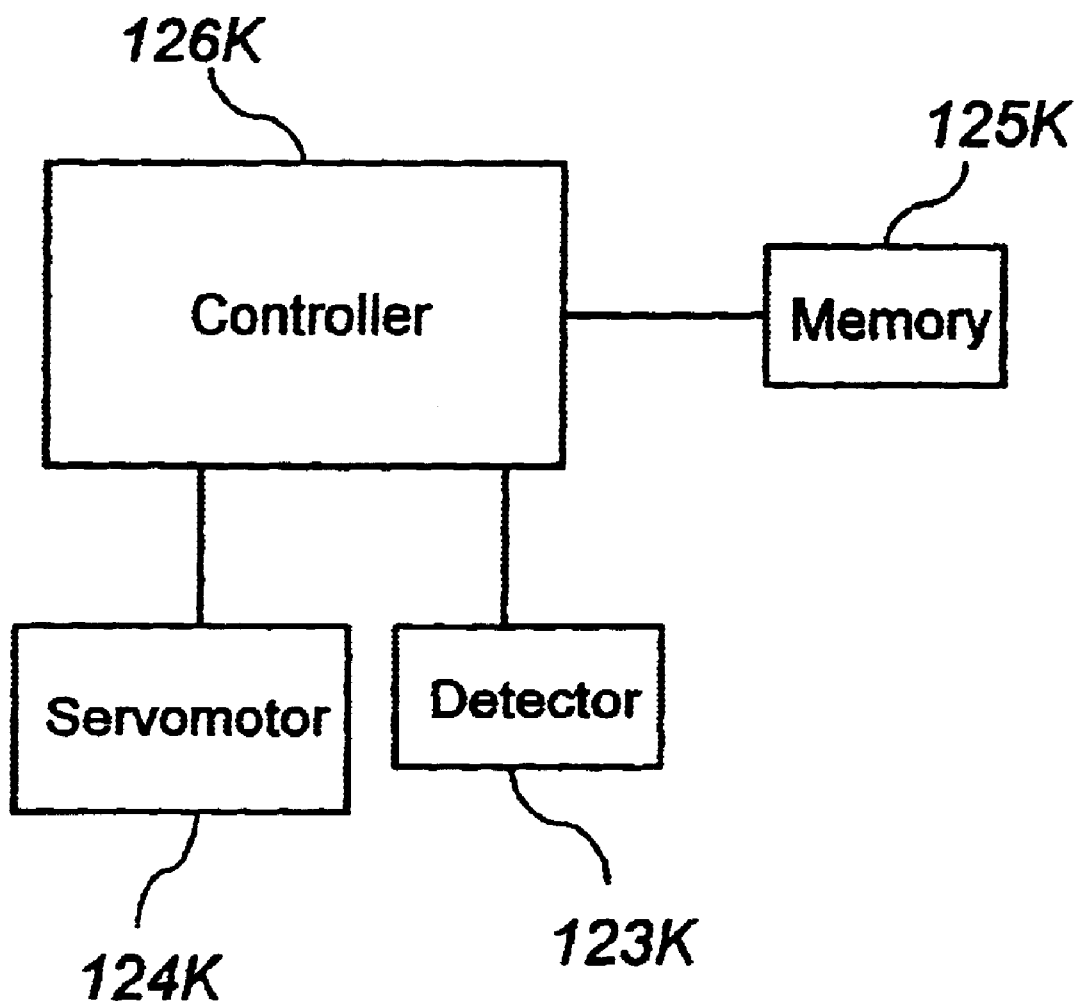
FIG. 94 is a block diagram of a controller of the same mechanism.

In the real mounting operation, the apparatus carries out a height determination in the same manner as above for each element 24, even if 100 pieces of the element 24 are mounted on each substrate 106 for instance, and the results are all stored in a memory 125K shown in FIG. 94 by way of a controller 126K. Accordingly, the apparatus makes use of the idling time to lower the pusher 109 in advance to a height equal to a sum of 1 mm, for example, added to the determined height of each component 24 when mounting on the second and subsequent substrates 106. The above operation substantially shortens the mounting time required for lowering the pusher 109, since the pusher 109 starts pressing down each of the elements 24 from the position of merely 1 mm above the element 24 during the mounting operation.

A reason for making the pusher 109 stand by at 1 mm above the element, for example, will be described hereinafter. The pusher 109 is integrally assembled with the head 20. The reason is therefore to prevent an element 24 from striking the lowering pusher 109, when the component transfer unit 19 transfers the element 24 to the insertion nail 68 of the head 20, as shown in FIG. 21.

As described, the present exemplary embodiment comprises: a component having lead terminals 25 extending downwardly, the head 20 for holding and moving the component to a position where the lead terminals 25 are above the via holes 107 to be inserted in the substrate 106; and the pusher 109 for pressing down the component held by the head 20 toward the substrate 106. The pusher 109 is made to wait at the standby position above the component before it comes in contact with the component and presses it toward the substrate. The standby position is determined according to a height of the component held by the head 20. Thus, the present exemplary embodiment shortens the time for the pusher 109 to press the component, and therefore reduces a mounting time, since it adjusts the standby position vertically in advance according to a height of the component to be mounted on the substrate.

FIG. 95 through FIG. 105 depict a transfer mechanism for transferring a substrate 106 onto an X-Y table 22, which is utilized as an example of a positioning table, while guiding it through the rails 21 shown in FIG. 1. The transfer mechanism of the present exemplary embodiment comprises: a shaft holder 112N; a transfer shaft 113N operable to move freely in and out from the shaft holder 112N toward the X-Y table 22; and a transfer pin 114N of FIG. 97 extending toward the substrate 106 at one side of the transfer shaft 113N nearer to the X-Y table 22. The transfer pin 114N is operable to slide on an axle 115N, which extends toward the substrate 106 at one side of the transfer shaft 113N nearer to the X-Y table 22. A spring 116N is connected to the transfer pin 114N as a biasing means. A pin-shifting unit for shifting the transfer pin 114N comprises a lever 117N provided at one side of the shaft holder 112N nearer to the X-Y table 22, and a lever actuator 118N linked to one end of the lever 117N. The other end of the lever 117N is linked to the transfer pin 114N.

Figure 95:
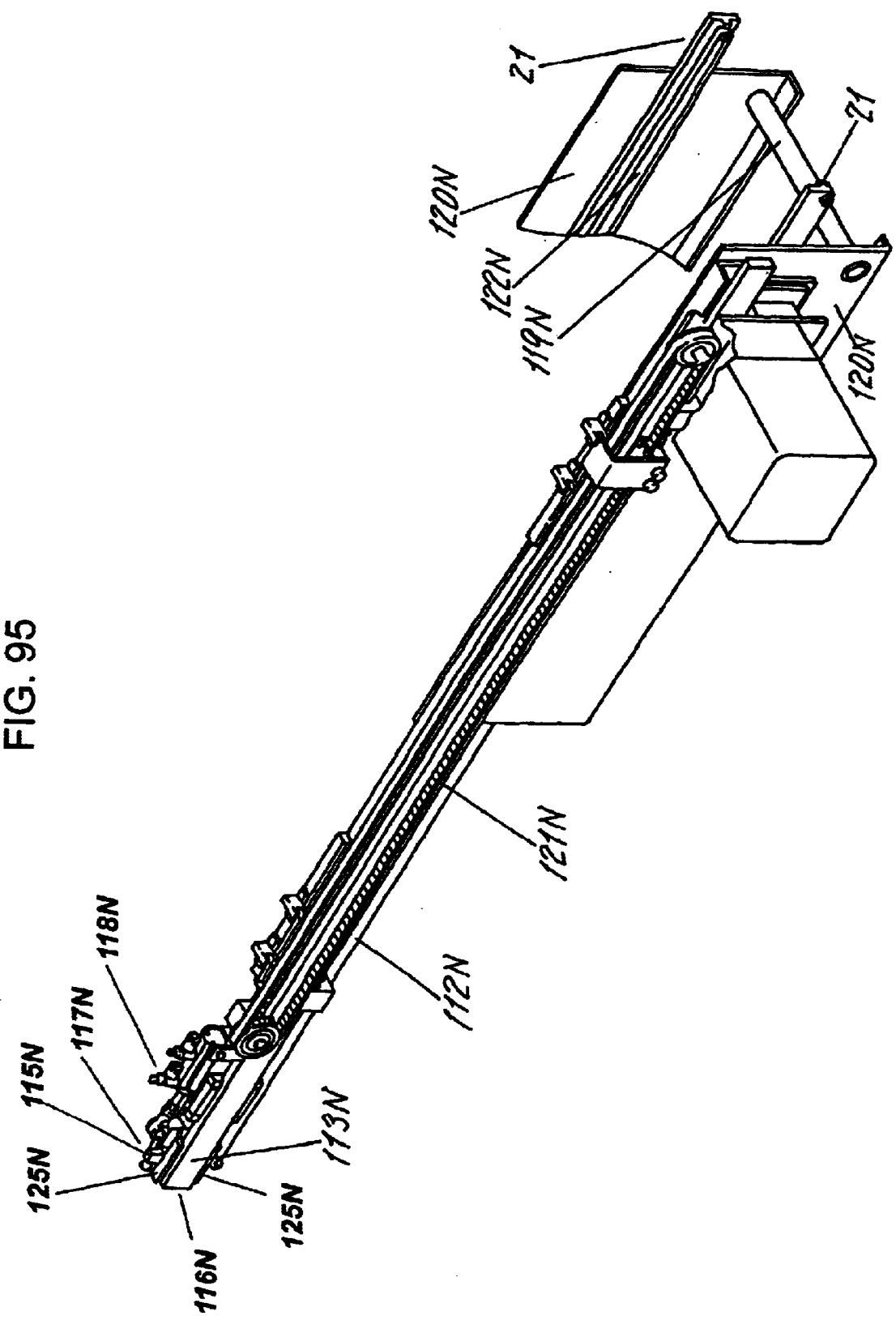
FIG. 95 is a perspective view depicting a transfer mechanism portion for a substrate in the same component mounting apparatus.

Each of the above-cited elements will now be described in more detail. The rails 21 shown in FIG. 1 are composed of longitudinally separated portions connected at a right side of the X-Y table 22. Portions of the rails 21 at the rightmost end shown in FIG. 1 are fixed to interior sides of wall plates 120N as shown in FIG. 95, and their free ends (at a side nearer to the X-Y table 22) are vertically rotatable around a shaft 119N. The shaft holder 112N is fixed to an exterior side of one of the wall plates 120N, and one end of this shaft holder 112N nearer to the X-Y table 22 is also vertically rotatable around the shaft 119N. The transfer shaft 113N is housed freely egressably within the shaft holder 112N, and a belt 121N drives the transfer shaft 113N to egress and ingress.

Figure 97:
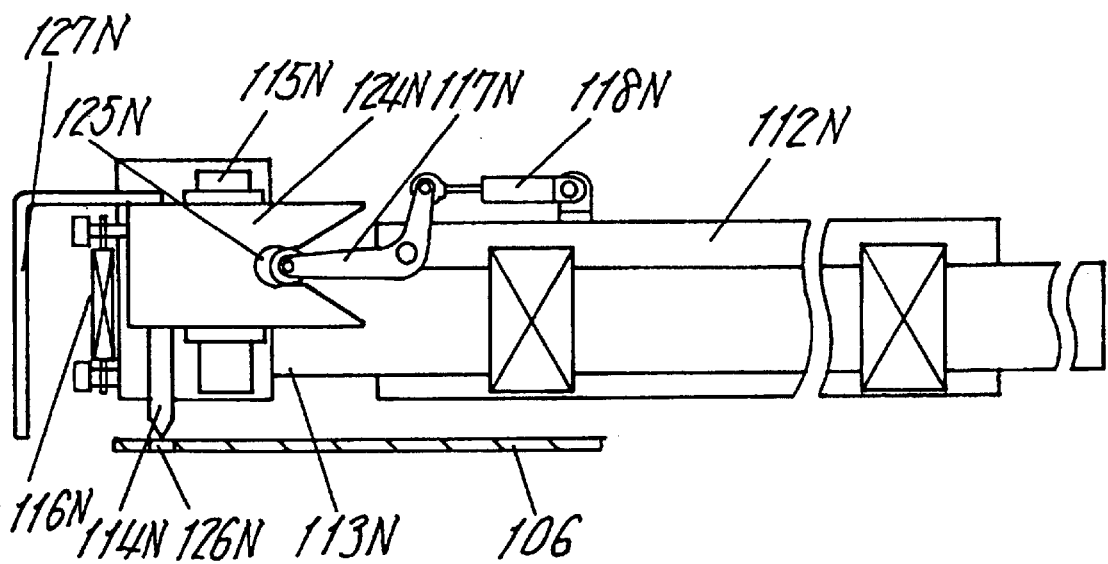
FIG. 97 is a front view depicting a portion of the same transfer mechanism for the substrate.
Figure 98:
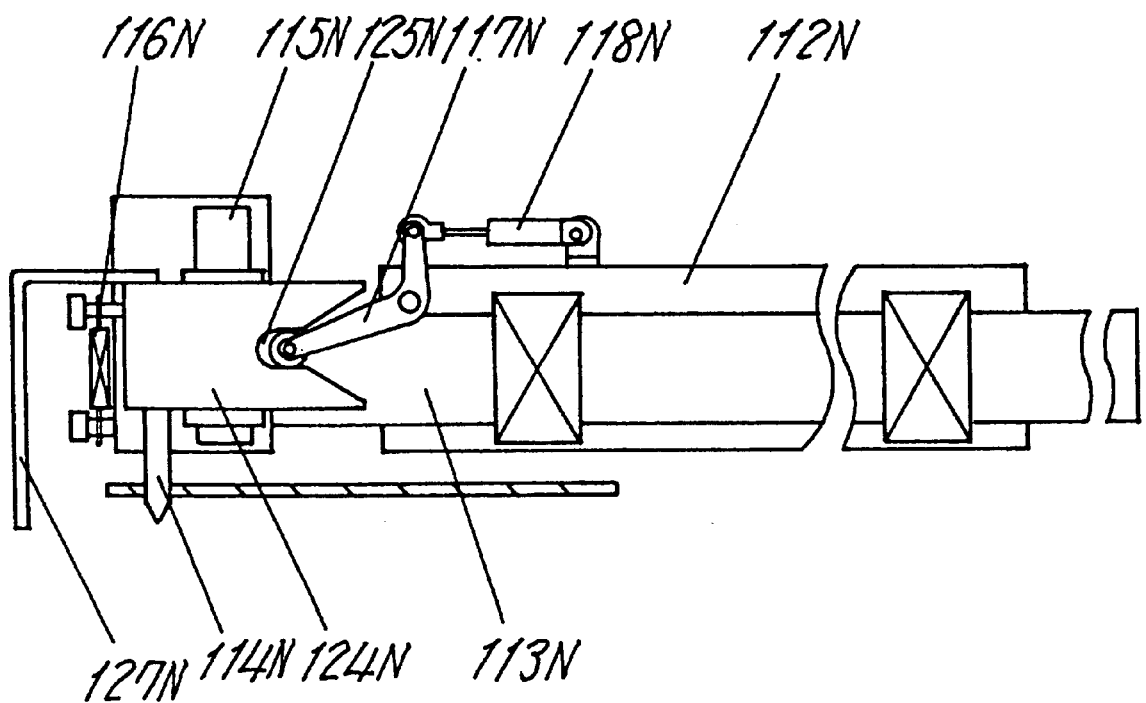
FIG. 98 is another front view of the same portion of the transfer mechanism for the substrate.
Figure 100:
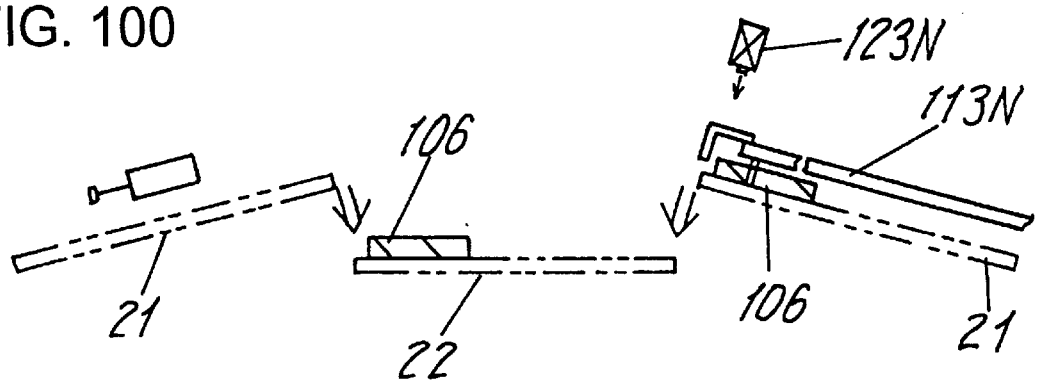
FIG. 100 is a front view depicting a transferring portion of the same transfer mechanism for the substrate.
Figure 105:
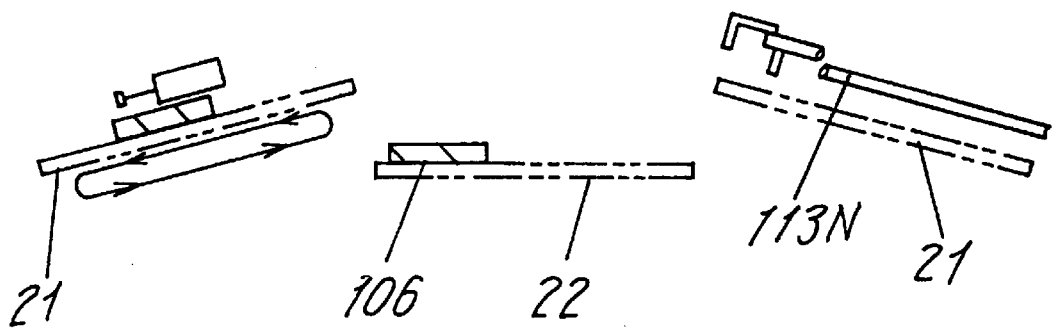
FIG. 105 is yet another front view depicting the transferring portion of the same transfer mechanism for the substrate.

In the foregoing structure, as can be comprehended through the description of FIG. 95, the rightmost side portions of the rails 21 shown in FIG. 1 are in such state that their ends nearest to the X-Y table 22 are raised upward with the shaft 119N as an axis, as shown in FIG. 105. Belts 122N are provided on the rails 21 at both right and left sides as shown in FIG. 95, and these belts 122N are driven to transfer the substrate 106 until the substrate 106 strikes a stopper (not shown) placed at a distal end of the rails 21, as shown in FIG. 100. An optical sensor 123N is provided at a position immediately before the distal end of the rails 21. Although a motor (not shown) for driving the belt 122N is deenergized when the substrate 106 passes by the optical sensor 123N, the inertia causes the substrate 106 to strike the stopper, and the substrate stays in position as described above. While keeping the above position, the lever actuator 118N in FIG. 97 shifts a right end of the lever 117N toward left as shown in FIG. 98. A left end of the lever 117N is linked to a recess 125N in a holder 124N of the transfer pin 114N as shown in FIG. 97, and the holder 124N is axially supported by the axle 115N to be freely slidable. Therefore, the holder 124N, together with the transfer pin 114N, slides down, if the left end of the lever 117N moves downward as shown in FIG. 98, so that the transfer pin 114N slips into a through hole 126N in the substrate 106 as shown in FIG. 98.

Figure 96:
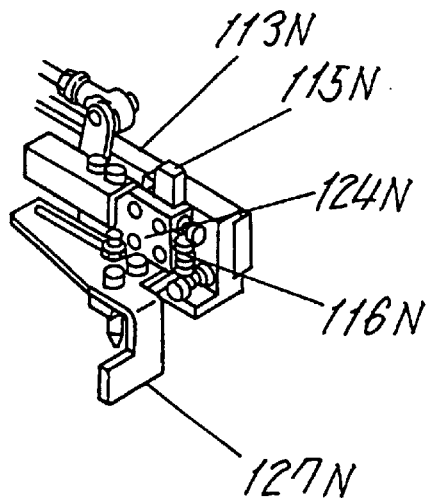
FIG. 96 is a perspective view depicting an end portion of a transfer shaft of the same transfer mechanism.
Figure 99:
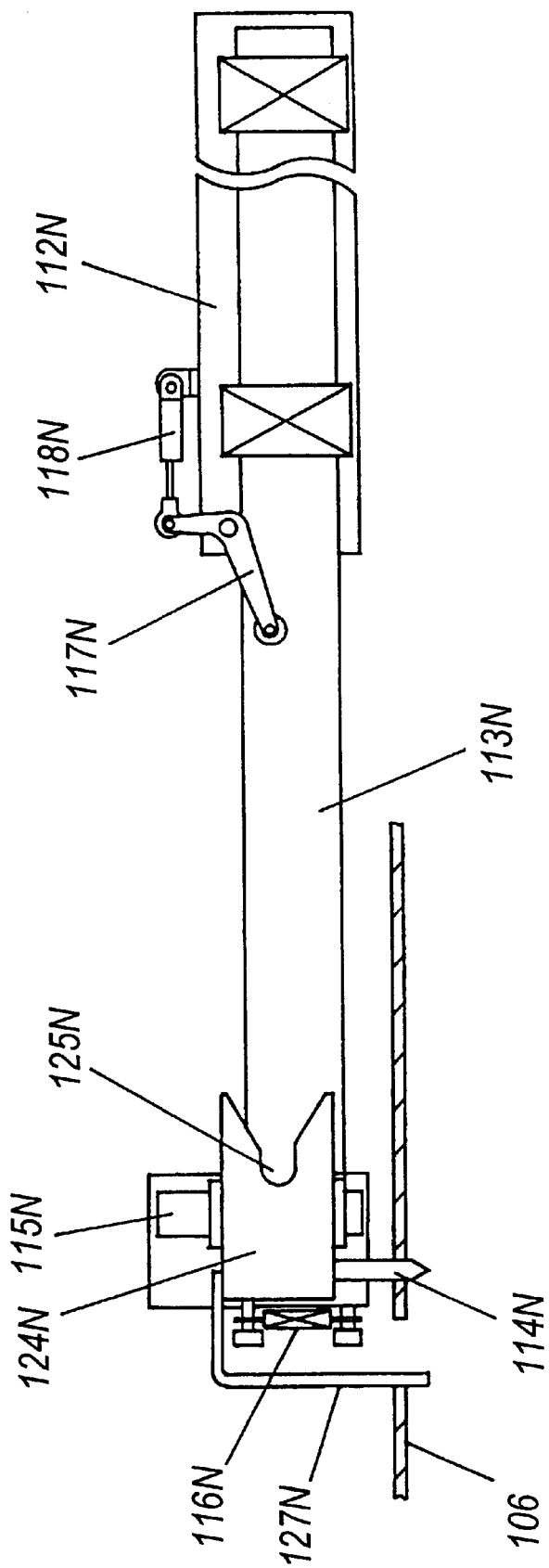
FIG. 99 is still another front view of the same portion of the transfer mechanism for the substrate.
Figure 101:
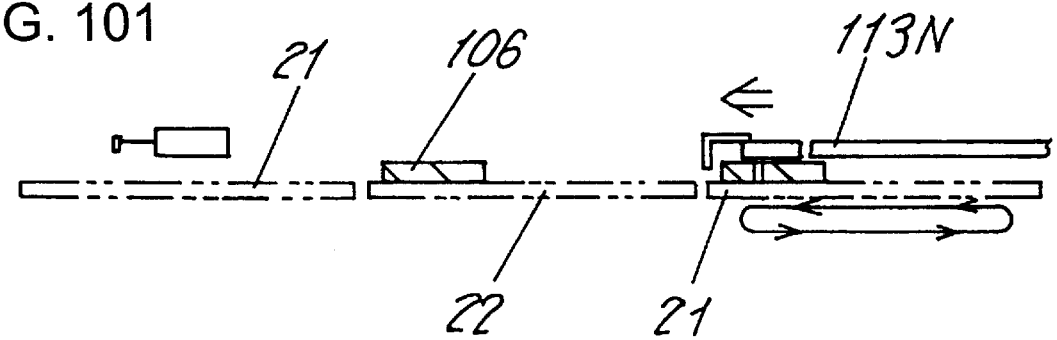
FIG. 101 is another front view depicting the transferring portion of the same transfer mechanism for the substrate.
Figure 102:
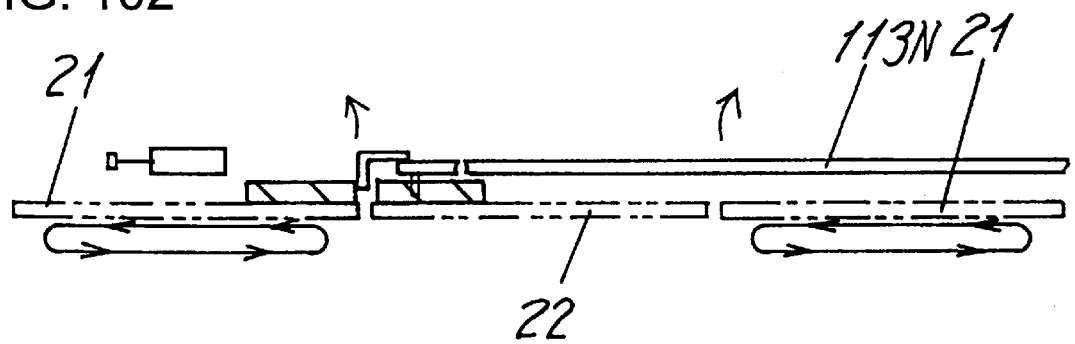
FIG. 102 is another front view depicting the transferring portion of the same transfer mechanism for the substrate.
Figure 103:
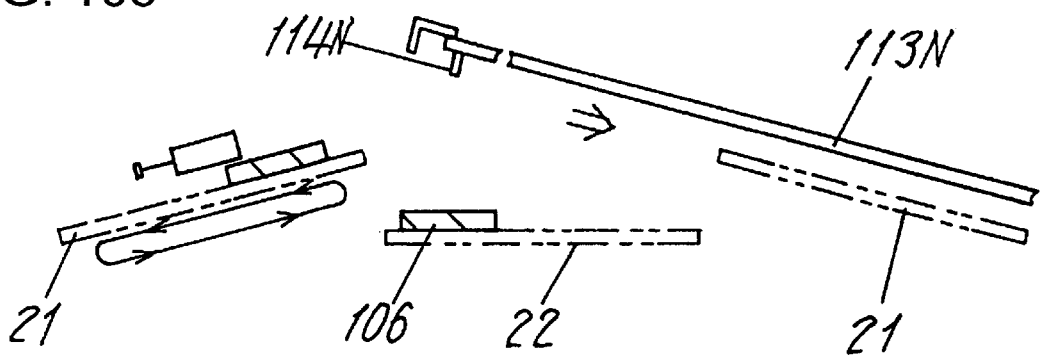
FIG. 103 is another front view depicting the transferring portion of the same transfer mechanism for the substrate.

While maintaining the above condition, an end of the shaft holder 112N moves down about the shaft 119N as an axis, as shown in FIG. 101, so as to make the portions of rails 21 in this position shown in FIG. 95 flush with the other portions of the rails 21 shown in FIG. 1 extending to the X-Y table 22. With the rails in the above position, the belt 121N is rotated in order to drive only the transfer shaft 113N to protrude from the shaft holder 112N toward the X-Y table 22 as shown in FIG. 102. This also transfers the substrate 106 onto the X-Y table 22 as shown in FIG. 99 and FIG. 102, and sets it in position. A push lever 127N is also mounted integrally on a tip end of the holder 124N as shown in FIG. 96, and the push lever 127N pushes out another substrate 106, on which the head 20 has already completed mounting of elements 24 on the X-Y table 22, toward the rails 21 at a collecting end. Then, the transfer shaft 113N is raised as shown in FIG. 103 with the shaft 119N as an axis, so that the transfer pin 114N is disengaged from the through hole 126N in the substrate 106. The substrate 106 on the X-Y table 22 is freed thereafter from constraint of the transfer pin 114N, and the X-Y table 22 and the head 20 start operating for mounting elements 24.

Figure 104:
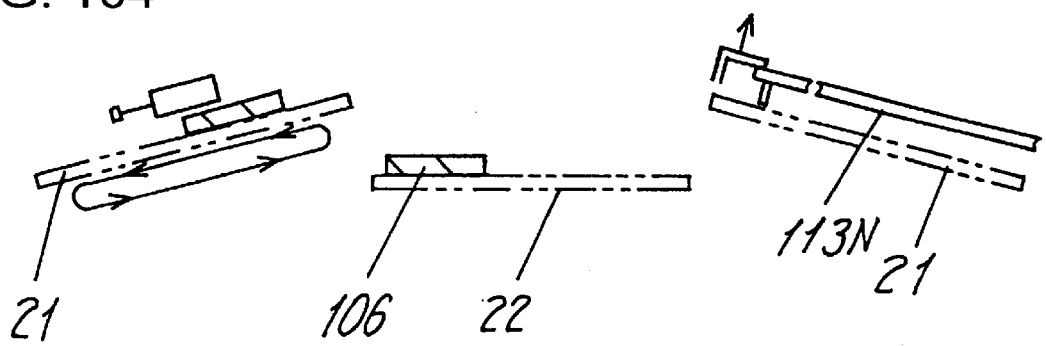
FIG. 104 is still another front view depicting the transferring portion of the same transfer mechanism for the substrate.

Alternatively, the raised transfer shaft 113N enters into the shaft holder 112N due to reversed rotation of the belt 121N as shown in FIG. 104. Then, the lever actuator 118N shifts the right end of the lever 117N toward right in order to raise the transfer pin 114N upward via the holder 124N as shown in FIG. 97 and FIG. 105, and waits for arrival of a subsequent substrate 106.

In short, the present exemplary embodiment facilitates reduction in weight, and a resultant increase in speed, since one side of the transfer shaft 113N nearer to the X-Y table 22 includes only the structure comprising the transfer pin 114N and the spring 116N for biasing the transfer pin 114N in a direction toward the substrate 106.

In the present exemplary embodiment, as described above, the transfer means for transferring the substrate 106 being guided by the rails 21 onto the X-Y table 22 comprises: the shaft holder 112N; the transfer shaft. 113N operable to move freely in and out of the shaft holder 112N toward the X-Y table 22; the transfer pin 114N provided at one end of the transfer shaft 113N nearest to the X-Y table 22 in a manner to direct toward the substrate 106; the spring 116N for biasing the transfer pin 114N toward the substrate 106; and the lever 117N provided at the end of the shaft holder 112N nearest to the X-Y table 22 for shifting the transfer pin 114N to a side opposite to the substrate 106 against a biasing force of the spring 116N. Accordingly, since the transfer means has the structure, wherein one side of the transfer shaft nearer to the positioning table has only the transfer pin 114N and the spring 116N for biasing the transfer pin 114N toward the substrate 106, it facilitates reduction in weight, and resultant increase of speediness.

Industrial Applicability

As has been described, a component mounting apparatus of the present invention comprises: a component delivery unit; a chuck provided on the component delivery unit; a component transfer unit for receiving a component held by the chuck; and a head for receiving the component held by the component transfer unit. The head comprises: a main head body; a vertically-moving mechanism for the main head body; an insertion nail provided at a bottom portion of the main head body; an opening/closing mechanism for the insertion nail; and a turning mechanism for moving the insertion nail between forward and backward directions. A cam plate constituting the turning mechanism is mounted detachably on the main head body, so that a locus of backward movement of the insertion nail (i.e. a retractive path for the insertion nails after mounting of a component) can be altered readily by mounting another cam plate having a different shape. This can result in an increase of mounting density of components on a substrate. In addition, it requires only a replacement of the cam plate, but no alignment of the insertion nail with respect to the substrate after the replacement, thereby improving workability.

What is claimed is:

1. A component mounting apparatus comprising:
   a component delivery unit;
   a chuck provided on said component delivery unit;
   a component transfer unit for receiving a component held by said chuck; and
   a head for receiving the component held by said component transfer unit, said head including:
      a main head body;
      a manipulator connected to said main head body and operable to move in a vertical direction;
      an insertion nail provided at a bottom portion of said main head body;
      an opening/closing mechanism for opening and closing said insertion nail; and
      a turning mechanism for moving said insertion nail in forward and backward directions, wherein said turning mechanism comprises a plurality of cam plates, each of said cam plates having a cam surface and being operable to be detachably mounted to said main head body, said cam plates having differently-shaped cam surfaces corresponding to different paths of movement of said insertion nail such that when a first one of said cam plates is detachably mounted to said main head body, said turning mechanism is operable to move said insertion nail in forward and backward directions along a first one of said different paths of movement corresponding to said first one of said cam plates.

2. The component mounting apparatus according to claim 1, wherein said manipulator comprises:
   an external axle attached to a top of said main head body;
   an internal axle arranged inside said external axle; and
   a mount plate attached to a lower end of said internal axle, said cam plate being detachably mounted to said mount plate.

3. The component mounting apparatus according to claim 1, further comprising a rotary body engaged to said cam plate so as to be rotatable in forward and backward directions of said main head body, wherein said insertion nail comprises a first insertion nail attached to said rotary body, and said insertion nail also comprises a second insertion nail rotatably attached to said first insertion nail.

4. The component mounting apparatus according to claim 3, wherein an upper portion of said second insertion nail and a portion of a driving lever corresponding to said upper portion make contact with each other via a cam surface.

5. The component mounting apparatus according to claim 3, wherein said first insertion nail and said second insertion nail each have at least three grip nails formed at a distal end of each of said first insertion nail and said second insertion nail.

6. The component mounting apparatus according to claim 5, wherein one of said grip nails at one side of said second insertion nail has a narrower intervening space and greater flexibility than any of said remaining grip nails of said second insertion nail.

7. The component mounting apparatus according to claim 3, wherein said first insertion nail and said second insertion nail are engaged together, and a center of said second insertion nail is pivotally supported by a center of said first insertion nail.

8. The component mounting apparatus according to claim 1, further comprising:
   a pusher for pressing a top of the component held by said insertion nail; and
   a catch pin for receiving a terminal extending downward from the component, wherein said catch pin is adapted to receive a lower end of the terminal underneath a substrate on which the component is to be mounted.

9. The component mounting apparatus according to claim 8, wherein said catch pin has a diameter greater than a diameter of a through-hole provided in the substrate.

10. The component mounting apparatus according to claim 1, wherein said cam surface of each of said cam plates has a slope length, said cam plates having different slope lengths, said turning mechanism further comprising a cam follower linked to said insertion nail, said cam follower being arranged so as to contact and move along said cam surface of one of said cam plates.

11. The component mounting apparatus according to claim 1, wherein said insertion nail is arranged adjacent to said cam plate of said turning mechanism such that said turning mechanism engages said insertion nail.

12. A component mounting apparatus comprising:
   a component delivery unit;
   a chuck provided on said component delivery unit;

a component transfer unit for receiving and holding a component held by said chuck, the component having a lead terminal extending downwardly;

a head for receiving and holding the component held by said component transfer unit, and for moving the lead terminal above a through-hole of a substrate in which the lead terminal is to be inserted; and a pusher for pressing down the component held by said head toward the substrate;

said head including:

a main head body;

a manipulator connected to said main head body and operable to move in a vertical direction;

an insertion nail provided at a bottom portion of said main head body;

an opening/closing mechanism for opening and closing said insertion nail; and a turning mechanism for moving said insertion nail in forward and backward directions, wherein said turning mechanism comprises a plurality of cam plates, each of said cam plates having a cam surface and being operable to be detachably mounted to said main head body, said cam plates having differently-shaped cam surfaces corresponding to different paths of movement of said insertion nail such that when a first one of said cam plates is detachably mounted to said main head body, said turning mechanism is operable to move said insertion nail in forward and backward directions along a first one of said different paths of movement corresponding to said first one of said cam plates, said pusher being operable to hold in a standby position above the component before coming in contact with and pressing down the component toward the substrate, and said pusher being operable to set the standby position according to the height of the component held by said head.

13. The component mounting apparatus according to claim 12, further comprising a catch pin provided under a through-hole of the substrate for supporting a lower end of the lead terminal of the component.

14. The component mounting apparatus according to claim 12, wherein said pusher is operable to set the standby position using a calculation based on the height of the component to be mounted.

15. The component mounting apparatus according to claim 12, wherein said pusher is arranged to contact a first end of a first lever, a fulcrum of said first lever being supported axially by a second lever, a second end of said first lever being arranged to contact a first cam, and an end of said second lever being arranged to contact a second cam.

16. The component mounting apparatus according to claim 15, wherein said first cam has a rotary axle coaxial with a fulcrum of said second lever.

17. The component mounting apparatus according to claim 12, wherein said cam surface of each of said cam plates has a slope length, said cam plates having different slope lengths, said turning mechanism further comprising a cam follower linked to said insertion nail, said cam follower being arranged so as to contact and move along said cam surface of one of said cam plates.

18. A component mounting apparatus comprising:

a component delivery unit;

a chuck provided on said component delivery unit;

a component transfer unit for receiving and holding a component having a lead terminal held by said chuck;

a head for receiving the component held by said component transfer unit;

a vertically-moving mechanism for moving said head;

a table disposed below said head for supporting a substrate; and an anvil mechanism disposed under said table, said head including:

a main head body;

a manipulator connected to said main head body and operable to move in a vertical direction;

an insertion nail provided at a bottom portion of said main head body;

an opening/closing mechanism for opening and closing said insertion nail; and a turning mechanism for moving said insertion nail in forward and backward directions, wherein said turning mechanism comprises a cam plate detachably mounted to said main head body;

said anvil mechanism including:

a mounting base provided with two slant surfaces opposed to each other;

a fixed blade mounted on a first slant surface of said slant surfaces of said mounting base; and a movable blade mounted on a second slant surface of said slant surfaces of said mounting base, wherein said fixed blade is fixed to said first slant surface of slant surfaces of said mounting base after said fixed blade is slid and set in position.

19. The component mounting apparatus according to claim 18, further comprising an operating rod disposed under said mounting base, wherein said operating rod is linked to said movable blade.

20. The component mounting apparatus according to claim 19, wherein said operating rod and said movable blade are linked together by a coupling lever supported axially by said mounting base.

21. The component mounting apparatus according to claim 19, wherein said operating rod has two flanges on a periphery of a top portion of said operating rod, said flanges being spaced apart a predetermined distance, and an upper one of said flanges has a cut-back portion.

22. The component mounting apparatus according to claim 19, wherein said operating rod has a cylindrical shape, and a lead terminal supporter is provided in said cylindrically shaped operating rod so as to be coaxial with said operating rod and vertically movable.

23. The component mounting apparatus according to claim 22, wherein said lead terminal supporter comprises a cylinder having a catch pin arranged in an opening in an upper end of said cylinder so as to protrude upwardly.

24. The component mounting apparatus according to claim 23, further comprising a cap having an inner peripheral female thread and having an opening on a top surface, said cap being screwed removably on said upper end of said cylinder.

25. The component mounting apparatus according to claim 23, wherein a supporting body is provided to bridge across said opening in said upper end of said cylinder, and said catch pin is mounted on said supporting body.

26. The component mounting apparatus according to claim 25, wherein said supporting body has a substantially flat shape, and has a supporting pin arranged horizontally across said substantially flat supporting body, and said catch pin is arranged so as to have a lower end abutting said supporting pin.

27. The component mounting apparatus according to claim 26, wherein an upper peripheral portion of said cylinder has a male thread, and a notch extends from said upper end of said cylinder vertically downward through said male thread, and said supporting pin is engaged in said notch.

28. The component mounting apparatus according to claim 27, wherein said supporting pin is engaged in a lower part of said notch, and a projection on said supporting body is engaged in an upper part of said notch.

29. The component mounting apparatus according to claim 18, wherein a groove is formed on at least one of an upper surface of said movable blade and a lower surface of said movable blade.

30. The component mounting apparatus according to claim 29, wherein a groove is formed on an upper surface of said movable blade, and a through hole extends from a lower end of said groove.

31. The component mounting apparatus according to claim 18, wherein said movable blade is operable to slide along said second slant surface of said slant surfaces to a top position that is above an anticipated point where said movable blade meets with said fixed blade, and said fixed blade is fixed at a position whereat said fixed blade comes in contact with said movable blade at said top position.

32. The component mounting apparatus according to claim 18, wherein said cam plate of said turning mechanism is one of a plurality of interchangeable cam plates having different shapes corresponding to different paths of movement of said insertion nail, any one of said cam plates being detachably mounted to said main head body such that said turning mechanism is operable to move said insertion nail along a desired one of said paths of movement of said insertion nail corresponding to the shape of said any one of said cam plates.

33. A component mounting apparatus comprising:
    a component delivery unit having an annular shape;
    a plurality of chucks provided along an outer peripheral surface of said component delivery unit, said chucks being adapted to hold components;
    a plurality of component supply units provided on an external side of said plurality of chucks;
    a chain of taped components supplied by said plurality of component transfer units;
    a plurality of component transfer units for receiving and holding said components held by said chucks; and
    a head for receiving said components held by said component transfer units;
    wherein said chain of taped components consists of said components, each of said components having an element and at least two lead terminals connected to said element, said components being spaced and taped at regular intervals;
    wherein said component supply units supply said chain of taped components to said chucks so that said components are positioned with an element side up and a lead terminal side down, and so that said components are aligned in a single row.

34. The component mounting apparatus according to claim 33, wherein said plurality of component supply units are arranged so as to be side-by-side.

35. The component mounting apparatus according to claim 33, wherein each of said component supply units has a first chuck release for opening said chucks.

36. The component mounting apparatus according to claim 35, wherein said chuck has a first side adjacent to said component supply unit, said chuck having a hook on said first side linked to said first chuck release.

37. The component mounting apparatus according to claim 36, wherein said chuck has an extended portion extending toward a back surface of said belt from a second side of said chuck opposite said first side having said hook, and a second chuck release is linked to said extended portion.

38. The component mounting apparatus according to claim 35, wherein each of said component supply units has a feeder of said chain of taped components and a cam for actuating said feeder of said chain of taped components, said cam having a chuck opening cam surface for actuating said first chuck release.

39. The component mounting apparatus according to claim 38, further comprising a transmission mechanism between said first chuck release and said chuck opening cam surface of said cam, wherein said transmission mechanism is operable to actuate said first chuck release only when said cam shifts toward a first direction.

40. The component mounting apparatus according to claim 38, wherein each of said component supply units has a taping member cutting blade between said feeder and said chuck, said cam having a cutting blade open/close cam surface and a cutting blade shift cam surface for actuating said taping member cutting blade.

41. The component mounting apparatus according to claim 40, wherein each of said component supply units has at least one driving mechanism for shifting said cam a first amount of movement and a second amount of movement, which is greater than said first amount of movement, and said first amount of movement actuates said first chuck release and said feeder.

42. The component mounting apparatus according to claim 41, wherein said cam is linked to said taping member cutting blade such that, when said at least one driving mechanism shifts said cam said second amount of movement, said taping member cutting blade is closed.

43. The component mounting apparatus according to claim 41, wherein each of said component supply units has an element detector for detecting a presence or an absence of an element in said chain of taped components, and said driving mechanism is operable to shift said cam said first amount of movement for a plurality of times when said element detector detects the absence of an element.

44. The component mounting apparatus according to claim 33, wherein said component delivery unit comprises a flexible belt, said belt having a back surface and having ditches and ridges on said back surface for positioning of said chucks.

45. The component mounting apparatus according to claim 44, wherein said belt has a plurality of chuck retainers spaced apart at regular intervals, and each of said plurality of chuck retainers has a chuck.

46. The component mounting apparatus according to claim 45, wherein each of said plurality of chuck retainers has a guide piece, and said guide piece engages a guide rail.

47. The component mounting apparatus according to claim 46, wherein at least one of an upper end and a lower end of each of said plurality of chuck retainers has an extended portion extending toward said back surface of said belt, said guide piece being formed on said extended portion.

48. The component mounting apparatus according to claim 33, wherein said chuck comprises a pair of nails operable to be moved apart from each other so as to open said chuck, and comprises an elastic body attached to an inside face of one of said pair of nails.

49. The component mounting apparatus according to claim 33, wherein said chuck comprises a fixed nail and a movable nail, said movable nail being operable to move with respect to said fixed nail so as to open said chuck, and an elastic body is attached to an inside face of one of said movable nail and said fixed nail.

50. The component mounting apparatus according to claim 49, wherein said elastic body is attached to one of said fixed nail and said movable nail by a pin penetrating through said elastic body.

51. The component mounting apparatus according to claim 33, further comprising a cutting blade for cutting an extra length of a taping member, and further comprising an extra-length detector positioned on said component delivery unit at a downstream side of a component supply location adjacent to said component supply unit, said extra-length detector being operable to detect a presence or an absence of an extra length of a taping member, wherein said extra-length detector actuates said cutting blade for cutting an extra length of a taping member so as to cut the extra length of said taping member to a predetermined length.

52. The component mounting apparatus according to claim 51, wherein said cutting blade for cutting an extra length of a taping member is operable to move from a lower position to an upper position so as to cut the extra length of said taping member, and is operable to return to said lower position after the cutting.

53. The component mounting apparatus according to claim 33, further comprising a polarity flipper unit for flipping the polarity of said components, said polarity flipper unit being arranged on said component delivery unit at a downstream side of the component supply location adjacent to said component supply unit, said polarity flipper unit being freely movable toward and away from said component delivery unit.

54. The component mounting apparatus according to claim 53, wherein said polarity flipper unit is positioned at a downstream side of said second cutting blade.

55. The component mounting apparatus according to claim 33, further comprising a hold position correction unit for correcting a position of said lead terminals of a component held by said chuck, said hold position correction unit being arranged on said component delivery unit at a downstream side of the component supply location adjacent to said component supply unit.

56. The component mounting apparatus according to claim 55, further comprising a polarity flipper unit for flipping the polarity of said components, said polarity flipper being arranged on said component delivery unit at a downstream side of the component supply location adjacent to said component supply unit, wherein said hold position correction unit is provided at a downstream side of said polarity flipper unit.

57. The component mounting apparatus according to claim 55, wherein said hold position correction unit comprises:
　　a positioning base for supporting a bottom edge of said chain of taped components;
　　a holder for holding said chain of taped components by pressing two sides of said chain of taped components in a direction orthogonal to a longitudinal direction of said chain of taped components; and
　　a push body for shifting a component of said chain of taped components by pushing one of said lead terminals of said component in the longitudinal direction of said chain of taped components.

58. The component mounting apparatus according to claim 55, further comprising a lead terminal cutting blade provided on said component delivery unit at a downstream side of said hold position correction unit, said lead terminal cutting blade being operable to cut said lead terminal, said lead terminal cutting blade being freely movable toward and away from said component delivery unit.

59. The component mounting apparatus according to claim 58, wherein said lead terminal cutting blade comprises a pair of blades movable with respect to each other so as to open said lead terminal cutting blade, each of said pair of blades having a distal end with a tapered lower surface, and said lead terminal cutting blade is arranged so that an upper edge of said chain of taped components contacts said tapered surfaces.

60. The component mounting apparatus according to claim 33, wherein each of said component transfer units is operable to transfer said component held by one of said chucks to said head, each of said component transfer units comprising two grip nails for holding a lower portion of said lead terminals of said component, and a support nail for supporting an upper portion of said lead terminals.

61. The component mounting apparatus according to claim 60, wherein a first one of said grip nails and said support nail are integrated, and a second one of said grip nails is arranged to be freely movable with respect to said first one of said grip nails integrated with said support nail.

62. The component mounting apparatus according to claim 61, wherein said head includes an insertion nail for gripping a portion of said lead terminals of said component located between said grip nails and said support nail.

63. A component mounting apparatus comprising:
　　a component delivery unit;
　　a chuck provided on said component delivery unit and operable to hold a component;
　　a component transfer unit for receiving and holding the component held by said chuck; and
　　a head for receiving the component held by said component transfer unit, said head including:
　　　　a main head body;
　　　　a manipulator connected to said main head body and operable to move in a vertical direction;
　　　　an insertion nail provided at a bottom portion of said main head body;
　　　　a first opening/closing mechanism for opening and closing said insertion nail; and
　　　　a first turning mechanism for moving said insertion nail in forward and backward directions, wherein said turning mechanism comprises a cam plate detachably mounted to said main head body;
　　said component transfer unit including:
　　　　a transfer chuck for receiving and holding the component held by said chuck on said component delivery unit;
　　　　a second turning mechanism for rotating said transfer chuck;
　　　　a shifting mechanism for shifting said transfer chuck toward an inside and an outside of a rotational arc of said transfer chuck; and
　　　　a second opening/closing mechanism for opening or closing said transfer chuck after said transfer chuck is shifted to the inside or the outside of the rotational arc of said transfer chuck by said shifting mechanism,
　　wherein a rotary axle of said second turning mechanism, a driving axle of said shifting mechanism, and an opening/closing axle of said second opening/closing mechanism are coaxial.

64. The component mounting apparatus according to claim 63, further comprising a third opening/closing mechanism for opening or closing said transfer chuck, in addition to said second opening/closing mechanism driven by said opening/closing axle.

65. The component mounting apparatus according to claim 63, wherein said transfer chuck comprises two grip nails for holding a lower portion of a lead terminal of the component held by said transfer chuck, and a support nail for supporting an upper portion of the lead terminal.

66. The component mounting apparatus according to claim 65, wherein a first one of said grip nails and said support nail are integrated, and a second one of said grip nails is arranged to be freely movable with respect to said first one of said grip nails integrated with said support nail.

67. The component mounting apparatus according to claim 63, further comprising:
   a rotary plate to be rotated by said opening/closing axle of said second opening/closing mechanism; and
   a third opening/closing mechanism for opening and closing said transfer chuck by a rotary movement of said rotary plate, both said rotary plate and said third opening/closing mechanism being arranged between said opening/closing axle and said transfer chuck, wherein said opening/closing axle biases said rotary plate for generating said rotary movement.

68. The component mounting apparatus according to claim 63, further comprising a shift lever between said driving axle of said shifting mechanism and said transfer chuck, said shift lever being biased by said driving axle so as to shift said transfer chuck toward the inside and the outside of the rotational arc of said transfer chuck.

69. The component mounting apparatus according to claim 63, wherein said cam plate of said first turning mechanism is one of a plurality of interchangeable cam plates having different shapes corresponding to different paths of movement of said insertion nail, any one of said cam plates being detachably mounted to said main head body such that said turning mechanism is operable to move said insertion nail along a desired one of said paths of movement of said insertion nail corresponding to the shape of said any one of said cam plates.

70. A component mounting apparatus comprising:
   a component delivery unit;
   a chuck provided on said component delivery unit and operable to hold a component;
   a component transfer unit for receiving and holding the component held by said chuck;
   a head for receiving the component held by said component transfer unit, and for mounting the component on a substrate positioned on a positioning table;
   a rail for guiding the substrate on said positioning table; and
   a transfer mechanism for transferring the substrate to said positioning table while being guided by said rail, said head including:
      a main head body;
      a manipulator connected to said main head body and operable to move in a vertical direction;
      an insertion nail provided at a bottom portion of said main head body;
      an opening/closing mechanism for opening and closing said insertion nail; and
      a turning mechanism for moving said insertion nail in forward and backward directions, wherein said turning mechanism comprises a cam plate detachably mounted to said main head body;
   said transfer mechanism including:
      a shaft holder;
      a transfer shaft operable to move freely in and out from said shaft holder toward said positioning table;
      a transfer pin provided at a first end of said transfer shaft closest to said positioning table so as to extend toward the substrate;
      a biasing device for biasing said transfer pin toward the substrate; and
      a pin shifting unit provided at a first end of said shaft holder closest to said positioning table for shifting said transfer pin to a side of said transfer shaft opposite to the substrate against a biasing force of said biasing device.

71. The component mounting apparatus according to claim 70, wherein said transfer pin is operable to slide on an axle arranged at said first end of said transfer shaft closest to said positioning table so as to extend toward the substrate, said biasing device comprising a spring linked to said transfer pin, said pin shifting unit comprising:
   a lever provided at said first end of said shaft holder closest to said positioning table; and
   a lever actuator linked to a first end of said lever, and a second end of said lever being linked to said transfer pin.

72. The component mounting apparatus according to claim 70, wherein said turning mechanism is one of a plurality of interchangeable cam plates having different shapes corresponding to different paths of movement of said insertion nail, any one of said cam plates being detachably mounted to said main head body such that said turning mechanism is operable to move said insertion nail along a desired one of said paths of movement of said insertion nail corresponding to the shape of said any one of said cam plates.

* * * * *